United States Patent [19]

Imanaka

[11] Patent Number: 5,736,947
[45] Date of Patent: Apr. 7, 1998

[54] DIGITAL INFORMATION ENCODING DEVICE, DIGITAL INFORMATION DECODING DEVICE, DIGITAL INFORMATION ENCODING/DECODING DEVICE, DIGITAL INFORMATION ENCODING METHOD, AND DIGITAL INFORMATION DECODING METHOD

[75] Inventor: Yoshifumi Imanaka, Tokyo, Japan

[73] Assignee: Mitsubishi Denki Kabushiki Kaisha, Tokyo, Japan

[21] Appl. No.: 766,451

[22] Filed: Dec. 12, 1996

[30] Foreign Application Priority Data

May 7, 1996 [JP] Japan ................... 8-112660

[51] Int. Cl.⁶ ........................................ H03M 7/00
[52] U.S. Cl. .................. 341/107; 341/106; 358/426; 358/429; 382/244; 382/247
[58] Field of Search ....................... 341/107, 106; 358/426, 429; 382/244, 247

[56] References Cited

U.S. PATENT DOCUMENTS

| | | |
|---|---|---|
| 4,973,961 | 11/1990 | Chamzas et al. |
| 5,025,258 | 6/1991 | Duttweiler |
| 5,297,220 | 3/1994 | Nomizu .................. 382/56 |
| 5,321,521 | 6/1994 | Nomizu .................. 358/426 |
| 5,404,140 | 4/1995 | Ono et al. |
| 5,422,734 | 6/1995 | Kang .................. 358/429 |
| 5,491,564 | 2/1996 | Hongu .................. 358/429 |
| 5,555,323 | 9/1996 | Hongu .................. 382/247 |
| 5,583,500 | 12/1996 | Allen et al. .................. 341/107 |

FOREIGN PATENT DOCUMENTS 6121172  4/1994  Japan.

OTHER PUBLICATIONS

Imanaka et al., "International Standardized High Effective Encoding System (QM–Coder) LST", Mitsubishi Denki Giho, vol. 69, No. 3, 1995, pp. 33–38.

Primary Examiner—Jeffrey A. Gaffin
Assistant Examiner—Jason L.W. Kost
Attorney, Agent, or Firm—Leydig, Voit & Mayer, Ltd.

[57] ABSTRACT

The digital information encoding device for high speed processing based on a QM-Coder, which comprises a context table storage means having a read/write context table storage portion for storing a plurality of storing data comprising a prediction symbol and a probability estimating data, comprises two port RAM, wherein a storing data stored in the context table storage portion at the address based on the context received at a read address input node AR is directly outputted to an arithmetic calculation means via a data output node DO.

36 Claims, 25 Drawing Sheets

| ADDRESS | PREDICTION VALUE(MPS) | LSZ | NLPS | NMPS | SWITCH |
|---|---|---|---|---|---|
| 0000000000 | 0 | 0×5a1d | 1 | 1 | 1 |
| 0000000001 | 0 | 0×2586 | 14 | 2 | 0 |
| ∫ | ∫ | ∫ | ∫ | ∫ | ∫ |
| 0000000101 | 0 | 0×5a7f | 15 | 15 | 1 |
| ∫ | ∫ | ∫ | ∫ | ∫ | ∫ |
| 1111111111 | 1 | 0×59eb | 112 | 111 | 1 |

| ADDRESS | PREDICTION VALUE(MPS) | LSZ | NLPS | NMPS | SWITCH |
|---|---|---|---|---|---|
| 0000000000 | 0 | 0×5a1d | 1 | 1 | 1 |
| 0000000001 | 0 | 0×2586 | 14 | 2 | 0 |
| ∫ | ∫ | ∫ | ∫ | ∫ | ∫ |
| 0000000101 | 0 | 0×3f25 | 36 | 16 | 1 |
| ∫ | ∫ | ∫ | ∫ | ∫ | ∫ |
| 1111111111 | 1 | 0×59eb | 112 | 111 | 1 |

| ST(STATUS NUMBER) | NLPS | NMPS | SWITCH | LSZ |
|---|---|---|---|---|
| 0000000 | 1 | 1 | 1 | 0×5a1d |
| 0000001 | 14 | 2 | 0 | 0×2586 |
| 0000010 | 16 | 3 | 0 | 0×1114 |
| 0000011 | 18 | 4 | 0 | 0×080b |
| ~ | ~ | ~ | ~ | ~ |
| 0001110 | 15 | 15 | 1 | 0×5a7f |
| ~ | ~ | ~ | ~ | ~ |
| 1101110 | 110 | 111 | 1 | 0×5a10 |
| 1101111 | 112 | 109 | 0 | 0×5522 |
| 1110000 | 112 | 111 | 1 | 0×59eb |

FIG. 6

| CONDITIONS \ MODE | I | II | III | IV | V |
|---|---|---|---|---|---|
| RENORMALIZING | NO | YES | YES | YES | YES |
| IDENTICAL CONTEXT | = | = | ≠ | = | = |
| NUMBER OF RENORMALIZING (BIT NUMBER) | 0 | r = 1 | r > 1 | r = 1 | r > 1 |
| NUMBER OF PROCESSING CLOCK | 1 | 1 | r | 2 | r |

FIG. 10

| ADDRESS | PREDICTION VALUE(MPS) | LSZ | ST |
|---|---|---|---|
| 0000000000 | 0 | 0×5a1d | 0 |
| 0000000001 | 0 | 0×2586 | 1 |
| ∫ | ∫ | ∫ | ∫ |
| 0000000101 | 0 | 0×5a7f | 14 |
| ∫ | ∫ | ∫ | ∫ |
| 1111111111 | 1 | 0×59eb | 112 |

| ADDRESS | PREDICTION VALUE(MPS) | LSZ | ST |
|---|---|---|---|
| 0000000000 | 0 | 0×5a1d | 0 |
| 0000000001 | 0 | 0×2586 | 1 |
| ∫ | ∫ | ∫ | ∫ |
| 0000000101 | 0 | 0×3f25 | 15 |
| ∫ | ∫ | ∫ | ∫ |
| 1111111111 | 1 | 0×59eb | 112 |

| ST(STATUS NUMBER) | NLPS | NMPS | SWITCH |
|---|---|---|---|
| 0000000 | 1 | 1 | 1 |
| 0000001 | 14 | 2 | 0 |
| 0000010 | 16 | 3 | 0 |
| 0000011 | 18 | 4 | 0 |
| ∫ | ∫ | ∫ | ∫ |
| 0001110 | 15 | 15 | 1 |
| ∫ | ∫ | ∫ | ∫ |
| 1101110 | 110 | 111 | 1 |
| 1101111 | 112 | 109 | 0 |
| 1110000 | 112 | 111 | 1 |

FIG. 15

| ST(STATUS NUMBER) | LSZ |
|---|---|
| 0000000 | 0×5a1d |
| 0000001 | 0×2586 |
| 0000010 | 0×1114 |
| 0000011 | 0×080b |
| ∫ | ∫ |
| 0001110 | 0×5a7f |
| ∫ | ∫ |
| 1101110 | 0×5a10 |
| 1101111 | 0×5522 |
| 1110000 | 0×59eb |

FIG. 16

DIGITAL INFORMATION ENCODING DEVICE, DIGITAL INFORMATION DECODING DEVICE, DIGITAL INFORMATION ENCODING/DECODING DEVICE, DIGITAL INFORMATION ENCODING METHOD, AND DIGITAL INFORMATION DECODING METHOD

BACKGROUND OF THE INVENTION

1. Field of the Invention

The present invention relates to a digital information encoding device (an encoding device based on so-called QM-Coder), a digital information decoding device, a digital information encoding/decoding device, a method of encoding digital information, and a method of decoding digital information, which are integrated into a semiconductor integrated circuit applied, for example, to a facsimile apparatus.

2. Description of the Prior Art

A facsimile equipment transmits binary pictures such as drawings and document texts to a remote place. The demand for a facsimile equipment to transmit the data more speedily is increasing in recent years. The transmission time has been reduced by reducing the amount of data by means of encoding.

In other words, in case of a facsimile apparatus, there are some systems for transmitting digital picture information by compressing, namely, transmitting information as an encoded data after encoding, which are now taken into the international standard. One of the system is an MH (Modified Huffman) encoding system which uses correlation between one dimensional pixels (picture elements). The second system is an MR (Modified READ) encoding system which uses correlation between two dimensional pixels for enhancing compression efficiency. The third system is an MMR (Modified Modified READ) encoding system which enhances the compression efficiency by eliminating redundancy of MR code.

Since it is difficult to procure a recording device which realizes a precise reproduction of the half tone picture at present, the encoding processing is carried out after pre-processing a pseudo half tone by the method called dither.

Recently, attentions are focused on the international standard group JBIG for encoding two value picture, and QM-Corder which is a highly efficient encoding system of information keeping type. The former is characterized by a high compression ratio achieved not only for picture information, but also for various kinds of information including pallet or character information. Moreover, the JBIG achieves a highly efficient compression ratio even for a pseudo half tone picture. The latter has been standardized in the standard group JPEG for color static picture encoding.

Although a digital information encoding device based on the above-mentioned QM-Coder is characterized by its high-speed processing, further high-speed processing is requested.

The inventors who are concerned with the present invention have carried out several investigation on the digital information encoding device based on the QM-Coder, which is resulted in the following facts. The highest speed of the device has been a satisfactory one. In the worst case however, namely, when the compression ration is 1, the processing speed falls to less than half of the highest speed. Accordingly, it is resulted that the total processing speed can be improved by improving the processing speed in the worst case.

It is an object of the present invention to provide a digital information encoding device, a digital information decoding device, a digital information encoding/decoding device, a method of encoding digital information, and a method of decoding digital information, in which the total processing speed is improved, namely, a high speed processing is achieved.

SUMMARY OF THE INVENTION

According to one aspect of the invention, the digital information encoding device based on a QM-Corder comprises a context table storage means, having a read/write context table storage portion for storing a plurality of storing data of a plurality of bits having a prediction symbol and a probability estimating data, which comprises a read address input node for receiving the context from the context generating means, a data output node which outputs the storing data stored in the context table storage portion at an address based on the context received on the read address input node, and which is connected to an arithmetic calculator, a write address input node for receiving the context temporarily stored in the context storage means, and a data input node which receives a renewal data of a plurality of bits having a prediction symbol and a probability estimating data, which is written in the context table storage portion at an address based on the context received on the write address input node; and a probability estimating table storage means which outputs one probability estimating data out of the plurality of probability estimating data according to a probability estimation index in an index data from the arithmetic calculator, to the context table storage means with a prediction symbol in said index data from the arithmetic calculator, as the renewal data.

According to another aspect of the invention, the digital information encoding device comprises a context table storage means which stores a plurality of storing data comprising a prediction symbol and a probability estimating data which further comprises an LSZ (LPS size on coding interval) data indicating mismatching probability, an NLPS (Next if LPS) data which serves as a probability estimation index of a renewal data if the prediction symbol corresponding to the probability estimating data does not match with a picture data for the target encoding pixel (,pixel to be encoded), an NMPS (Next if MPS) data which serves as a probability estimation index of a renewal data if the prediction symbol corresponding to the probability estimating data matches with a picture data for the target encoding pixel, and a SWITCH (Switch) data which indicates whether or not to invert the prediction symbol corresponding to the probability estimating data, for outputting one storing data out of the plurality of storing data according to a context for a target encoding pixel which is temporarily stored, wherein an inputted renewal data of a plurality of bits having a prediction symbol and a probability estimating data is written over one storing data in a plurality of storing data according to a context for the target encoding pixel which is stored temporarily in the context storage means; and a probability estimating table storage means which stores a plurality of probability estimating data comprising the LSZ data, the NLPS data, the NMPS data and the SWITCH data, for outputting one probability estimating data out of the plurality of probability estimating data according to a probability estimation index from the arithmetic calculator, to the context table storage means with a prediction symbol from the arithmetic calculator, as the renewal data.

According to further aspect of the invention, the digital information decoding device comprises a context table storage means which stores a plurality of storing data comprising an LSZ data which indicates a mismatching probability which constitutes a first portion of a prediction/index data and the probability estimating data, for outputting one storing data out of the plurality of storing data according to a context for the target encoding pixel, wherein an inputted renewal data comprising an LSZ data which constitutes the first portion of a prediction/index data and the probability estimating data is written over one storing data in a plurality of storing data according to a context for the target encoding pixel which is stored temporarily in the context storage means; a first probability estimating table storage means which stores a plurality of second portions other than the LSZ data in a probability estimating data, namely, an NLPS data which serves as a probability estimation index of a renewal data if the prediction symbol in a prediction/index data for the target encoding pixel from the context table storage means does not match with a picture data for the target encoding pixel, an NMPS data which serves as a probability estimation index of a renewal data if the prediction symbol in a prediction/index data for the target encoding pixel from the context table storage means matches with a picture data for the target encoding pixel, and a SWITCH data which indicates whether or not to invert a prediction symbol in a prediction/index data stored in the context table storage means, for outputting a second portion in one of the plurality of probability estimating data according to a probability estimation index of a prediction/index data in a storing data from the context table storage means; and a second probability estimating table storage means which stores a plurality of first portions in probability estimating data, for outputting a first portion in one of the plurality of probability estimating data according to a probability estimation index from the arithmetic calculator, to the context table storage means as a first portion of a probability estimating data in the renewal data.

According to further aspect of the invention, the digital information decoding device based on a QM-Corder comprises a context table storage means, having a read/write context table storage portion for storing a plurality of storing data of a plurality of bits having a prediction symbol and a probability estimating data, which comprises a read address input node for receiving the context from the context generating means, a data output node which outputs the storing data stored in the context table storage portion at an address based on the context received on the read address input node, and which is connected to an arithmetic calculator, a write address input node for receiving the context temporarily stored in the context storage means, and a data input node which receives a renewal data of a plurality of bits having a prediction symbol and a probability estimating data, which is written in the context table storage portion at an address based on the context received on the write address input node; and a probability estimating table storage means which outputs one probability estimating data out of the plurality of probability estimating data according to a probability estimation index in an index data from the arithmetic calculator, to the context table storage means with a prediction symbol in the index data from the arithmetic calculator, as the renewal data.

According to further aspect of the invention, the digital information decoding device comprises a context table storage means which stores a plurality of storing data comprising a prediction symbol and a probability estimating data which further comprises an LSZ data indicating mismatching probability, an NLPS data which serves as a probability estimation index of a renewal data, an NMPS data which serves as a probability estimation index of a renewal data, and a SWITCH data which indicates whether or not to invert the prediction symbol corresponding to the probability estimating data, for outputting one storing data out of the plurality of storing data according to a context for a target decoding pixel (pixel to be decoded) from the context generating means, wherein an inputted renewal data of a plurality of bits having a prediction symbol and a probability estimating data is written over one storing data in a plurality of storing data according to a context for the target decoding pixel which is stored temporarily in the context storage means; and a probability estimating table storage means which stores a plurality of probability estimating data comprising the LSZ data, the NLPS data, the NMPS data and the SWITCH data, for outputting one probability estimating data out of the plurality of probability estimating data according to a probability estimation index from the arithmetic calculator, to the context table storage means with a prediction symbol from the arithmetic calculator, as the renewal data.

According to further aspect of the invention, the digital information decoding device comprises a context table storage means which stores a plurality of storing data comprising an LSZ data which indicates a mismatching probability which constitutes a first portion of a prediction/index data and the probability estimating data, for outputting one storing data out of the plurality of storing data according to a context for the received target decoding pixel from the context generating means, wherein an inputted renewal data comprising an LSZ data which constitutes the first portion of a prediction/index data and the probability estimating data is written over one storing data in a plurality of storing data according to a context for the target decoding pixel which is stored temporarily in the context storage means; a first probability estimating table storage means which stores a plurality of second portions other than the LSZ data in a probability estimating data, namely, an NLPS data which serves as a probability estimation index of a renewal data, an NMPS data which serves as a probability estimation index of a renewal data, and a SWITCH data which indicates whether or not to invert a prediction symbol in a prediction/index data stored in the context table storage means, for outputting a second portion in one of the plurality of probability estimating data according to a probability estimation index of a prediction/index data in a storing data from the context table storage means; and a second probability estimating table storage means which stores a plurality of first portions in probability estimating data, for outputting a first portion in one of the plurality of probability estimating data according to a probability estimation index from the arithmetic calculator, to the context table storage means as a first portion of a probability estimating data in the renewal data.

According to further aspect of the invention, the digital information encoding/decoding device based on a QM-Corder comprises a context table storage means, having a read/write context table storage portion for storing a plurality of storing data of a plurality of bits having a prediction symbol and a probability estimating data, which is used for both the encoding/decoding purposes and which comprises a read address input node for receiving the context from the context generating means, a data output node which outputs the storing data stored in the context table storage portion at an address based on the context received on the read address input node, a write address input node for receiving the context temporarily stored in the context storage means, and a data input node which receives a renewal data of a plurality of bits having a prediction symbol and a probability estimating data, which is written in the context table storage portion at an address based on the context received on the write address input node; and a probability estimating table storage means which outputs one probability estimating data out of the plurality of probability estimating data according to a probability estimation index in an index data from either the encoding arithmetic calculator or the decoding arithmetic calculator, to the context table storage means with a prediction symbol in the index data from either the encoding arithmetic calculator or the decoding arithmetic calculator, as the renewal data.

According to further aspect of the invention, the digital information encoding/decoding device comprises a context table storage means which stores a plurality of storing data comprising a prediction symbol and a probability estimating data which further comprises an LSZ data indicating mismatching probability, an NLPS data which serves as a probability estimation index of a renewal data if the prediction symbol corresponding to the probability estimating data does not match with a picture data for the target encoding pixel in case of encoding and which serves as a probability estimation index of a renewal data in case of decoding, an NMPS data which serves as a probability estimation index of a renewal data if the prediction symbol corresponding to the probability estimating data matches with a picture data for the target encoding pixel in case of encoding and which serves as a probability estimation index of a renewal data in case of decoding, and a SWITCH data which indicates whether or not to invert the prediction symbol corresponding to the probability estimating data, for outputting one storing data out of the stored plurality of storing data according to a context for a target encoding pixel or a context for a target decoding pixel from the context generating means, wherein, in case of encoding, an inputted renewal data of a plurality of bits having a prediction symbol and a probability estimating data is written over one storing data in a plurality of storing data according to a context for the target encoding pixel which is stored temporarily in the context storage means, and in case of decoding, an inputted renewal data of a plurality of bits having a prediction symbol and a probability estimating data is written over one storing data in a plurality of storing data according to a context for the target decoding pixel which is stored temporarily in the context storage means; a probability estimating table storage means which stores a plurality of probability estimating data comprising the LSZ data, the NLPS data, the NMPS data and the SWITCH data, for outputting one probability estimating data out of the plurality of probability estimating data according to a probability estimation index from the encoding arithmetic calculator, to the context table storage means with a prediction symbol from the encoding arithmetic calculator, as the renewal data in case of encoding, and for outputting one probability estimating data out of the plurality of probability estimating data according to a probability estimation index from the decoding arithmetic calculator, to the context table storage means with a prediction symbol from the decoding arithmetic calculator, as the renewal data in case of decoding.

According to further aspect of the invention, the digital information encoding/decoding device based on a QM-Corder comprises a context table storage means which stores a plurality of storing data comprising an LSZ data which indicates a mismatching probability which constitutes a first portion of a prediction/index data and the probability estimating data, and receives a context from the context generating means, for outputting one storing data out of the plurality of storing data according to a context for the received target encoding pixel from the context generating means, wherein an inputted renewal data comprising an LSZ data which constitutes the first portion of a prediction/index data and the probability estimating data is written over one storing data in a plurality of storing data according to a context for the target encoding pixel which is stored temporarily in the context storage means in case of encoding, and for outputting one storing data out of the plurality of storing data according to a context for the received target decoding pixel from the context generating means, wherein an inputted renewal data comprising an LSZ data which constitutes the first portion of a prediction/index data and the probability estimating data is written over one storing data in a plurality of storing data according to a context for the target decoding pixel which is stored temporarily in the context storage means in case of decoding; a first probability estimating table storage means which stores a plurality of second portions other than the LSZ data in a probability estimating data, namely, an NLPS data which serves as a probability estimation index of a renewal data if the prediction symbol in a prediction/index data for the target encoding pixel from the context table storage means does not match with a picture data for the target encoding pixel in case of encoding and which serves as a probability estimation index of a renewal data in case of decoding, an NMPS data which serves as a probability estimation index of a renewal data if the prediction symbol in a prediction/index data for the target encoding pixel from the context table storage means matches with a picture data for the target encoding pixel in case of encoding and which serves as a probability estimation index of a renewal data in case of decoding, and a SWITCH data which indicates whether or not to invert a prediction symbol in a prediction/index data stored in the context table storage means, for outputting a second portion in one of the plurality of probability estimating data according to a probability estimation index of a prediction/index data in a storing data from the context table storage means; and a second probability estimating table storage means which stores a plurality of first portions in probability estimating data, for outputting a first portion in one of the plurality of probability estimating data according to a probability estimation index from the encoding arithmetic calculator, to the context table storage means as a first portion of a probability estimating data in the renewal data in case of encoding, and for outputting a first portion in one of the plurality of probability estimating data according to a probability estimation index from the decoding arithmetic calculator, to the context table storage means as a first portion of a probability estimating data in the renewal data in case of decoding.

According to further aspect of the invention, the digital information encoding method caries out the steps of, generating a context for the target encoding pixel; reading out a storing data comprising a prediction symbol and a probability estimating data which are based on the generated context; obtaining an A data and a C data using the read-out storing data; and also obtaining a renewal data of a plurality of bits having a prediction symbol and a probability estimation index, during one clock of a system clock signal when encoding processing for a target encoding pixel requires one renormalization, and rewriting a storing data based on the context for the target encoding pixel by the renewal data; generating a context for a subsequent target encoding pixel of the target encoding pixel; reading out a storing data based on the generated context; and obtaining an A data and a C data using the read-out storing data, during subsequent one clock of a system clock signal.

According to further aspect of the invention, the digital information decoding method caries out the steps of, generating a context for the target decoding pixel; reading out a storing data comprising a prediction symbol and a probability estimating data which are based on said generated context; obtaining an A data and a C data using the read-out storing data; and obtaining a renewal data of a plurality of bits having a prediction symbol and a probability estimating data, and also obtaining a decoded picture data for the target decoding pixel; during one clock of a system clock signal when decoding processing for a target decoding pixel requires one renormalization, and rewriting a storing data based on the context for the target decoding pixel by the renewal data; generating a context for a subsequent target decoding pixel of the target decoding pixel; reading out a storing data based on the generated context; reading out a probability estimating data based on a probability estimation index of the read-out prediction/index data; obtaining an A data and a C data using the read-out storing data during subsequent one clock of a system clock signal.

BRIEF EXPLANATION OF THE DRAWINGS

FIG. 6 is a diagram showing an example of a probability estimating table in the probability estimating table storage device 5, 105.

FIG. 10 is a diagram showing the operation modes according to the first~sixth embodiments of the present invention.

FIG. 15 is a diagram showing an example of a probability estimating table in the first probability estimating table storage device 15, 115.

FIG. 16 is a diagram showing an example of a probability estimating table in the second probability estimating table storage device 16, 116.

DETAILED DESCRIPTION OF THE PREFERRED EMBODIMENTS

Embodiment 1

Figure 1:
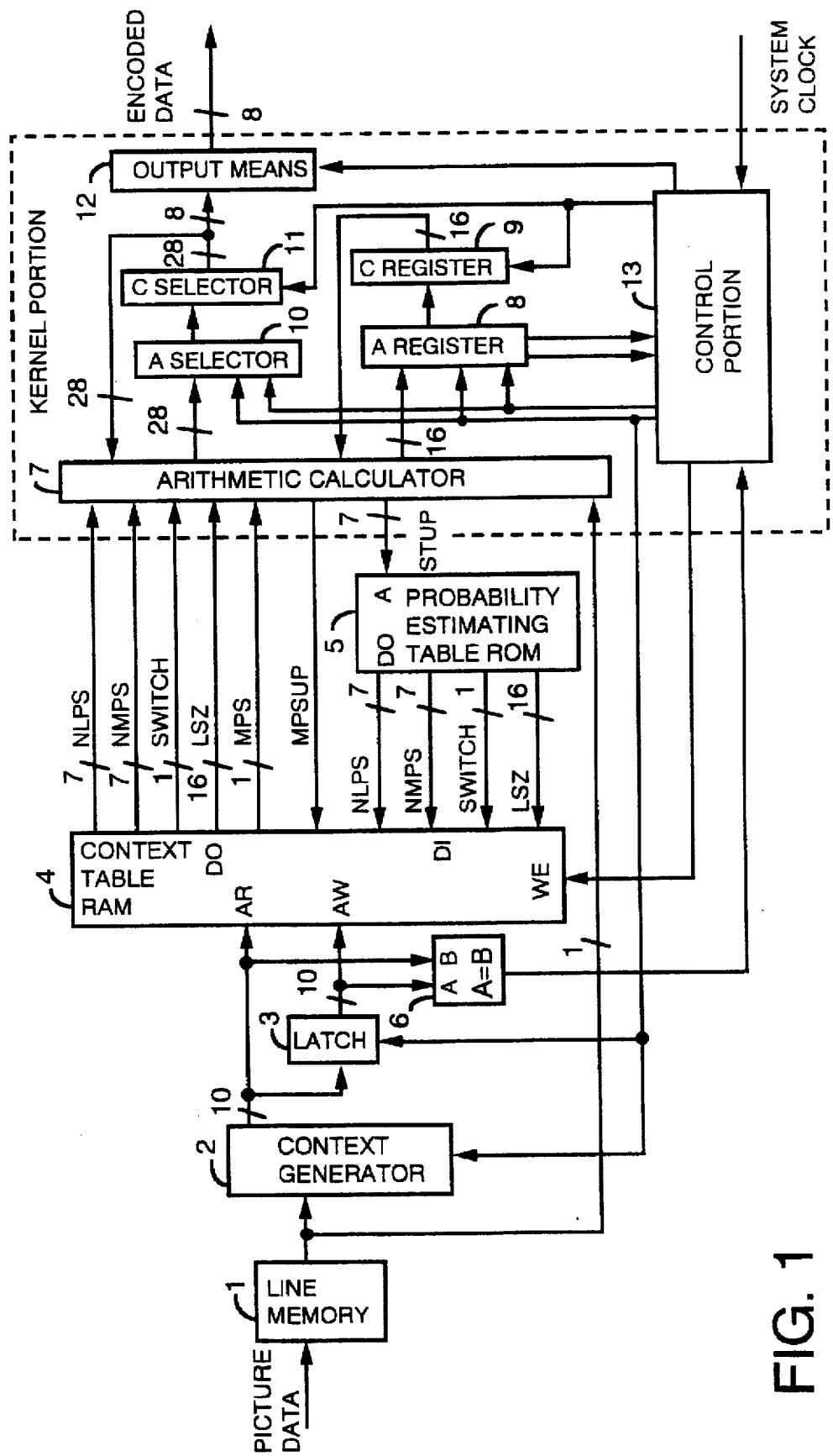
FIG. 1 is a block diagram showing a first embodiment of the present invention.

FIG. 1 shows a digital signal encoding device (QM-Coder) in a first embodiment of the present invention, which is integrated in a semiconductor integrated circuit, which is, for example, applied to a facsimile apparatus. In FIG. 1, a storage device 1 comprises a plurality of line memories which store picture data for every one line. The picture data comprises a digital signal which is converted from the picture information to a two value picture by an analog/digital conversion circuities. The picture information comprises character information, pictorial information, pallet picture information, read out for every one line by a picture sensor such as scanner (not shown in FIG. 1).

A context generator 2 in FIG. 1 extracts a reference pixel according to a template model from the picture data inputted from the above-mentioned storage device. For example, in case of the two line template in FIG. 2A, the context generator 2 generates and outputs a context having bit patterns of ten pixels extracted from the template of the ten pixels. This ten pixels are four encoded reference pixels on the same line (horizontal direction) as the target encoding pixel shown by the code "?", and six encoded reference pixels on the immediately preceding line of the target encoding pixel shown by the code "?". The four encoded reference pixels are placed in the immediately preceding line to target encoding pixel shown by the code "?", while the six encoded reference pixels are placed in the front and rear rows including the row of the target encoding pixel shown by the code "?".

Figure 2B:
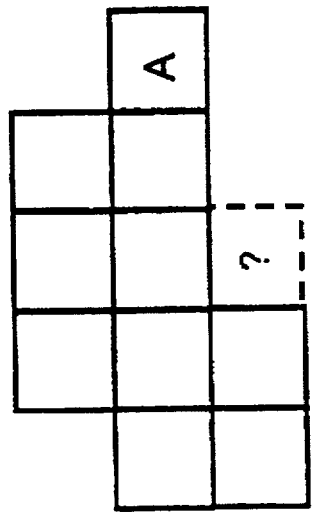
FIGS. 2A, B are a diagram showing an example of templates.
Figure 2A:
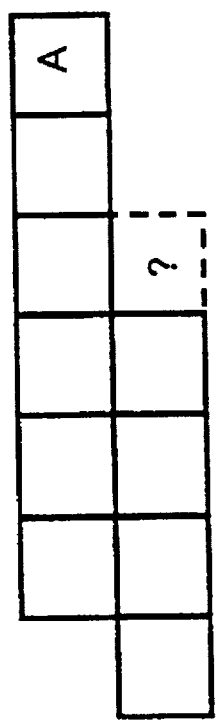

For example, in case of the three line template in FIG. 2B, the context generator 2 generates and outputs a context having bit patterns of the ten pixels extracted from the template of the ten pixels. The ten pixels in this case are two encoded reference pixels on the same line as the target encoding pixel shown by the code "?", five encoded reference pixels on the immediately preceding line of the target encoding pixel shown by the code "?", and three encoded reference pixels on the two preceding lines from the target encoding pixel shown by the code "?". The two encoded reference pixels are placed in the preceding line of the target encoding pixel shown by the code "?", while the five encoded reference pixels and the three encoded reference pixels are placed in the front and rear rows including the row of the target encoding pixel shown by the code "?".The context generator 2 operates in synchronization with inputted picture processing clock signal.

A context storage device 3 of FIG. 1 comprises a latch circuit temporarily stores a context for the target encoding pixel from the above-mentioned context generator 2 in synchronization with the clock of the above-mentioned picture processing clock signal, and outputs the temporarily stored context as a context for the target encoding pixel in synchronization with the next clock of the above-mentioned picture processing clock signal.

A context table storage device 4 of FIG. 1 comprises a plurality of reading address input nodes AR, a plurality of data output nodes DO, a plurality of a writing address input nodes AW, a plurality of input nodes DI, a write-enable signal input node WE, and a context table storage portion which is capable of reading and writing for storing a plurality of storing data comprising a plurality of bits which includes a prediction symbol and a storing data. The context table storage device 4 reads out the storing data stored in the context table storage portion based on the context which is received into the reading address input nodes AR from the above-mentioned context generator 2, and then outputs it from the data output nodes DO. Receiving a renewal clock signal on the write-enable signal input node WE, the context table storage device 4 writes a renewal data inputted from the data input nodes DI (rewrite the renewal data over previously stored data) at the address in the context table storage portion, which is based on the context received on the writing address input nodes AW, and transmitted from the above-mentioned context storage device 3.

The number of the above-mentioned reading address input nodes AR and the writing address input nodes AW is, for example, 10, if the context comprises 10 bits.

The above-mentioned storing data has a prediction symbol MPS (More Probable Symbol) which indicates a prediction value, and a probability estimation data.

The above-mentioned probability estimation data comprises an LSZ data, an NLPS data, an NMPS data and a SWITCH data. The LSZ data indicates a mismatching probability. The NLPS data serves as a probability estimation index for a renewal data, when a prediction symbol which corresponds to the storing data does not match with a picture data for a target encoding pixel. The NMPS data serves as a probability estimation index for a renewal data, when a prediction symbol which corresponds to the storing data matches with a picture data for a target encoding pixel. The SWITCH data indicates whether or not to invert a prediction symbol which corresponds to the storing data.

The number of bits in each data is as follows for example, in this first embodiment. The prediction symbol comprises 1 bit. The LSZ data comprises 16 bits. The NLPS data comprises 7 bits. The NMPS data comprises 7 bits. The SWITCH data comprises 1 bit. As a whole, the storing data comprises 32 bits.

Figures 3A, 3B:
FIGS. 3A, and B are a diagram showing an example of a context table in the context table storage device 4, 104.

At initial state, "0" is written on all of the bits of the storing data. These bits are written over along with the prosecution of a renormalization process. FIG. 3A and FIG. 3B show a storing state, for example. FIG. 3A shows a storing data for each address in a certain state. FIG. 3B shows a storing data after the storing data in the state shown by FIG. 3A is updated (the content of the storing data at the address 0000000101 is written thereover).

The above-mentioned renewal data is the same as the storing data, comprising a 1-bit prediction symbol MPSUP, a 16-bit LSZ data, a 7-bit NLPS data, a 7-bit NMPS data and a 1-bit SWITCH data. As a whole, the renewal data comprises thirty two bits.

The number of the above-mentioned data output nodes DO and that of the data input nodes DI are both 32, for example, if the storing data and the renewal data are 32-bit data respectively.

The above-mentioned context table storage portion 4 is able to store the storing data as much as the number of the address designated by the context. For example, if the context comprises 10 bits, storing data of $2^2$ is stored in the context table storage portion 4.

Figure 4:
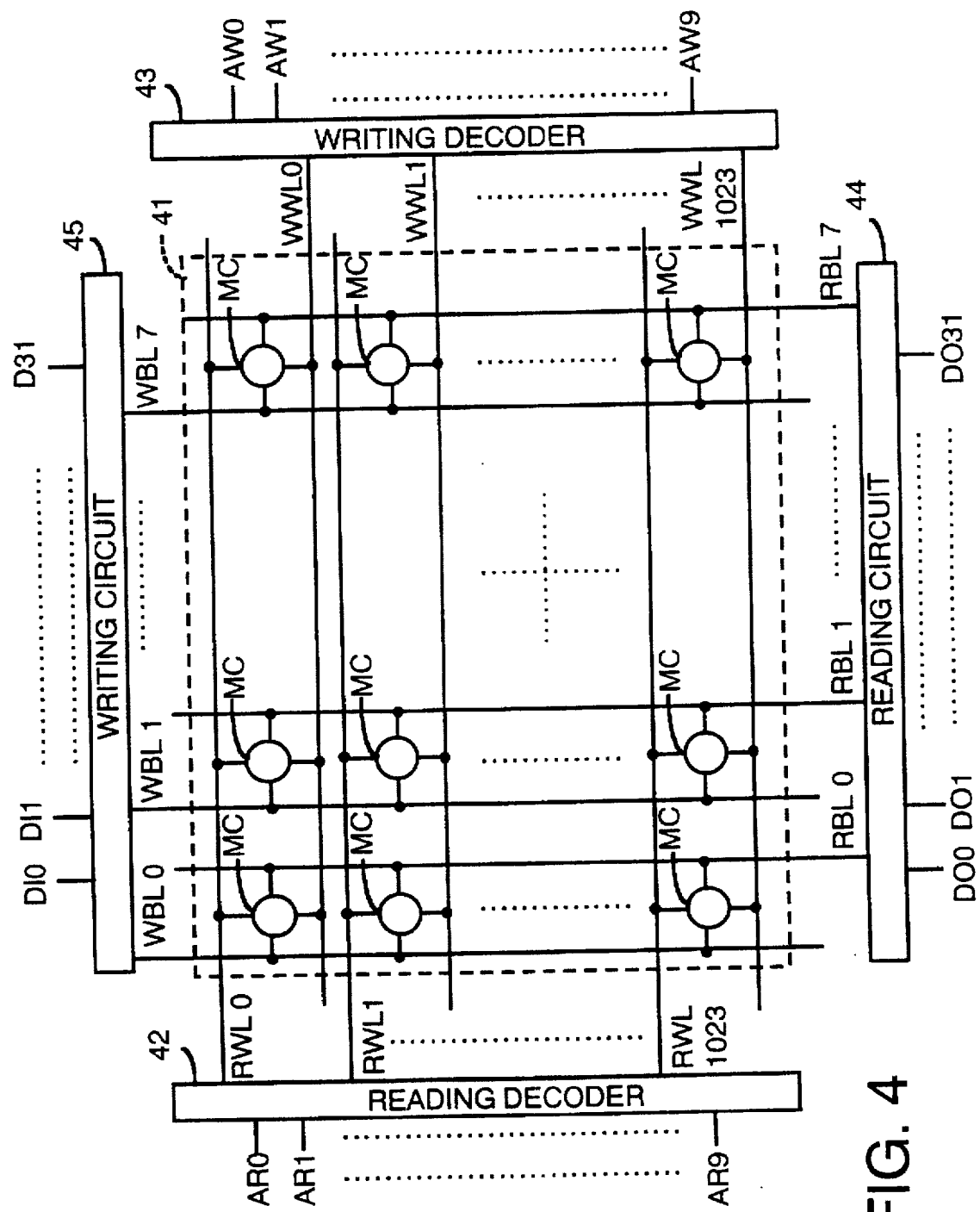
FIG. 4 is a diagram showing an example of the context table storage device 4, 14, 104, 114 according to the first~sixth embodiments of the present invention.

The above-mentioned context table storage device 4 comprises a two port RAM having a context table storage portion as shown in FIG. 4. This context table storage portion comprises 1024 (1k) of lines, and each one line (1address) comprises thirty two bits.

In FIG. 4, a memory cell array 41 comprises 1024×32 pieces of memory cell MC which are arranged in the 1024 rows and in the thirty two columns. The reading word lines RWL0~RWL1023 are arranged in the 1024 rows, each of which is connected to 32 memory cells allocated in each column. The writing word lines WWL0~WWL1023 are arranged in the 1024 rows, each of which is connected to 32 memory cells allocated in each column. The reading bit lines RBL0~RBL31 are arranged in thirty two columns, each of which is connected to 1024 memory cells allocated in each row. The writing bit lines WBL0~WBL31 are arranged in thirty two columns, each of which is connected to 1024 memory cells allocated in each row.

A reading decoder 42 is connected to the 10 read address nodes AR0~AR9. According to the context from the context generator 2 inputted to the read address nodes AR0~AR9, the reading decoder 42 activates one of the above-mentioned 1024 reading word lines RWL0~RWL1023. In other words, the reading decoder 42 makes one of the reading word lines "H" level, and make the remaining 1023 lines "L" level. A writing decoder 43 is connected to the 10 write address nodes AW0~AW9. According to the context from the context generator 2 inputted to the write address nodes AW0~AW9 via the above-mentioned context storage device 3, the writing decoder 43 activates one of the above-mentioned 1024 writing word lines WWL0~WWL1023. In other words the write decoder makes one of the writing word lines "H " level and make the remaining 1023 lines "L" level.

A reading circuit 44 is connected to thirty two reading bit lines RBL0~RBL31. The reading circuit 44 conducts a predetermined processing, for example, amplification and so on, stored contents read out from the memory cells into these reading bit lines RBL0~RBL31 and outputs them to the above-mentioned data output nodes DO1~DO31. A writing circuit 45 is connected to thirty two writing bit lines WBL0~WBL31. The writing circuit 45 conducts a predetermined processing, for example, amplification and so on, to the renewal data inputted in the input nodes DI1~DI31, and output them to the writing bit lines WBL0~WBL31.

Figure 5:
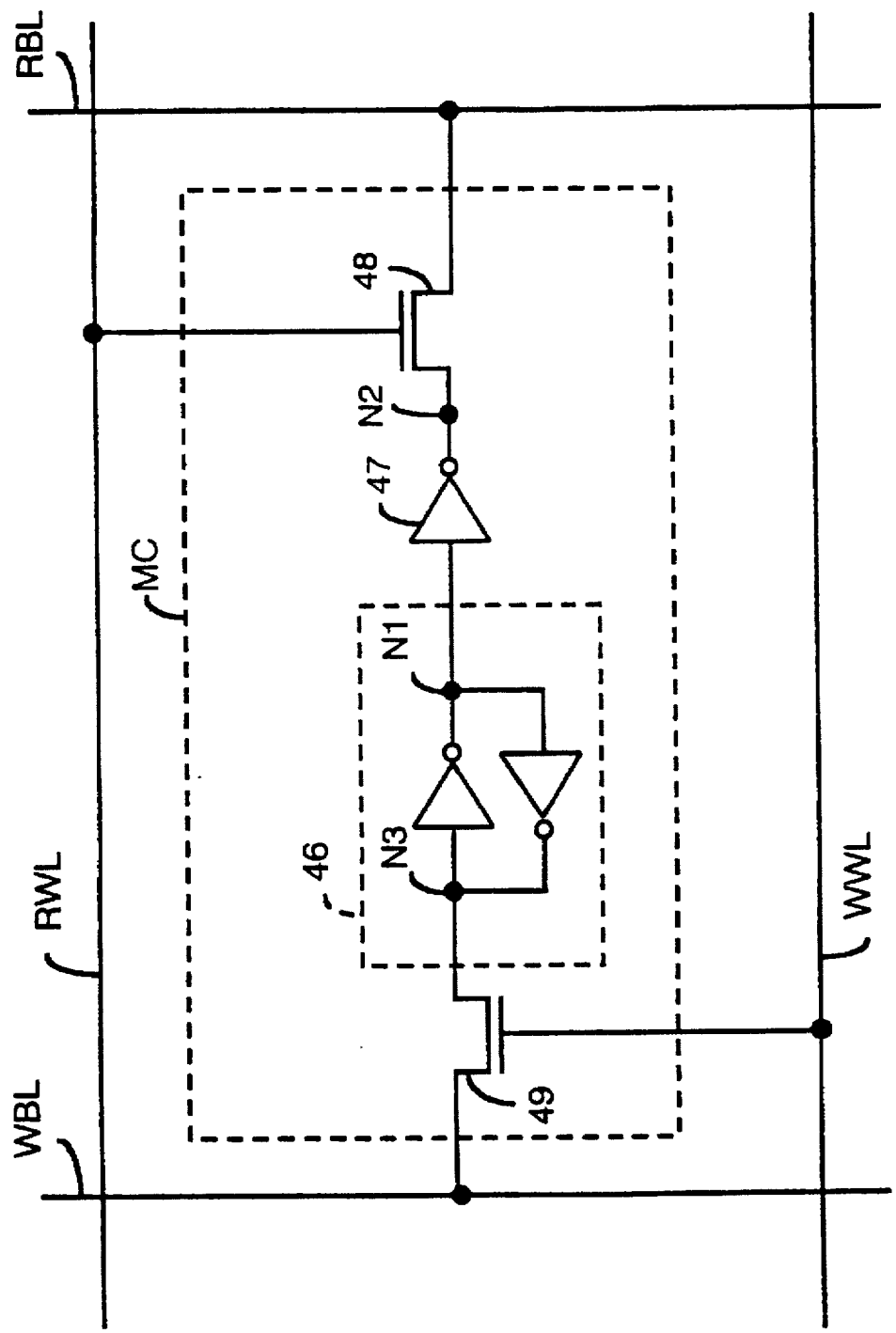
FIG. 5 is a diagram showing an example of a memory cell MC in the context table storage device 4, 14, 104, 114 according to the first~sixth embodiments of the present invention.

FIG. 5 shows a configuration of a memory cell MC. In FIG. 5, a storage node N1 stores stored contents, a reading node N2 reads out stored contents and a writing node N3 is supplied with a renewal data.

A latch circuit 46 in FIG. 5 is connected between the above-mentioned storage node N1 and the above-mentioned writing node N3. A latch circuit 46 inverts a renewal data inputted to the writing node N3, and provides it with the storage node N1 and latches the inverted data. The latch circuit 46 comprises two invertor elements connected in parallel in the opposite polarity. An invertor element 47 in FIG. 5 is connected between the storage node N1 and the reading node N2, and inverts contents stored in the storage node N1 and provides it with the reading node N2.

A reading transfer gate 48 in FIG. 5 is connected between the reading node N2 and a reading bit line RBL arranged in the corresponding column. Its control electrode is connected to a reading word line RWL arranged in the corresponding row. The reading transfer gate 48 comprises a MOS transistor. A reading transfer gate 49 in FIG. 5 is connected between the reading node N3 and a writing bit line WBL arranged in the corresponding column. Its control electrode is connected to a writing word line WWL arranged in the corresponding row. The reading transfer gate 49 also, comprises a MOS transistor.

For the shake of simplifying the explanation, the two port RAM memory cell array 41 shown in FIG. 4 are assumed to that a memory cell MC is arranged in the 1024 rows by the thirty two columns. The memory cells can be arranged, for example, in the 1024/n lines by 32×n rows (n is an integer). In this a case, 1024/n reading/writing word lines and 32×n reading/writing bit lines are arranged. One of the 1024/n reading word lines is activated to select thirty two reading bit lines out of the 32×n reading bit lines, for reading out a 32-bit data, which is then outputted to the data output nodes DO0–DO7 via the reading circuit 44. One of the 1024/n writing word lines is activated to select thirty two writing bit lines out of the 32×n writing bit lines for selecting thirty two memory cells, to which a renewal data inputted from the data input nodes DI0–DI31 is provided via the writing circuit 45.

Referring back to FIG. 1, a probability estimating table storage device 5 comprises a plurality of address input nodes A, a plurality of data output nodes DO, and a probability estimating table storage portion. The probability estimating table storage portion for storing a probability estimating data comprising a plurality of bits is based on the probability table recommend by the ITU (International Telecommunication Union) recommendation T. 82. A probability estimation index STUP which indicates a status number is received at the address input nodes A. The probability estimating table storage device 5 reads out the probability estimating data stored in the probability estimating table storage portion, corresponding to the address based on the received probability estimation index, which is then outputted from the data output node DO as a storing data of a renewal data for the context table storage device 4. The probability estimating table storage device 5 comprises a ROM and so on.

The number of the address input nodes A is seven, for example, if the NLPS data and the NMPS data in the probability estimating data stored in the context table storage device 4 (a probability estimation index of a renewal data) comprise seven bits respectively. Each inputted probability estimation index STUP corresponds to each address in the probability estimating table storage portion.

The probability estimating data comprises an LSZ data, an NLPS data, an NMPS data and a SWITCH data. The LSZ data indicates a mismatching probability. This represents a value of the width (referred to as the LPS (Least Probable Symbol) area width) given to the area of a least probable symbol (hereinafter it is referred to as the LPS, and this indicates that a prediction symbol MPS of a storing data from the context table storage device 4 does not match with a picture data for a target encoding pixel from the storage device 1). For example, as shown in FIG. 6, one example of probability estimating table comprises 16-bit data for each probability estimation index.

When the LPS appears, the NLPS data changes the probability estimation index existing in the context. The NLPS data serves as a renewal data probability estimation index at the address corresponding to the context when the LPS appears in the context table storage device 4. For example, as shown in FIG. 6, one example of probability estimating table comprises a seven-bit data for each probability estimation index.

The NMPS data changes the probability estimation index in the context when a most probable symbol (hereinafter it is referred to as the MPS, this indicates that a prediction symbol in a storing data from the context table storage device 4 matches with a picture data for a target encoding pixel from the storage device 1) appears and a normalization (renormalize) occurs. The NMPS dam serves as a renewal data probability estimation index at the address corresponding to the context when the MPS appears in the context table storage device 4. For example, as shown in FIG. 6, one example of probability estimating table comprises a seven-bit data for each probability estimation index.

The SWITCH data indicates whether or not to invert a prediction symbol of a storing data stored in the context table storage device 4. The SWITCH data comprises a 1-bit data, for example. If the SWITCH data is "1" when the LPS has appeared, the prediction symbol of a storing data existing in the context when the LPS appears is inverted, and serves as a prediction symbol of a renewal data at the address corresponding to the context when the LPS appears.

The number of the data output nodes DO is 31, for example, if the LSZ data of the probability estimating data comprises 16 bits, NLPS data comprises seven bits, NMPS data comprises seven bits and SWITCH data comprises one bit.

The probability estimating table storage portion is able to store as much as the number of the address designated by the probability estimation index. For example, the probability estimating table storage portions can store $2^7$ pieces of the probability estimating data, if the probability estimation index comprises seven bits. The probability estimating table storage device 5 comprises a ROM having a probability estimating table storage portion of 128 ($2^7$) rows, where each row (one address) comprises 31 bits, if LSZ data are 16 bits, NLPS data are seven bits, NMPS data are seven bits and SWITCH data is one bit.

A context comparison means 6 in FIG. 1 compares a context from the context generator 2 and the context from the context storage device 3. If the resultant shows the same, the context comparison means 6 outputs "1". Otherwise, it outputs "0".

Figure 7:
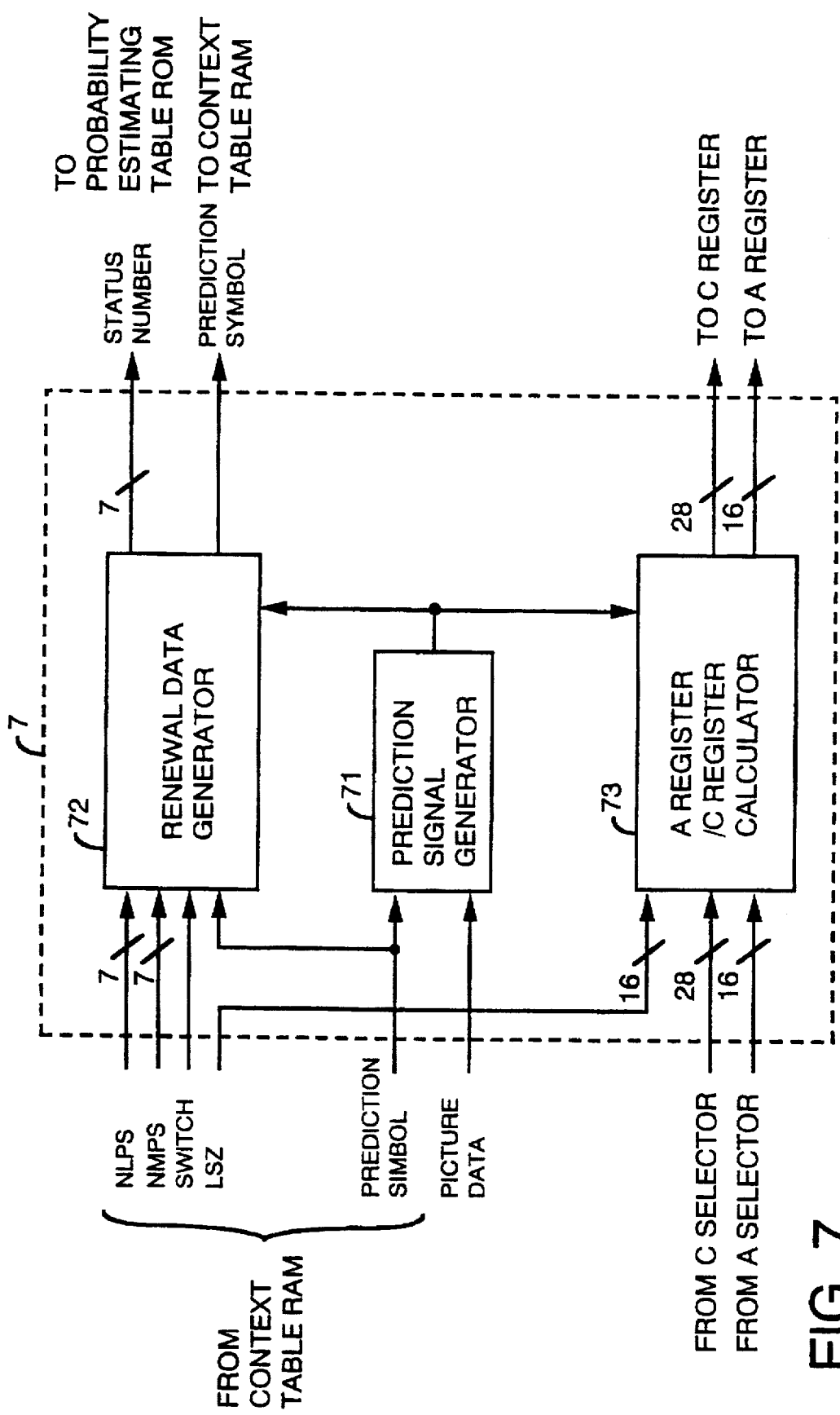
FIG. 7 is a block diagram showing an example of the arithmetic calculator 7 according to the first, second, fifth, and sixth embodiments of the present invention.

An arithmetic calculator 7 receives a picture data for a target encoding pixel from the storage device 1, a storing data from the context table storage device 4, an A data (hereinafter, referred to as which immediately precedes A data) which shows a width A of the effective area for the pixels which immediately precedes target encoding pixel, and a C data (hereinafter, referred to as which immediately precedes C data) which shows a code word C for the pixel which immediately precedes target encoding pixel. The arithmetic calculator 7 conducts a predetermined arithmetic processing for outputting an A data (hereinafter, just referred to as A data) which shows a width A of the effective area for the target encoding pixel and a C data (hereinafter, just referred to as C data) which shows a code word C for the target encoding pixel. The arithmetic calculator 7 further outputs a prediction symbol MPSUP for a renewal data to the context table storage device 4, and a probability estimation index STUP which indicates a status number to the probability estimating table storage device 5. A detailed configuration of the arithmetic calculator 7 is shown in FIG. 7.

The predetermined arithmetic processing for obtaining A data and C data is done is described below.

When the MPS has appeared:

$$A(k)=A(k-1)-LSZ(k) \quad (1)$$

$$C(k)=C(k-1) \quad (2)$$

When the LPS has appeared $$A(k)=LSZ(k) \quad (3)$$

$$C(k)=C(k-1)+\{A(k-1)-LSZ(k)\} \quad (4)$$

[0047]

where, A(k) is an A data of the k-th target encoding pixel, A(k−1) is an A data of the (k−1)-th target encoding pixel, C (k) is a C data of the k-th target encoding pixel, C (k−1) is a C data of the (k−1)-th target encoding pixel, LSZ (k) is an LSZ data of a probability estimating data from the probability estimating table storage device 5 for the k-th target encoding pixel, and k=1, 2, 3, . . . , the initial value A (0)=1.0 . . . 0, C (0)=0.0 . . . 0, for example.

In FIG. 7, a prediction conversion signal generator 71 receives a picture data for a target encoding pixel from the storage device 1 and a prediction symbol of a storing data for the target encoding pixel from the context table storage device 4. The prediction conversion signal generator 71 outputs, for example, a signal "0" (above-mentioned MPS), which indicates that the picture data matches with the prediction symbol, when the two contexts match with each other. Otherwise, the prediction conversion signal generator 71 outputs, for example, a signal "1" (above-mentioned the LPS), which indicates that the picture data does not match with the prediction symbol. The prediction conversion signal generator 71 comprises a comparison means such as an exclusive OR circuit.

A prediction symbol/probability estimation index generator 72 in FIG. 7 receives a prediction symbol of a storing data for a target encoding pixel from the context table storage device 4, and the SWITCH data, the NLPS data, the NMPS data, and a prediction conversion signal, i.e. the output signal from the prediction conversion signal generator 71. When the SWITCH data is "1", for example, and also the prediction conversion signal indicates LPS is "1", for example, the prediction symbol/probability estimation index generator 72 inverts the value of the prediction symbol inputted, and outputs it as a prediction symbol MPSUP of a renewal data from the context table storage device 4. If the combination of the values of the above-mentioned SWITCH data and the above-mentioned prediction conversion signal is otherwise, the prediction symbol/probability estimation index generator 72 outputs the value of the prediction symbol without inverting as a prediction symbol MPSUP of the above-mentioned renewal data. When the prediction conversion signal indicates LPS, the prediction symbol/ probability estimation index generator 72 selects the NLPS data and outputted it as a probability estimation index STUP (a status signal) of the probability estimating table storage device 5. If the prediction conversion signal shows MPS, or "0", for example, the prediction symbol/probability estimation index generator 72 selects the NMPS and outputs it as a probability estimation index STUP (a status signal) of the probability estimating table storage device 5.

A calculator 73 in FIG. 7 receives the LSZ data of a probability estimating data for a target encoding pixel from the context table storage device 4, the above-mentioned which immediately precedes A data, the above-mentioned which immediately precedes C data and the prediction conversion signal from the prediction conversion signal generator 71. The calculator 73 conducts the above-mentioned calculations shown by the equations (1)–(4) to output an A data and a C data. The calculator 73 comprises an A data generating portion where the LSZ data, the immediately preceding A data and the prediction conversion signal are received to output the A data, and a C data generating portion where the LSZ data, the immediately preceding A data, the immediately preceding C data and the prediction conversion signal are received to output the C data.

Referring back to FIG. 1, an A register 8 receives the A data from the arithmetic calculator 7, the pixel processing clock signal and a renormalizing clock signal. In synchronization with the inputted picture processing clock signal, the A register receives the A data from the arithmetic calculator 7 and latches them. In synchronization with the inputted renormalizing clock signal, the A register shifts-up the latched data by one bit and latches them again, and outputs them as the A data. The A register 8 outputs a renormalizing (normalization) signal for carrying out a normalization processing (extension of areas) and a last renormalizing signal indicating that normalization will be completed after one more normalization processing. A detailed configuration of the A register 8 is shown in FIG. 8.

Figure 8:
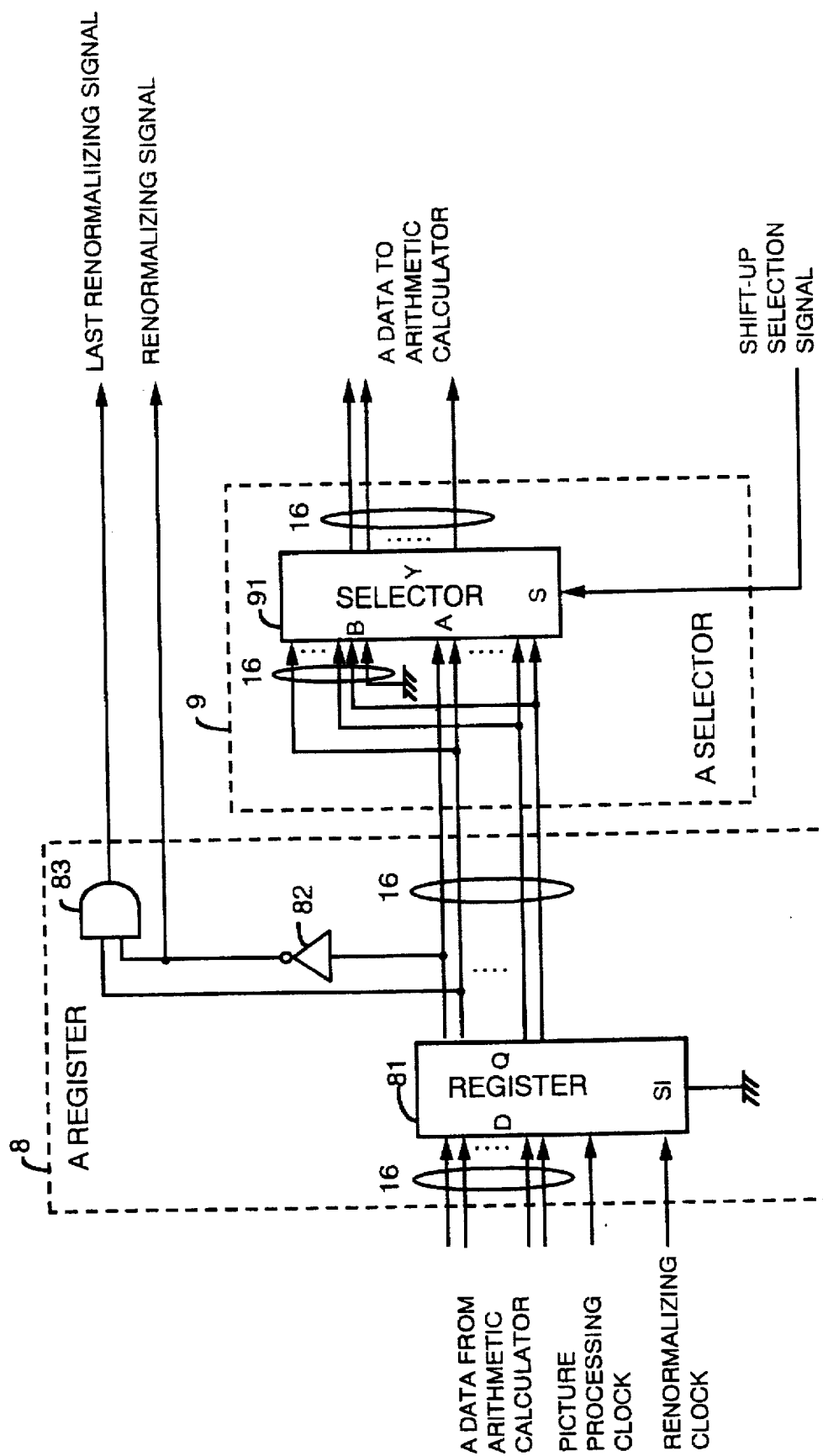
FIG. 8 is a block diagram showing an example of the A register 8 and the A selector 9 in the arithmetic calculator 7 according to the first, second, fifth, and sixth embodiments of the present invention.

In FIG. 8, an A register portion 81 takes-in the A data from the arithmetic calculator 7 and latches it therein in synchronization with the inputted pixel processing clock signal. The register portion 81 comprises a shift register having 16 latch portions, in which contents stored therein are all set to "0" at its initial state. In synchronization with the inputted renormalizing clock signal, the register portion 81 shifts-up the data latched therein by one bit, and latches them again, and outputs them as an A data. If the A data comprises 16 bits, for example, the shift register can perform the data writing (data renewal) for every bit in synchronization with the pixel processing clock signal. Then, the shift register shifts-up the contents by one bit in synchronization with a renormalizing clock signal. In other words, the least significant bit is connected to the earth electric potential node and stores "0", while the contents in the remaining bits are updated to the contents latched in the respective bits in the immediately preceding stage.

A renormalization generator 82 in FIG. 8 receives a most significant bit MSB signal (hereinafter, referred to as MSB signal) of the A data which is outputted from the register portion 81. Based on the received MSB signal, the renormalization generator 82 outputs a renormalizing signal, indicating "prosecuting a normalization processing", when the width A of the effective area becomes less than 50%, namely, the A data becomes less than 0.5 in decimal number. The renormalization generator 82 comprises an invertor circuit which outputs "1", for example, indicating "prosecuting a normalization processing", if the MSB signal is "0".

A last renormalization generator 83 in FIG. 8 receives a signal (hereinafter, referred to as the MSB-1 signal) which is placed one bit lower from the most significant bit of the A data outputted from the register portion 81 and a renormalizing signal from the renormalization generator 82. When the renormalizing signal from the renormalization generator 82 indicates "prosecuting a normalization processing", and the MSB-1 signal is "1", for example, the last renormalization generator 83 outputs a last renormalizing signal. The last renormalization generator 83 comprises an AND circuit, which outputs "1" indicating "the normalization processing will be completed by one more normalization processing", when the MSB signal is "0" and the MSB-1 signal is "1".

Referring back to FIG. 1, an A selector 9 receives the A data from the A register 8 and a shift-up selection signal which is generated based on a last renormalizing signal. When the shift-up selection signal indicates "shift-up", the A selector 9 outputs a data which is what the A data from the A register 8 is shifted-up by one bit, otherwise, the A selector 9 outputs an A data from the A register 8 as it is, to the arithmetic calculator 7 as an A data which shows the width A of the effective area of the pixels which immediately precedes the target encoding pixel (an which immediately precedes A data). The A selector 9, for example, as shown in FIG. 8, comprises a selector 91. The selector 91 has one input terminal A where the A data is received directly from the A register 8, and the other input terminal B where the A data from the A register 8 is received after the contents of the A data are shifted-up by one bit to the MSB side and its least significant bit is connected to an earth electric potential node. The selector 91 selects either one of the input terminal A and the input terminal B according to the shift-up selection signal, and connects the selected one to the output terminal Y.

A C register 10 in FIG. 1 receives a C data from the arithmetic calculator 7, the pixel processing clock signal and a renormalizing clock signal. In synchronization with the inputted picture processing clock signal, the C register 10 receives the C data from the arithmetic calculator 7 and latches them. In synchronization with the inputted renormalizing clock signal, the C register 10 shifts-up the data latched therein by one bit and latches them again, which is then outputted as a C data.

Figure 9:
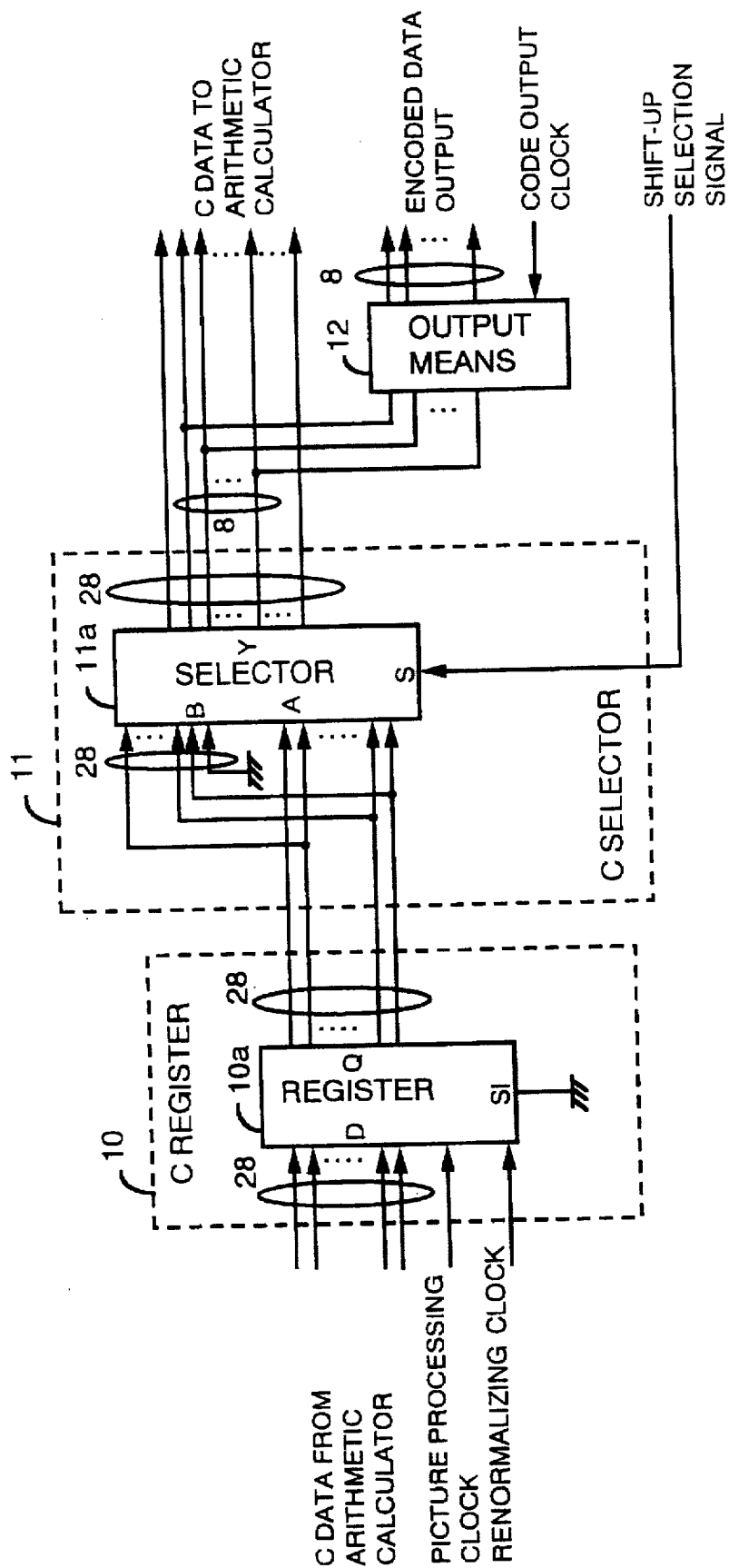
FIG. 9 is a block diagram showing an example of the C register 10 and the C selector 11 in the arithmetic calculator 7 according to the first, second, fifth, and sixth embodiments of the present invention.

For example, as shown in FIG. 9, the C register 10 takes-in the C data from the arithmetic calculator 7 and latches in synchronization with the inputted pixel processing clock signal, then shifts-up the latched data by one bit and latches it again in synchronization with the inputted renormalizing clock signal, and then outputs it as a C data. The C register 10 comprises shift registers 10a which comprise twenty eight latch portions, if the C data comprises twenty eight bits, for example. The shift register 10a performs data writing (data renewal) in synchronization with the pixel processing clock signal and shifts-up the contents by one bit in synchronization with a renormalizing clock signal. In other words, the least significant bit is connected to the earth electric potential node and stores "0", while the contents of the remaining bits are rewritten to the contents latched in the respective bits in the immediately preceding stage. At initial state, contents stored in all the twenty eight latch portions are set to "0", for example.

A C selector 11 receives the C data from the C register 10 and the shift-up selection signal. The C selector 11 outputs a data which is shifted-up by one bit from the C data of the C register 10, when the shift-up selection signal indicates "shift-up", and outputs the C data from the C register 10 as it is, when the shift-up selection signal does not indicate "shift-up", to the arithmetic calculator 7 as a C data showing a code word for the pixel which immediately precedes target encoding pixel (an which immediately precedes C data), and also as an encoded data for transmitting a predetermined number of significant bits. The C selector 11, for example, as shown in FIG. 9, comprises a selector 11a. The selector 11a has one input terminal A where the C data is received directly from the C register 10, and another input terminal B where a C data from the C register 10 is received after the contents of the C data are shifted-up by one bit to the MSB side and its least significant bit is connected to an earth electric potential node. The selector 11a selects either one of the input terminal A and the input terminal B according to the shift-up selection signal, and connects it to the output terminal Y.

An output means 12 in FIG. 1 receives a predetermined number of significant bits in the encoded data form the C selector 11 and a code output clock signal. In synchronization with the inputted code output clock signal, the output means 12 takes-in the predetermined number of significant bits in the encoded data form the C selector 11 and outputs the contents taken therein in synchronization with the inputted code output clock signal as an encoded data for transmission. For example, as shown in FIG. 9, the output means 12 has eight latch portions for taking-in the most significant eight bits of the C data as an encoded data if the C data comprises twenty eight bits.

A controller 13 in FIG. 1 receives a system clock signal, an identical context signal from the context comparison means 6, a renormalizing signal and a last renormalizing signal from the A register 8. The controller 13 then outputs a pixel processing clock signal to the above-mentioned context generating circuit 2, the context storage device 3, the A register 8 and the C register 10. The controller 13 further outputs a renewal clock to the context table storage device 4 and a renormalizing clock signal to the A register 8 and the C register 10. The controller 13 further outputs a shift-up selection signal to the A selector 9 and the C selector 11 and a code output clock signal to the output means 12. A kernel portion comprises the arithmetic calculator 7, the A register 8, the A selector 9, the C register 10 and the C selector 11 and the controller 13.

The pixel processing clock signal from the controller 13 is a signal showing a timing for processing the data for the target encoding pixel. The pixel processing clock signal is generated by the controller 13 according to a system clock signal, a renormalizing signal, a last renormalizing signal and an identical context signal and synchronizes with a system clock signal. The pixel processing clock signal from the controller 13 maintains either one of the levels, when the renormalizing signal indicates "carrying out a normalization processing", and the last renormalizing signal does not indicate "normalization will be completed after one more normalization processing". The pixel processing clock signal from the controller 13 also maintains either one of the levels, when the renormalizing signal indicates "carrying out a normalization processing", the last renormalizing signal indicates "normalization will be completed after one more normalization processing", and the identical context signal indicates "identical context". Otherwise, the pixel processing clock signal from the controller 13 becomes the same signal as the system clock signal.

For example, as shown by FIG. 11B, when the renormalizing signal (FIG. 11E) is "1" indicating "carrying out a normalization processing", and the last renormalizing signal (FIG. 11F) is "0", not indicating "normalization will be completed after one more normalization processing", (where "1" indicates "H" level and "0" indicates "L" level in the below in this first embodiment, except some specific cases), the pixel processing clock signal from the controller 13 becomes "H" level regardless of the system clock.

When the renormalizing signal is "1" indicating "carrying out a normalization processing", the last renormalizing signal is "1" indicating "normalization will be completed after one more normalization processing", and the identical context signal (FIG. 11D) is "1" indicating "identical context", the pixel processing clock signal from the controller 13 becomes "H" level regardless of the system clock. Otherwise, the pixel processing clock signal from the controller 13 becomes the same signal as the system clock signal.

The renormalizing signal shown by FIG. 11E is generated from the renormalizing signal from the A register 8 in synchronization with the system clock signal. It may be generated in the controller 13. For example, based on the renormalizing signal from the A register 8, the renormalizing signal FIG. 11E is generated so that it synchronizes with the rising edge of the system clock. In other words, the renormalizing signal FIG. 11E is generated in order to decide whether the target encoding pixel is normalized or not at the subsequent timing of the system clock which is used when the context generator 2 takes-in a context for the target encoding pixel.

Similarly, the last renormalizing signal shown by FIG. 11F is generated from the last renormalizing signal from the A register 8 in synchronization with the system clock signal. It may be generated in the controller 13. For example, based on the last renormalizing signal from the A register 8, the last renormalizing signal FIG. 11F is generated so that it synchronizes with the rising edge of the system clock. In other words, the last renormalizing signal FIG. 11F is generated in order to specify the last normalizing signal at the subsequent timing of the system clock which is used when the context generator 2 takes-in a context for the target encoding pixel.

The shift-up selection signal from the controller 13 is generated in the controller 13 according to the last renormalizing signal from the A register 8, the system clock signal and the identical context signal, and synchronizes with the system clock signal. When the last renormalizing signal shown by FIG. 11F synchronized with the system clock signal indicates "normalization will be completed after one more normalization processing", and the identical context signal does not indicates "identical context", the shift-up selection signal indicates a "shift-up" state. Otherwise, the shift-up selection signal does not indicates the "shift-up" state.

Figure 11:
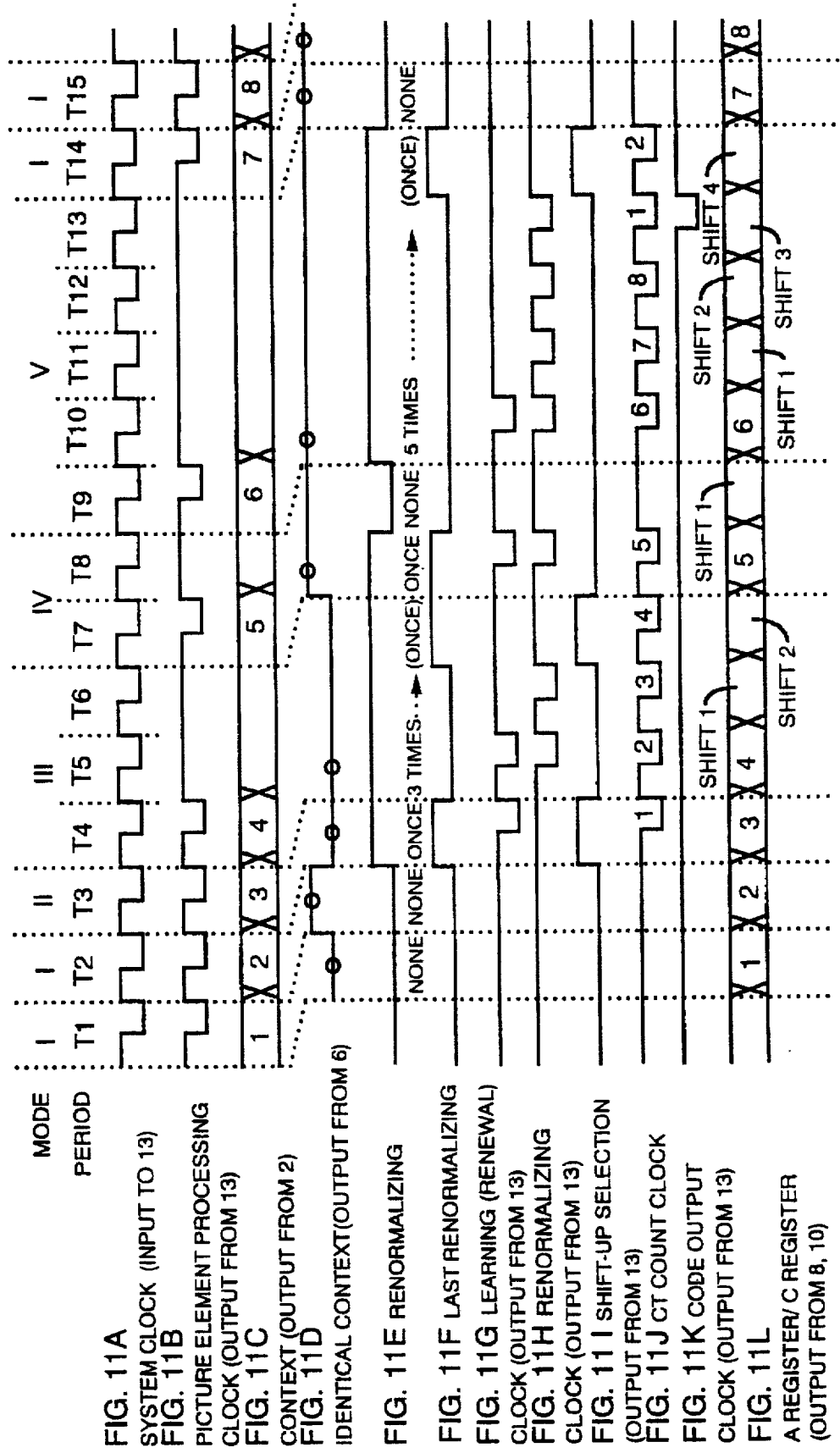
FIGS. 11A–L are waveform diagrams showing signal waveforms in the main portions according to the first, second, fifth, and sixth embodiments of the present invention.

For example, as shown by FIG. 11 I, when the last renormalizing signal FIG. 11F is "1", indicating "normalization will be completed after one more normalization processing", and the identical context signal FIG. 11D is "0" which does not indicates "identical context", the shift-up selection signal becomes "1" indicating a "shift-up" state. Otherwise, the shift-up selection signal becomes "0" which does not indicates the "shift-up" state.

The renewal clock signal from the controller 13 is a signal showing a timing signal for renewing a storing data stored in the context table storage device 4, which is generated in the controller 13 according to a system clock signal, a pixel processing clock signal and a renormalizing signal. The renewal clock signal synchronizes with a system clock signal, and becomes the system clock signal when the renormalizing signal indicates "carrying out a normalization processing" in the next cycle of the system clock signal after the appearance of the pixel processing clock signal. Otherwise, the renewal clock signal maintains either one of the levels.

For example, as shown by FIG. 11G, when the rising of the pixel processing clock signal is detected and the renormalizing signal FIG. 11E is "1" indicating "carrying out a normalization processing" at the rising of the system clock signal after the rising of the pixel processing clock signal is detected, the renewal clock signal becomes the same clock as that of the system clock. Otherwise, the renewal clock maintains "H" level, for example, regardless of the system clock.

The renormalizing clock signal, shown by FIG. 11H, from the controller 13 is a signal for shifting up the contents stored in the register portion 81 of the A register 8 and the C register 10, which is generated in the controller 13 according to a renormalizing signal and a last renormalizing signal from the A register 8, a system clock signal and an identical context signal, and synchronizes with the system clock signal. When the renormalizing signal indicates "carrying out a normalization processing", and the last renormalizing signal does not indicate "normalization will be completed after one more normalization processing", the renormalizing clock signal becomes the same cock as the system clock signal ("set"). When the renormalizing signal indicates "carrying out a normalization processing", the last renormalizing signal indicates "normalization will be completed after one more normalization processing", and the identical context signal indicates "identical context", the renormalizing clock signal becomes also the same clock as the system clock signal ("set"). Otherwise, the renormalizing clock signal becomes in a clock halt state (maintaining either one of the levels or "reset"), as shown by FIG. 11H.

When the pixel processing clock signal FIG. 11B outputs a clock synchronized with the system clock signal, the renormalizing clock signal maintains either one of the levels, and when the pixel processing clock signal maintains either one of the levels, the renormalizing clock signal outputs a clock synchronized with the system clock signal.

The code output clock signal (FIG. 11K) from the controller 13 shows a timing signal for taking-in the contents stored in the C register 10 to the output means 12 via the C selector 11, and for outputting it as an encoded data for transmission. The code output clock signal is generated in the controller 13 according to a renormalizing signal from the A register 8 and a system clock signal. When the renormalizing signal indicates "carrying out a normalization processing", the code output clock signal becomes the same clock signal as the system clock signal. Otherwise, the code output clock signal becomes a pulse, when a predetermined number of clocks of the CT count clock signal is counted, according to a CT count clock signal which maintains either one of the levels (FIG. 11J). For example, as shown in FIG. 11K, when the renormalizing signal is "1" indicating "carrying out a normalization processing", the code output clock signal firstly generates a count clock signal (for example FIG. 11J) which becomes a system clock signal. When the number of the clocks of this count clock signal reaches eight, the code output clock signal becomes "L" level, for example, at the next cycle of the system clock signal.

An operation of a digital signal encoding device constructed in the manner explained above is explained below.

The operating mode of the above digital signal encoding device is divided into five modes I–V, as shown in FIG. 10. The operation in each mode is explained below using the waveforms shown in FIGS. 11A–L.

In mode I, there is no renormalization, i.e. no normalization processing is required in which the A data for target encoding pixel indicates larger than 0.5 of decimal number.

In mode II, a renormalization is performed, i.e. a normalization processing is required in which the A data for the target encoding pixel indicates value less than 0.5 in decimal number, the context for the target encoding pixel does not match with the context for the pixel which is immediately subsequent to the target encoding pixel, and renormalization is carried out once.

In mode III, a renormalization is performed, the context for the target encoding pixel does not match with the context for a pixel which is immediately subsequent to the target encoding pixel, and renormalization is carried out more than once.

In the mode IV, a renormalization is performed, the context for the target encoding pixel matches with the context for a pixel which immediately subsequent to the target encoding pixel, and renormalization is carried out once.

In the mode V, a renormalization is performed, the context for the target encoding pixel matches with the context for a pixel which immediately subsequent to the target encoding pixel, and renormalization is carried out more than once.

[mode I]

The example of major signal waveform in the mode I is shown in the periods $T_1$ and $T_2$ of the system clock signal in FIG. 11A. In the period $T_1$, a context for the target encoding pixel is not identical with the context for a pixel which is immediately subsequent to the target encoding pixel. In the period $T_2$, a context for the target encoding pixel is identical with the context for a pixel which is immediately subsequent to the target encoding pixel.

First, it is assumed that an encoding processing has been done for the first target encoding pixel during the period $T_1$ in the mode I. In the period $T_1$, a pixel processing clock signal is raised by the rise of the system clock. Receiving the rise of the pixel processing clock signal, the context generator 2 reads a context for the first target encoding pixel from the storage device 1 and outputs the read context to the reading address input nodes AR of the context table storage device 4.

The code 1 in FIG. 11C indicates that a context has been generated by the context generator 2 for the first target encoding pixel.

In the context table storage device 4, a 32-bit storing data is mad out according to the context inputted into the reading address input nodes AR, and outputted from the data output nodes DO to the arithmetic calculator 7.

In the prediction conversion signal generator 71 in the arithmetic calculator 7 (ref. FIG. 7), a prediction symbol of the storing data and a picture data of the first target encoding pixel are compared to generate a prediction conversion signal.

When this prediction conversion signal indicates that the prediction symbol matches with the picture data (indicates the MPS), the calculator 73 calculates an A data from an LSZ data of a storing data and the A data of the pixels to be encoded which precedes the first pixels to be encoded, according to the above-mentioned equation (1), which is then outputted to the A register 8. The C data of the pixels to be encoded which precedes the first pixels to be encoded is outputted to the C register 10, according to the above-mentioned equation (2). When this prediction conversion signal indicates that the prediction symbol does not match with the picture data (indicates the LPS), the calculator 73 outputs the LSZ data of a storing data to the A register 8 as an A data, according to the above-mentioned equation (3). The calculator 73 further calculates a C data from the LSZ data of a storing data and both A and C data of the pixels to be encoded which precedes the first pixels to be encoded, according to the above-mentioned equation (4), which is then outputted to the C register 10.

Figure 12:
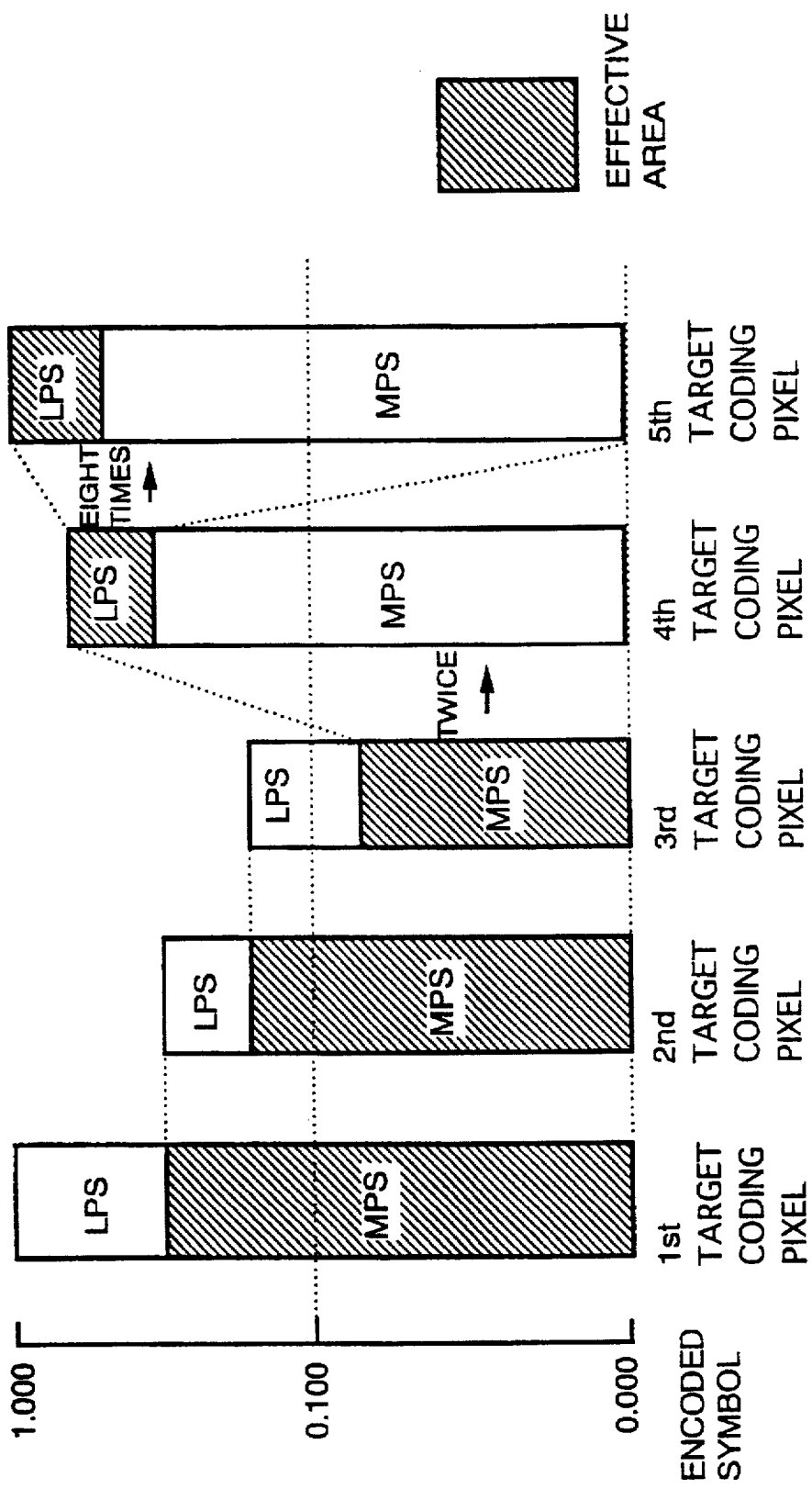
FIG. 12 is a diagram showing the concept of the A data and the C data according to the first embodiment of the present invention.

The concept of an A data and a C data at this stage is explained using the bar graph for the first pixels to be encoded shown in FIG. 12. The bar graph for this first target encoding pixel shows a case that a picture data matches with a prediction symbol. The contents stored in the A register 8 is assumed to be 1.000 . . . , and that of the C register 10 is assumed to be 0.000 . . . at the initial state. The width of the LPS corresponds to the value of the LSZ data for the first target encoding pixel. The width of the MPS corresponds to the value which is calculated by subtracting the width of the LPS from the contents stored in the A register 8. In other words, the width of the MPS corresponds to the width of the effective area for the first target encoding pixel.

In other words, the A data calculated and outputted by the calculator 73 has a value corresponding to the width of the MPS. The C data calculated and outputted by the calculator 73 has a value corresponding to the bottom of the effective area, namely, a value corresponding to the bottom of the MPS.

The A data and the C data calculated by the calculator 73 in this way are inputted to the register portion 81 of the A register 8 (ref. FIG. 8) and to the C register 10 (ref. FIG. 9), respectively, and stored therein (renewal of the stored contents) at the rising edge of a pixel processing clock signal from the controller 13 (period $T_2$).

The A data which is stored in the register portion 81 of the A register 8 at this stage has a value larger than 0.5 in decimal number. Accordingly, the value of the most significant bit is "1", and a renormalizing signal "0" indicating "not carrying out a normalization processing" is outputted from the renormalization generator 82 in the A register 8. The last renormalization generator 83 in the A register 8 then outputs a last renormalizing signal "0".

On the other hand, receiving a context of the second pixel from the context generator 2 and a context of the first target encoding pixel from the context storage device 3, the context comparison means 6 outputs an "L" level identical context signal indicating that "the contexts do not match with each other" during the period $T_2$ as shown by FIG. 11D.

Accordingly, during this period $T_2$, the mode is recognized. Here, it is recognized that no renormalization is performed, and the contexts do not match with each other and the mode I in the period $T_1$ has been completed for the period $T_1$.

Since recognizing that a renormalization is not required in the mode I in the period $T_1$ during the period $T_2$, operations from a context generation to the arithmetic calculation are carried out during the mode I in the next period of $T_2$.

Accordingly, receiving a renormalizing signal from the renormalization generator 82 of the A register 8, the controller 13 outputs a renewal clock signal and a renormalizing clock signal both having "H" level in the period $T_2$ as shown by FIG. 11G and FIG. 11H, respectively, because the received renormalizing signal is at "L" level. Receiving an "H" level renewal clock signal, the context table storage device 4 keeps its stored contents without renewal. Receiving an "H" level renormalizing clock signal, the register portion 81 of the A register 8 and the C register 10 does not shift-up the contents stored therein, and keep latching the received contents.

The code 1 shown in FIG. 11L indicates that the first pixels to be encoded are latched to the A register 8 and the C register 10.

Since the controller 13 maintains the renormalizing clock signal to "H" level, the CT count clock signal is maintained to "H" level too. The code output clock signal from the controller 13 therefore, remains at "H" level. Accordingly, the output means 12 neither takes-in nor outputs the contents stored in the C register 10.

Accordingly, in the mode I in this period $T_1$, it takes only one clock (a cycle) of the system clock to carry out the procedures from a context generation to the arithmetic calculation for the target encoding pixel. The A data and the C data calculated by the arithmetic calculator 7 are stored in the A register 8 and the C register 10, respectively and the storing data in the context table storage device 4 are not updated.

As a result, substantial operating time in the period $T_1$ in the mode I takes no more than one system clock. Furthermore, the time spared for this one system clock substantially equals to the sum of the accessing time of the context table storage device 4 and that of the arithmetic calculator 7. This shortens the period of system clock, contributing to the high-speed processing.

In the mode I in this period $T_1$, the prediction symbol which is generated by the prediction symbol/probability estimation index generator 72 in the arithmetic calculator 7 is outputted as a prediction symbol MPSUP of a renewal data to the context table storage device 4. On the other hand, the probability estimating table storage device 5 receives the probability estimation index STUP which is generated by the prediction symbol/probability estimation index generator 72 in the arithmetic calculator 7 to output a storing data of a renewal data to the context table storage device 4.

Accordingly, the context table storage device 4 does not renew the content stored therein, since it receives an "H" level renewal clock signal.

An operation in the mode I in the period $T_2$ is explained below. It is assumed that the encoding processing has been completed for the second target encoding pixel in the mode I in the period $T_2$. The mode I in the period $T_2$ is different from the mode I in the period $T_1$ mentioned above only in that the context for the target encoding pixel does not match or match with the context for the subsequent target encoding pixel.

Accordingly, the operation of the mode I in the period $T_2$ is the same as that of the mode I in the period $T_1$. It takes only one clock (cycle) of the system clock to carry out the context generation by the context generator 2 to the arithmetic calculation by the arithmetic calculator 7 for the second target encoding pixel. The A data and the C data calculated by the arithmetic calculator 7 are stored in the A register 8 and the C register 10, respectively. The storing data in the context table storage device 4 are not updated. The output means 12 neither takes-in nor outputs the contents stored in the C register 10.

As a result, the substantial operation is carried out only within one system clock in the mode I in the period $T_2$. Furthermore, the time spared for this one system clock substantially equals to the sum of the accessing time of the context table storage device 4 and that of the arithmetic calculator 7. This shortens the period of system clock, contributing to the high-speed processing.

The concept of an A data and a C data at this stage is explained using the bar graph for the second target encoding pixel, which is shown in FIG. 12. The bar graph for this second target encoding pixel indicates a case that a picture data matches with a prediction symbol. The contents stored in the A register 8 for the first target encoding pixel corresponds to the width of the effective area of the MPS which is the same MPS as that explained in the mode I in the period $T_1$. The contents stored in the C register 10 for the first target encoding pixel has the value corresponding to the bottom of the MPS which is the same MPS as that explained in the mode I in the period $T_1$. The width of the LPS corresponds to the value of the LSZ data of a storing data for the second target encoding pixel, which also corresponds to the value calculated by subtracting the width of the LPS from the contents stored in the A register 8. The width of the MPS corresponds to the width of the effective area for the second target encoding pixel.

In other words, the A data for the second target encoding pixel which is calculated and outputted by the arithmetic calculator 7 has a value corresponding to the width of the MPS. The C data for the second target encoding pixel which is calculated and outputted by the arithmetic calculator 7 has a value corresponding to the bottom of the effective area, namely, the bottom of the MPS.

In the same manner as the recognition of the mode I in the period $T_1$, the mode I in the period $T_2$ is also recognized during the period $T_3$, namely, the clock which is subsequent to the clock in which a context is generated. By the mode recognition of the mode I in the period $T_2$, it is recognized that no renormalization is performed and the contexts match with each other. Accordingly, the operation is performed from the context generation to the arithmetic calculation in the next mode, namely, the mode II, in the period $T_3$.

[mode II]

The examples of major signal waveforms in the mode II are shown in the period $T_3$ of the system clock signal in FIG. 11A. As for the mode II, it is assumed that an encoding processing has been done for the third target encoding pixel.

In the period $T_3$, a pixel processing clock signal is raised by the rise of the system clock. Receiving the rise of the pixel processing clock signal, the context generator 2 reads a context for the third target encoding pixel from the storage device 1 and outputs the read context to the reading address input nodes AR of the context table storage device 4.

The code 3 in FIG. 11C indicates that a context has been generated by the context generator 2 for the third target encoding pixel.

In the context table storage device 4, a 32-bit storing data is read out according to the context inputted into the reading address input nodes AR and outputted from the data output nodes DO to the arithmetic calculator 7.

In the prediction conversion signal generator 71 in the arithmetic calculator 7 (ref. FIG. 7), a prediction symbol of the prediction/index data and a picture data of the target encoding pixel are compared to generate a prediction conversion signal.

When this prediction conversion signal indicates that the prediction symbol matches with the picture data (indicates the MPS), the calculator 73 calculates an A data from an LSZ data from the context table storage device 4 and the A data of the second pixels to be encoded, according to the above-mentioned equation (1). The calculated A data is outputted to the A register 8. The C data of the second pixels to be encoded is outputted to the C register 10, according to the above-mentioned equation (2).

When this prediction conversion signal indicates that the prediction symbol does not match with the picture data (indicates the LPS), the calculator 73 outputs the LSZ data from the context table storage device 4 to the A register 8 as an A data, according to the above-mentioned equation (3). The calculator 73 further calculates a C data from the LSZ data from the context table storage device 4 and both A and C data of the second pixels to be encoded, according to the above-mentioned equation (4). The calculated C data is outputted to the C register 10.

The concept of an A data and a C data at this stage is explained using the bar graph for the third target encoding pixel shown in FIG. 12. The bar graph for the third target encoding pixel indicates that a picture data matches with a prediction symbol. The contents stored in the A register 8 for the second target encoding pixel corresponds to the width of the effective area of the MPS which is the same MPS as that explained in the mode I in the period $T_2$. The contents stored in the C register 10 for the second target encoding pixel has a value corresponding to the bottom of the MPS which is the same MPS as that explained in the mode I in the period $T_2$. The width of the LPS corresponds to the value of LSZ data of a storing data for the third target encoding pixel. The width of the MPS corresponds to the value calculated by subtracting the width of the LPS from the contents stored in the A register 8, and is the width of the effective area for the third target encoding pixel.

In other words, the A data calculated and outputted by the calculator 73 has a value corresponding to the width of the MPS. The C data calculated and outputted by the calculator 73 has a value corresponding to the bottom of the effective area, namely, a value corresponding to the bottom of the MPS.

The A data and the C data calculated by the calculator 73 in this way are inputted to the register portion 81 of the A register 8 (ref. FIG. 8) and to the C register 10 (ref. FIG. 9), respectively, and stored therein (renewal of the stored contents) at the rising edge of a pixel processing clock signal from the controller 13 (period $T_4$).

In the period $T_3$, since a renormalization processing is not required in the mode I in the period $T_2$, a renormalizing signal is "L" level as shown in FIG. 11E, and the renewal clock signal and the renormalizing clock signal outputted from the controller 13 are "H" level as shown in, FIGS. 11G and H, respectively.

Receiving an "H" level renewal clock signal, the context table storage device 4 keeps its stored contents without rewriting. Receiving an "H" level renormalizing clock signal, the register portion 81 of the A register 8 and the C register 10 do not shift-up the contents stored therein, and keep latching the received contents.

During the period $T_3$, since the controller 13 maintains the renormalizing clock signal to "H" level, the CT count clock signal is maintained to "H" level too. The code output clock signal from the controller 13 therefore, remains at "H" level. Accordingly, the output means 12 neither takes-in nor outputs the contents stored in the C register 10.

On the other hand, the A data calculated by the arithmetic calculator 7 and inputted in the register portion 81 of the A register 8 in the period $T_4$ has a value more than 0.25 and less than 0.5 in decimal number. Accordingly, the value of the most significant bit is "0", and the value which is one bit lower from the most significant bit is "1".

Accordingly, the renormalization generator 82 in the A register 8 outputs a renormalizing signal "1" indicating "carrying out a normalization processing", therefore, an "H" level renormalizing signal is obtained in the controller 13 in the period $T_4$, as shown in FIG. 11E.

The last renormalization generator 83 in the A register 8 outputs a last renormalizing signal "1" indicating "normalization will be completed after one more normalization processing". An "H" level last renormalizing signal is obtained in the controller 13 in the period $T_4$, as shown in FIG. 11F.

Receiving a context of the fourth pixel from the context generator 2 and a context of the third target encoding pixel from the context storage device 3, the context comparison means 6 outputs an "U" level identical context signal indicating that "the contexts do not match with each other" during the period $T_4$ as shown in FIG. 11D.

Accordingly, the mode II is recognized in this period $T_4$, in which the contexts are not identical and one renormalization processing has to be performed.

By this recognition, a renormalization processing is performed in the period $T_4$ shown in FIGS. 11A–L. In other words, the storing data in the context table storage device 4 is updated, and the A data in the A register 8 and the C data in the C register 10 are respectively shifted-up by one bit.

In this first embodiment, the context table storage device 4 comprises a two port RAM, in which the stored contents can be read out and written (updated) within one clock of the system clock. Also in this first embodiment, when the A selector 9 and the C selector 11 receive the "H" level in the shift-up selection signal, the A selector 9 and the C selector 11 respectively select and output the data obtained by shifting up the A data latched in the A register 8 and the C data latched in the C register 10 by one bit, respectively.

Accordingly in the first embodiment, the renormalization processing can be carried out in the first clock of the system clock in which the encoding processing for the next target encoding pixel is performed, that is in concrete, in the period $T_4$ in the mode III shown in FIGS. 11A–L. This renormalization processing will be explained more in detail in the next explanation on the operation of the mode III.

Accordingly, in the mode II, it takes only one clock (a cycle) of the system clock to carry out the procedures from a context generation to the arithmetic calculation for the target encoding pixel. The A data and the C data calculated by the arithmetic calculator 7 are stored in the A register 8 and the C register 10, respectively. The renormalization processing is performed in the first clock of the system clock in which an encoding processing for the next target encoding pixel is performed.

As a result, substantial operation in the mode II is carried out only within one system clock. Furthermore, the time spared for this one system clock substantially equals to the sum of the accessing time of the context table storage device 4 and that of the arithmetic calculator 7. This shortens the period of system clock, contributing to the high-speed processing.

[mode III]

The examples of major signal waveforms in the mode III (it is assumed that the number of the renormalization processing is three) are shown in the periods $T_4$–$T_6$ of the system clock signal in FIG. 11A.

As for the mode III, it is assumed that an encoding processing has been done for the fourth target encoding pixel. In the period $T_4$, a pixel processing clock signal is raised by the rise of the system clock. Receiving the rise of the pixel processing clock signal, the context generator 2 reads a context for the fourth target encoding pixel from the storage device 1 and outputs the read context to the reading address input nodes AR of the context table storage device 4.

The code 4 in FIG. 11C indicates that a context has been generated by the context generator 2 for the fourth target encoding pixel.

In the context table storage device 4, a 32-bit storing data is read out according to the context inputted into the reading address input nodes AR, and outputted from the data output nodes DO to the arithmetic calculator 7.

On the other hand, since one renormalization processing is performed in the above-mentioned mode II, when the controller 13 has therefore, receives "1" indicating "carrying out a normalization processing" from the renormalize generator 82 in the A register 8, and "1" indicating "normalization will be completed after one more normalization processing" from the last renormalization generator 83 in the A register 8, in the period T₄ of the first clock of the system clock in the mode III. Accordingly, the controller 13 obtains a renormalizing signal and a last renormalizing signal, both "H" level, in the period T₄, respectively, as shown in FIG. 11E and FIG. 11F. Also the controller 13 generates a shift-up selection signal which rises in response to the rise of the system clock as shown in FIG. 11I.

When the shift-up selection signal rises, receiving a shift-up selection signal indicating "normalization will be completed by the last one normalization processing", the A selector 9 selects the data obtained by shifting up the A data from the A register 8 by one bit, and also outputs it to the arithmetic calculator 7.

Similarly, receiving the shift-up selection signal, the C selector 11 selects the data obtained by shifting up the C data from the C register 10 by one bit, and outputs it to the arithmetic calculator 7.

In other words, the A data and the C data latched in the A register 8 and the C register 10 respectively in the mode II are shifted-up by one bit in this period T₄.

The A data latched in the A register 8 and the C data latched in the C register 10 in this period T₄ are resultants calculated in the mode II (,period T₃) by the arithmetic calculator 7. In other words, since the renormalizing signal and also the last renormalizing signal become "H" level in the period T₄, a renormalizing clock signal becomes "H" level. Therefore, the contents stored in the A register 8 and the C register 10 are not shifted-up and kept unchanged. This state is shown in FIG 11L. The code 3 in FIG. 11L indicates that the A register 8 and the C register 10 are latched for the third target encoding pixel.

In the prediction conversion signal generator 71 in the arithmetic calculator 7 (ref. FIG. 7), a prediction symbol of the storing data and a picture data of the target encoding pixel are compared to generate a prediction conversion signal.

When this prediction conversion signal indicates that the prediction symbol matches with the picture data (indicates the MPS), the calculator 73 calculates an A data from an LSZ data from the context table storage device 4 and the A data of the third pixels to be encoded, namely, the data A which is shifted-up by one bit, according to the above-mentioned equation (1). The calculated A data is outputted to the A register 8. The C data of the third pixels to be encoded, namely, the C data shifted-up by one bit, is outputted to the C register 10, according to the above-mentioned equation (2).

When this prediction conversion signal indicates that the prediction symbol does not match with the picture data (indicates the LPS), the calculator 73 outputs the LSZ data from the context table storage device 4 to the A register 8 as an A data, according to the above-mentioned equation (3). The calculator 73 further calculates a C data from the LSZ data from the context table storage device 4 and both A and C data of the third pixels to be encoded, namely, the A data and the C data shifted-up by one bit, respectively, according to the above-mentioned equation (4). The calculated C data is outputted to the C register 10.

The concept of an A data and a C data at this stage is explained using the bar graph for the fourth target encoding pixel shown in FIG. 12. The bar graph for this fourth target encoding pixel indicates that a picture data does not match with a prediction symbol. The contents stored in the A register 8 for the third target encoding pixel corresponds to the width of the effective area of the MPS which is the same MPS as that explained in the mode II in the period T₃. The contents shifted-up by one bit (two times) corresponds to the substantial width of the effective area.

The contents stored in the C register 10 for the third target encoding pixel has a value corresponding to the bottom of the MPS which is the same MPS as that explained in the mode II in the period T₃. The contents shifted-up by one bit corresponds to the substantial width of the effective area.

The width of the LPS corresponds to the value of the LSZ data of a storing data for the fourth target encoding pixel. The width of the MPS corresponds to the value calculated by subtracting the width of the LPS from the value which is obtained by shifting up the contents stored in the A register 8 by one bit, and the width of the LPS corresponds to the width of the effective area for the fourth target encoding pixel.

In other words, the A data calculated and outputted by the calculator 73 has a value corresponding to the width of the LPS, and the C data calculated and outputted by the calculator 73 has a value corresponding to the bottom of the effective area, namely, a value corresponding to the bottom of the LPS.

The A data and the C data calculated by the calculator 73 in this way are inputted to the register portion 81 of the A register 8 (ref. FIG. 8) and to the C register 10 (ref. FIG. 9), respectively, and stored therein (renewal of the stored contents) at the rising edge of a pixel processing clock signal from the controller 13 (period T₅).

In this period T₄, since the mode II requires one renormalization processing, the controller 13 receives "1" indicating "carrying out a normalization processing" from the renormalization generator 82 in the A register 8. On this account, the controller 13 outputs a renewal clock signal, by receiving the rising edge of the system clock as shown in FIG. 11G.

Receiving the fall of the renewal clock signal, the context table storage device 4 writes and stores a renewal data on the context table storage portion at the address based on the context which is received in the writing address input nodes AW from the context storage device 3, namely, the context of the third target encoding pixel in the mode II.

This renewal data consists of a prediction symbol from the arithmetic calculator 7, and a probability estimation data (LSZ data, NLPS data, NMPS data and SWITCH data) read-out from the probability estimating table storage device 5 according to a probability estimation index, which indicates a status number from the arithmetic calculator 7. Accordingly, a renewal data from the arithmetic calculator 7 is explained with regard to a prediction symbol and a probability estimation index, respectively.

First, a prediction symbol as a renewal data is explained below.

The prediction symbol generated by the prediction symbol/probability estimation index generator (renewal data generator) 72 has the same value as that of the prediction symbol of the prediction/index data for the third target encoding pixel, regardless of the SWITCH data of the probability estimating data for the third target encoding pixel, when a prediction conversion signal from the prediction conversion signal generator 71 indicates that a prediction symbol matches with a picture data (indicates the MPS).

When the prediction conversion signal indicates that the prediction symbol does not match with the picture data (indicates the LPS), the prediction symbol becomes the same value obtained by inverting the value of the prediction symbol of the prediction/index data for the third target encoding pixel, if the SWITCH data of the probability estimating data for the third target encoding pixel is "1". The prediction symbol becomes the same value as that of the prediction symbol of the prediction/index data for the third target encoding pixel, if the SWITCH data is "0".

On the other hand, a probability estimating data as a renewal data is explained below. A probability estimation index (a status number) generated by the prediction symbol/ probability estimation index generator 72 in the arithmetic calculator 7 becomes an NMPS data of the probability estimating data for the third target encoding pixel, when a prediction conversion signal from the prediction conversion signal generator 71 indicates the MPS. This probability estimation index becomes an NLPS data of the probability estimating data for the third target encoding pixel, when a prediction conversion signal indicates the LPS.

The renewal data generated in this manner by the arithmetic calculator 7 is inputted to the address input node A of the probability estimating table storage device 5.

Receiving the probability estimation index, the probability estimating table storage device 5 outputs a probability estimating data consisting of LSZ data, NLPS data, NMPS data and SWITCH data, all of which correspond to the received probability estimation index, to the context table storage device 4 according to the probability estimating table shown in FIG. 6.

In this way, the renewal data consisting of the prediction symbol from the arithmetic calculator 7 and the probability estimating data from the probability estimating table storage device 5 is written in the context table storage portion in the context table storage device 4 at the address which is based on the context for the third target encoding pixel.

For example, in a context table shown in FIG. 3A, it is assumed that the address of the context for the third target encoding pixel is "0000000101". The storing data stored in the context table storage portion at the address based on that context consists of the prediction value (prediction symbol) "0", the LSZ data "0x5a7f", the NLPS data "15" (in decimal number, although it is actually represented in binary number), the NMPS data "15" (in decimal number, although it is actually represented in binary number) and the switch data "1".

This storing data is read out and given to the arithmetic calculator 7.

At this stage, the prediction conversion signal from the prediction conversion signal generator 71 for the third target encoding pixel indicates the MPS. Accordingly, even if the SWITCH data of the probability estimating data is "1", the prediction symbol from the prediction symbol/probability estimation index generator 72 becomes the same value as the prediction value of the storing data for the third target encoding pixel, namely, "0".

This value is given as a prediction symbol MPSUP of a renewal data for the context table storage device 4.

The probability estimating index from the prediction symbol/probability estimation index generator 72 becomes the same value as that of the MNPS, namely "0001111" ("15" in decimal number).

This value is an address which is inputted to the input node A of the probability estimating table 5.

Receiving this probability estimation index "0001111", the probability estimating table storage device 5 outputs a probability estimating data which corresponds to the address "0001111" (status number) in the probability estimating table shown in FIG. 6, namely the LSZ data "0x3f25", the NLPS data "36" (in decimal number, although it is actually represented in binary number), the NMPS data "16" (in decimal number, although it is actually represented in binary number), and the SWITCH data "0" for example, to the context table storage device 4 as a probability estimating data of a renewal data.

These values are given to the context table storage device 4 as a renewal data. As shown in the updated context table of FIG. 3B, in the context table storage device 4, the prediction value (prediction symbol) "0", the LSZ data "0x3f25", the NLPS data "36" (in decimal number, although it is actually represented in binary number), the NMPS data "16" (in decimal number, although it is actually represented in binary number), and the SWITCH data "0" are written at the address based on the context "0000000101" for the third target encoding pixel.

Accordingly, in the period $T_4$ in this mode III, the procedures from a context generation to the arithmetic calculation for the fourth target encoding pixel, and a renormalization processing for the third target encoding pixel are carried out in one clock of the system clock (a cycle). In other words, the storing data in the context table storage device 4 is updated and the A data latched in the A register 8 and the C data latched in the C register 10 are respectively shifted-up by one bit in one clock of the system clock (a cycle).

Furthermore, the time spared for this one system clock substantially equals to the sum of the accessing time of the context table storage device 4 and that of the arithmetic calculator 7. This shortens the period of system clock, contributing to the high-speed processing.

The time necessary for renewing the context table storage device 4 substantially equals to the accessing time to the probability estimating table storage device 5, which is shorter than the time necessary for the procedures from the context generation to the arithmetic calculation.

Since this mode III shows an example in which three renormalization processing are required, the A data which is the resultant calculated by the arithmetic calculator 7, and taken into the register portion 81 of the A register 8 in the period $T_5$, becomes a value more than 0.0625 and less than 0.125 in decimal number. Accordingly, the value of most the significant bit becomes "0", and the value which is one bit lower from the most significant bit becomes "0".

Accordingly, a renormalizing signal "1" indicating "carrying out a normalization processing" is outputted from the renormalization generator 82 in the A register 8. As shown in FIG. 11E, the controller 13 therefore obtains an "H" level renormalizing signal in the period $T_5$.

The last renormalization generator 83 in the A register 8 outputs a last renormalizing signal "0" indicating "normalization will not be completed after one more normalization processing". An "L" level last renormalizing signal is obtained in the controller 13 in the period $T_5$, as shown in FIG. 11F.

Receiving a context of the fifth pixel from the context generator 2 and a context of the fourth target encoding pixel from the context storage device 3, the context comparison means 6 outputs an "L "level identical context signal indicating that "the contexts do not match with each other" during the period $T_5$ as shown in FIG. 11D.

Accordingly, the mode III is recognized in this period $T_5$, in which the contexts are not identical and at least one renormalization processing has to be performed.

By this recognition, a renormalization processing is performed in the period $T_5$ shown in FIGS. 11A–L. In other words, the storing data in the context table storage device 4 is updated, and the A data in the A register 8 and the C data in the C register 10 are respectively shifted-up one bit.

As mentioned above, in this period $T_5$, at the rise of a pixel clock signal triggered by the rise of a system clock, the A data and the C data calculated for the fourth target encoding pixel are taken into the A register 8 and to the C register 10 respectively and latched therein. Receiving the rise of the pixel processing clock signal, the context generator 2 reads the context for the fifth target encoding pixel from the storage device 1 and outputs the read context to the reading address input nodes AR in the context table storage device 4 and to the context storage device 3.

The pixel processing clock signal however, maintains "H" level during this period $T_5$, since the renormalization generator 82 of the A register 8 outputs "1" indicating "carrying out a normalization processing" and the last renormalization generator 83 of the A register 8 outputs "0" indicating "normalization processing will not complete after one more normalization processing". As a result, the A register 8 and the C register 10 update none of the contents stored therein. The A data and the C data calculated for the fourth target encoding pixel remain to be latched in the A register 8 and the C register 10, respectively.

On the other hand, when the controller 13 receives "1" indicating "carrying out a normalization processing" from the renormalization generator 82 of the A register 8, the renormalizing clock signal generator is set, and the controller 13 therefore, outputs a renormalizing clock signal in synchronization with the system clock signal.

Receiving the fall of this renormalizing clock signal, the A register 8 and the C register 10 shift up the A data and the C data by one bit, which are calculated by the arithmetic calculator 7 in the period $T_4$ for the fourth target encoding pixel, respectively, and latch them again.

Since the controller 13 receives "1" indicating "carrying out a normalization processing" from the renormalization generator 82 in the A register 8, the controller 13 outputs a renewal clock signal in synchronization with the system clock as shown in FIG. 11G.

Receiving the fall of the renewal clock signal, the context table storage device 4 writes and stores a renewal data comprising a prediction symbol from the arithmetic calculator 7 and a probability estimating data from the probability estimating table storage device 5 on the context table storage portion at the address based on the context from the context storage device 3, which is received in the writing address input nodes AW, namely, the context of the fourth target encoding pixel.

In this period $T_5$, the A data stored in the register portion 81 of the A register 8 has a value more than 0.125 and less than 0.25 in decimal number because it has been shifted-up by one bit. The value of the most significant bit is, however "0", and the value which is one bit lower from the most significant bit is "0".

Accordingly, the renormalization generator 82 in the A register 8 outputs a renormalizing signal "1" indicating "carrying out a normalization processing", therefore, an "H" level renormalizing signal is obtained in the controller 13 in the period $T_6$, as shown in FIG. 11E.

The last renormalization generator 83 in the A register 8 outputs a last renormalizing signal "0" indicating "normalization will not be completed after one more normalization processing". An "L" level last renormalizing signal is obtained in the controller 13 in the period $T_6$, as shown in FIG. 11F.

This means that in the next period $T_6$, the A data and the C data latched in the A register 8 and the C register 10 respectively are shifted-up by one bit in a renormalization processing.

Accordingly in the period $T_6$, when the controller 13 receives "0" indicating "normalization processing will not complete after one more normalization processing" from the last renormalization generator 83 of the A register 8, the renormalizing clock signal generator in the controller 13 is not reset, and the controller 13 therefore outputs a renormalizing clock signal in synchronization with the system clock signal.

Receiving the fall of this renormalizing clock signal, the A register 8 and the C register 10 shift up the A data and the C data by one bit, which are shifted-up by one bit in the period $T_5$, respectively, and latch them again.

Since the last renormalization generator 83 outputs "0" indicating "normalization processing will not complete after one more normalization processing", the pixel processing clock signal maintains "H" level even in this period $T_6$. Accordingly, the controller 13 maintains the renewal clock signal at "H" level as shown in FIG. 11G. As a result, the contents stored in the context table storage device 4 is not updated.

In this period $T_6$, the A data stored in the register portion 81 of the A register 8 has a value more than 0.25 and less than 0.5 in decimal number, because it has been shifted-up by one bit. The value of the most significant bit is, however "0", and the value which is one bit lower from the most significant bit is "1".

Accordingly, the renormalization generator 82 in the A register 8 outputs a renormalizing signal "1" indicating "carrying out a normalization processing", therefore, an "H" level renormalizing signal is obtained in the controller 13 in the period $T_7$, as shown in FIG. 11E.

The last renormalization generator 83 in the A register 8 outputs a last renormalizing signal "1" indicating "normalization will be completed after one more normalization processing". An "H" level last renormalizing signal is obtained in the controller 13 in the period $T_7$, as shown in FIG. 11F.

This means that in the next period $T_7$, the A data and the C data latched in the A register 8 and the C register 10 respectively, are shifted-up by one bit in a renormalization processing. This also means that the mode III is completed by the last one normalizing processing.

In other words, the last renormalization generator 83 in the A register 8 outputs "1" indicating "normalization will be completed after one more normalization processing". In the same manner as the operation in the mode II, the renormalization processing can be performed, at the first clock of the system clock in which an encoding processing for the next target encoding pixel is performed, namely, the period $T_7$ in the mode IV shown in FIGS. 11A~L.

This renormalization processing will be explained more in detail in the following explanation on the operation in the mode IV.

Accordingly, in the mode III, for the renormalization processing which are required for three times, the procedures from a context generation to the arithmetic calculation for the target encoding pixel take only one clock time (one cycle) of the system clock to carry out. The A data and the C data calculated by the arithmetic calculator 7, are stored in the A register 8 and the C register 10, respectively. The two renormalization processing need two clocks of the system clock to carry out. The last one renormalization processing is performed in the first clock of the system clock in which an encoding processing for the next target encoding pixel is performed.

As a result, substantial operating time in the mode III needs only three clocks of the system clock. Furthermore, the one clock should last as long as the procedures from the context generation and the arithmetic operation by the arithmetic calculator 7 is completed. In other words, the time spared for this one system clock substantially equals to the sum of the accessing time of the context table storage device 4 and that of the arithmetic calculator 7. This shortens the period of system clock, contributing to the high-speed processing.

In the period $T_4$~$T_6$, since the controller 13 maintains the renormalizing clock signal at "H" level, the CT count clock signal is maintained to the same clock signal as the system clock shown in FIG. 11J. Since the CT count clock signal lasts, however, during three clocks, the code output clock signal from the controller 13 remains "H" level. Accordingly, the output means 12 neither takes-in nor outputs the contents stored in the C register 10.

[mode IV]

FIG. 11A shows an example of major signal waveforms in the mode IV in the period of $T_7$~$T_8$ of the system clock signal.

It is assumed that an encoding processing has been done for the fifth target encoding pixel in the mode IV.

In the period $T_7$, the context generator 2 has already (in period $T_5$) read the context for the fifth target encoding pixel from the storage device 1 and has outputted the read context to the reading address input nodes AR of the context table storage device 4.

The code 5 in FIG. 11C shows that a context has been generated by the context generator 2 for the fifth target encoding pixel.

In the context table storage device 4, a 32-bit storing data is read out according 8á13, 1996 to the context inputted into the reading address input nodes AR. A storing data is outputted from the data output nodes DO to the arithmetic calculator 7.

On the other hand, since one renormalization processing is performed in the above-mentioned mode III in the period $T_6$, when the controller 13 has therefore, receives "1" indicating "carrying out a normalization processing" from the renormalize generator 82 in the A register 8 and "1" indicating "normalization will be completed after one more normalization processing" from the last renormalization generator 83 in the A register 8, in the period $T_7$ of the first clock of the system clock in the mode IV, the controller 13 obtains a renormalizing signal and a last renormalizing signal, both "H" level, in the period $T_7$, respectively, as shown in FIG. 11E and F. Also the controller 13 generates a shift-up selection signal which rises in response to the rise of the system clock as shown in FIG. 11L.

When the shift-up selection signal rises, receiving a shift-up selection signal indicating "normalization will be completed by the last one normalization processing", the A selector 9 selects the data obtained by shifting up the A data from the A register 8 by one bit, and then outputs it to the arithmetic calculator 7.

Similarly, receiving the shift-up selection signal, the C selector 11 selects the data obtained by shifting up the C data from the C register 10 by one bit, and outputs it to the arithmetic calculator 7.

In other words, the processing performed in this period $T_7$ is the same as the "shift-up" processing in the mode III in which the A data and the C data latched in the A register 8 and in the C register 10 respectively are shifted-up by one bit. As a result, three renormalization processing are performed in the mode III during the period $T_5$~$T_7$. The A data and the C data therefore outputted from the A selector 9 and from the C selector 11 respectively are those A data and C data which becomes eight times as large as the original A data and C data. In other words the A data and the C data calculated for the fourth target encoding pixel in the period $T_4$ in the mode III are shifted-up by three bits.

In the prediction conversion signal generator 71 in the arithmetic calculator 7 (ref. FIG. 7), a prediction symbol of the storing data and a picture data for a target encoding pixel are compared to generate a prediction conversion signal.

When this prediction conversion signal indicates that the prediction symbol matches with the picture data (indicates MPS), the calculator 73 in the arithmetic calculator 7 calculates an A data, from the LSZ data of a storing data from the context table storage device 4 and the A data of the fourth target encoding pixel, namely, the A data which is obtained by shifting up the A data calculated for the fourth target encoding pixel by three bits, according to the above-mentioned equation (1), and outputs the calculated A data to the A register 8. According to the above-mentioned equation (2), the calculator 73 outputs the C data of the fourth target encoding pixel, namely, the C data which is obtained by shifting up the C data calculated for the fourth target encoding pixel by three bits, to the C register 10.

When this prediction conversion signal indicates the prediction symbol does not match with the picture data (indicates the LPS), the calculator 73 outputs the LSZ data of a storing data to the A register 8 as an A data according to the above-mentioned equation (3). According to the above-mentioned equation (4), the calculator 73 calculates the C data from the LSZ data of a storing data, and both the A data and the C data calculated for the fourth target encoding pixel, namely, those obtained by shifting up the A data and the C data which are calculated for the fourth target encoding pixel by three bits. The calculated C data is outputted to the C register 10.

The concept of an A data and a C data at this stage is explained using the bar graph for the fifth target encoding pixel shown in FIG. 12. The bar graph for this fifth target encoding pixel indicates that a picture data does not match with a prediction symbol.

The contents stored in the A register 8 for the fourth target encoding pixel corresponds to the width of the effective area of the LPS which is the same LPS as that explained in the mode III in the period $T_6$ (the value obtained by shifting up the A data calculated for the fourth target encoding pixel by two bits). The state that the contents stored in the A register 8 has been shifted-up by one bit corresponds to the substantial width of the effective area of the LPS.

The width of the LPS corresponds to the value of LSZ data of a storing data for the fifth target encoding pixel. The width of the MPS corresponds to the value calculated by subtracting the width of the LPS from the value obtained by shifting up the contents stored in the A register 8 by one bit. The width of the LPS corresponds to the width of the effective area for the fifth target encoding pixel.

In other words, the A data calculated and outputted by the calculator 73 has a value corresponding to the width of the LPS. The C data calculated and outputted by the calculator 73 has a value corresponding to the bottom of the effective area, namely, a value corresponding to the bottom of the LPS.

The A data and the C data calculated by the calculator 73 in this way are inputted to the register portion 81 of the A register 8 (ref. FIG. 8) and to the C register 10 (ref. FIG. 9) respectively, and stored therein (the stored contents in each register has been updated) at the rising edge of a pixel processing clock signal from the controller 13 (period $T_8$).

Although the controller 13 receives "1" indicating "carrying out a normalization processing" from the renormalization generator 82 of the A register 8, the contents stored in the context table storage device 4 is not updated because the renewal clock signal maintains "H" level in the period $T_7$.

Accordingly, in the period $T_7$ in the mode IV, the procedures from a context generation to the arithmetic calculation for the fifth target encoding pixel, and a last renormalization processing for the fourth target encoding pixel are carded out within one clock of the system clock (a cycle). In other words, the processing which shifts-up the A data and the C data latched in the A register 8 and the C register 10, respectively, by one bit, are carried out within one clock of the system clock (one cycle). Furthermore, the time spared for this one system clock substantially equals to the sum of the accessing time of the context table storage device 4 and that of the arithmetic calculator 7. This shortens the period of system clock, contributing to the high-speed processing.

Since this mode IV shows an example in which one renormalization processing is required, the A data stored in the register portion 81 of the A register 8, has a value more than 0.25 and less than 0.5 in decimal number. Accordingly, the value of its most significant bit becomes "0", and the value which is one bit lower from the most significant bit becomes "1".

Accordingly, a renormalizing signal "1" indicating "carrying out a normalization processing" is outputted from the renormalization generator 82. As shown in FIG. 11E, the controller 13 obtains an "H" level renormalizing signal in the period $T_8$.

The last renormalization generator 83 in the A register 8 outputs a last renormalizing signal "1" indicating "normalization will be completed after one more o normalization processing". An "H" level last renormalizing signal is obtained in the controller 13 in the period $T_8$, as shown in FIG. 11F.

Receiving a context of the sixth pixel from the context generator 2 and a context of the fifth target encoding pixel from the context storage device 3, the context comparison means 6 outputs an "H" level identical context signal indicating "the contexts match with each other" during the period $T_8$ as shown in FIG. 11D.

Accordingly, the mode W is recognized in this period $T_8$ in which the contexts are identical and one renormalization processing has to be performed.

By this recognition, a renormalization processing is performed in the period $T_8$ shown in FIGS. 11A–L. In other words, the storing data in the context table storage device 4 is updated, and the A data in the A register 8 and the C data in the C register 10 are respectively shifted-up one bit.

As mentioned above, in this period $T_8$, at the rise of a pixel clock signal triggered by the rise of a system clock, the A data and the C data calculated for the fifth target encoding pixel are taken into the A register 8 and to the C register 10 respectively and latched therein.

Receiving the rise of the pixel processing clock signal, the context generator 2 reads the context for the sixth target encoding pixel from the storage device 1 and outputs the read context to the reading address input nodes AR in the context table storage device 4 and to the context storage device 3.

The pixel processing clock signal however, maintains "H" level in this period $T_8$, since the renormalization generator 82 of the A register 8 outputs "1" indicating "carrying out a normalization processing", the last renormalization generator 83 of the A register 8 outputs "1" indicating "normalization processing will be completed after one more normalization processing", and the identical context signal from the context comparison means 6 shows that contexts are identical. The pixel processing clock signal maintains the "H" level during the period $T_8$.

As a result, the contents stored in the A register 8 and in the C register 10 are not updated. The A data and the C data calculated for the fifth target encoding pixel remains to be latched in the A register 8 and in the C register 10.

On the other hand, when the controller 13 receives "1" indicating "carrying out a normalization processing" from the renormalization generator 82 of the A register 8, the renormalizing clock signal generator is set, and the controller 13 therefore, outputs a renormalizing clock signal in synchronization with the system clock signal.

Receiving the fall of this renormalizing clock signal, the A register 8 and the C register 10 shift up the A data and the C data by one bit, which are calculated by the arithmetic calculator 7 in the period $T_8$ for the fifth target encoding pixel, respectively, and latch them again.

Since the controller 13 receives "1" indicating "carrying out a normalization processing" from the renormalization generator 82 in the A register 8, the controller 13 outputs a renewal clock signal in synchronization with the system clock as shown in FIG. 11G, when it receives the rise of the pixel processing clock signal.

Receiving the fall of the renewal clock signal, the context table storage device 4 writes and stores a renewal data comprising a prediction symbol from the arithmetic calculator 7 and a probability estimating data from the probability estimating table storage device 5 on the context table storage portion at the address based on the context from the context storage device 3, which is received in the writing address input nodes AW, namely, the context of the fifth target encoding pixel, in the same manner as mentioned in the period $T_4$.

In this period $T_8$, the A data stored in the register portion 81 of the A register 8 has a value more than 0.5 in decimal number, since it has been shifted-up by one bit. Accordingly, the value of the most significant bit becomes "1".

Accordingly, the renormalization generator 82 in the A register 8 outputs a renormalizing signal "0" indicating "not carrying out a normalization processing", therefore, an "L" level renormalizing signal is obtained in the controller 13 in the period $T_9$, as shown in FIG. 11E.

The last renormalization generator 83 in the A register 8 outputs a last renormalizing signal "0" indicating "normalization will not be completed after one more normalization processing". An "L" level last renormalizing signal is obtained in the controller 13 in the period $T_9$, as shown in FIG. 11F.

Accordingly, in the mode IV, it is meant that the renormalization processing has been already completed. In the mode IV, for the renormalization processing which is required for once, the procedures from a context generation to the arithmetic calculation for the target encoding pixel take only one clock time (one cycle) of the system clock to carry out. The A data and the C data calculated by the arithmetic calculator 7, are stored in the A register 8 and the C register 10, respectively. One renormalization processing takes one clock of the system clock to carry out.

As a result, substantial operating time in the mode IV need only two clocks of the system clock. Furthermore, the one clock should last as long as the procedures from the context generation and the arithmetic operation by the arithmetic calculator 7 is completed. In other words, the time spared for this one system clock substantially equals to the sum of the accessing time of the context table storage device 4 and that of the arithmetic calculator 7. This shortens the period of system clock, contributing to the high-speed processing.

In the period $T_7$-$T_8$, the renormalizing signal shown in FIG. 11E is "H" level. The controller 13 therefore, makes the CT count clock signal the same clock signal as the system clock signal as shown in FIG. 11J. However, since the CT count clock holds two clocks and the total number of the clocks accumulated from the mode IV is 5, the code output clock signal from the controller 13 remains "H" level. Accordingly, the output means 12 neither takes-in nor outputs the contents stored in the C register 11.

[mode V]

FIG. 11A shows an example of major signal waveforms in the mode V in the period of $T_9$-$T_{13}$ of the system clock signal. It is assumed that an encoding processing has been done for the sixth target encoding pixel in the mode V.

In the period $T_9$, the context generator 2 has already read (in period $T_8$) the context for the sixth target encoding pixel from the storage device 1 and has outputted the read context to the reading address input nodes AR of the context table storage device 4.

The code 6 in FIG. 11C shows that a context has been generated by the context generator 2 for the sixth target encoding pixel.

In the context table storage device 4, a 32-bit storing data is read out according to the context inputted into the reading address input nodes AR, and outputted from the data output nodes DO to the arithmetic calculator 7.

On the other hand, since the processing has been already completed in the above-mentioned mode W in the period $T_8$, the controller 13 obtains a renormalizing signal of "L" level, and a last renormalizing signal, as shown in FIG. 11E and F respectively, and no renormalization processing is performed.

In the period $T_8$, since the pixel processing clock signal maintains "H" level, the pixel processing clock signal remains "H" level, even if the system clock rises in the period $T_9$. The A data and the C data latched in the register 8 and in the C register 10 are obtained by shifting up the A data and the C data which have been latched in the period $T_5$ by one bit, namely those A data and the C data calculated for the fifth target encoding pixel in the period $T_7$ which have been latched in the period $T_8$.

In the prediction conversion signal generator 71 in the arithmetic calculator 7 (ref. FIG. 7), a prediction symbol of the storing data and a picture data for a target encoding pixel are compared to generate a prediction conversion signal.

When this prediction conversion signal indicates that the prediction symbol matches with the picture data (indicates the MPS), the calculator 73 calculates an A data from an LSZ data of a storing data from the context table storage device 4 and the A data of the fifth pixels to be encoded, namely, the A data shifted-up by one bit, according to the above-mentioned equation (1). The calculated A data is outputted to the A register 8. The C data of the fifth pixels to be encoded, namely, the C data shifted-up by one bit, is outputted to the C register 10, according to the above-mentioned equation (2).

When this prediction conversion signal indicates that the prediction symbol does not match with the picture data (indicates the LPS), the calculator 73 outputs the LSZ data from the context table storage device 4 to the A register 8 as an A data, according to the above-mentioned equation (3). The calculator 73 further calculates a C data from the LSZ data of a storing data and both A and C data of the fifth pixels to be encoded, namely, the A data and the C data shifted-up by one bit, respectively, according to the above-mentioned equation (4). The calculated C data is outputted to the C register 10.

The A data and the C data calculated by the calculator 73 in this way are inputted to the register portion 81 of the A register 8 (ref. FIG. 8) and to the C register 10 (ref. FIG. 9) respectively, and stored therein (the stored contents in each register has been updated) at the rising edge of a pixel processing clock signal from the controller 13 (period $T_{10}$).

On the other hand, since the renewal clock signal from the controller 13 maintains "H" level as shown in FIG. 11 G, the contents stored in the context table storage device 4 is not updated.

Since this mode V shows an example in which five renormalization processing are required, the A data stored in the register portion 81 of the A register 8, has a value more than 0.15625 and less than 0.03125 in decimal number. Accordingly, the value of its most significant bit becomes "0", and the value which is one bit lower from the most significant bit becomes "0".

Accordingly, a renormalizing signal "1" indicating "carrying out a normalization processing" is outputted from the renormalization generator 82 in the A register 8. As shown in FIG. 11E, the controller 13 obtains an "H" level renormalizing signal in the period $T_{10}$.

The last renormalization generator 83 in the A register 8 outputs a last renormalizing signal "0" indicating "normalization will not be completed after one more normalization processing". An "L" level last renormalizing signal is obtained in the controller 13 in the period $T_{10}$, as shown in FIG. 11F.

Receiving a context of the seventh pixel from the context generator 2 and a context of the sixth target encoding pixel from the context storage device 3, the context comparison means 6 outputs an "H" level identical context signal indicating that "the contexts match with each other" during the period $T_{10}$ as shown in FIG. 11D.

Accordingly, the mode V is recognized in this period $T_{10}$ in which the contexts are not identical and two renormalization processing have to be performed.

By this recognition, a renormalization processing is performed in the period $T_{10}$ shown in FIGS. 11A-L. In other words, the prediction/index data in the context table storage device 4 is updated, and the A data in the A register 8 and the C data in the C register 10 are respectively shifted-up by one bit.

As mentioned above, in this period $T_{10}$, at the rise of a pixel clock signal triggered by the rise of a system clock, the A data and the C data calculated for the sixth target encoding pixel are inputted to the A register 8 and to the C register 10 respectively and latched therein.

Receiving the rise of the pixel processing clock signal, the context generator 2 reads the context for the seventh target encoding pixel from the storage device 1 and outputs the read context to the reading address input nodes AR in the context table storage device 4 and to the context storage device 3.

The pixel processing clock signal however, maintains "H" level during this period $T_{10}$, since the renormalization generator 82 of the A register 8 outputs "1" indicating "carrying out a normalization processing" and the last renormalization generator 83 of the A register 8 outputs "0" indicating "normalization processing will not complete after one more normalization processing". As a result, the A register 8 and the C register 10 shift none of the contents stored therein. The A data and the C data calculated for the sixth target encoding pixel remains to be latched in the A register 8 and the C register 10, respectively.

On the other hand, when the controller 13 receives "1" indicating "carrying out a normalization processing" from the renormalization generator 82 of the A register 8, the renormalizing clock signal generator is set, and the controller 13 therefore, outputs a renormalizing clock signal in synchronization with the system clock signal.

Receiving the fall of this renormalizing clock signal, the A register 8 and the C register 10 shift up the A data and the C data by one bit, which are calculated by the arithmetic calculator 7 in the period $T_9$ for the sixth target encoding pixel, respectively, and latch them again.

Since the controller 13 receives "1" indicating "carrying out a normalization processing" from the renormalization generator 82 in the A register 8, the controller 13 outputs a renewal clock signal in synchronization with the system clock as shown in FIG. 11G, when it receives the rise of the pixel processing clock.

Receiving the fall of the renewal clock signal, the context table storage device 4 writes and stores a renewal data comprising a prediction symbol from the arithmetic calculator 7 and a probability estimating data from the probability estimating table storage device 5 on the context table storage portion at the address based on the context from the context storage device 3, which is received in the writing address input nodes AW, namely, the context of the sixth target encoding pixel in this mode V, in the same manner as mentioned in the period $T_4$.

In this period $T_{10}$, the A data stored in the register portion 81 of the A register 8 has a value more than 0.03125 and less than "0.0625" in decimal number because it has been shifted-up by one bit. The value of the most significant bit is however "0", and the value which is one bit lower from the most significant bit is "0".

Accordingly, the renormalization generator 82 in the A register 8 outputs a renormalizing signal "1" indicating "carrying out a normalization processing", therefore, an "H" level renormalizing signal is obtained in the controller 13 in the period $T_{11}$, as shown in FIG. 11E.

The last renormalization generator 83 in the A register 8 outputs a last renormalizing signal "0" indicating "normalization will not be completed after one more normalization processing". An "L" level last renormalizing signal is obtained in the controller 13 in the period $T_{11}$, as shown in FIG. 11F.

This means that in the period $T_{11}$, the A data and the C data latched in the A register 8 and the C register 10 respectively are shifted-up by one bit in a renormalization processing.

Accordingly in the period $T_{11}$, when the controller 13 receives "0" indicating "normalization processing will not complete after one more normalization processing" from the last renormalization generator 83 of the A register 8, the renormalizing clock signal generator in the controller 13 is not reset, the controller 13 therefore outputs a renormalizing clock signal in synchronization with the system clock signal.

Receiving the fall of this renormalizing clock signal, the A register 8 and the C register 10 shift up the A data and the C data by one bit, which are shifted-up by one bit in the period $T_{10}$, respectively, and latch them again.

Since the controller 13 maintains the renewal clock signal at "H" level in this period $T_{11}$, the contents stored in the context table storage device 4 is not updated.

In this period $T_{11}$, the A data stored in the register portion 81 of the A register 8 has a value more than "0.0625" and less than 0.125 in decimal number, because it has been shifted-up by one bit. The value of the most significant bit is however "0", and the value which is one bit lower from the most significant bit is also "0".

Accordingly, a renormalizing signal "1" indicating "carrying out a normalization processing" is outputted from the renormalization generator 82 in the A register 8. An "H" level renormalizing signal is obtained in the controller 13 in the period $T_{12}$, as shown in FIG. 11E.

A last renormalizing signal "0" indicating "normalization will not be completed after one more normalization processing" is outputted from the last renormalization generator 83 in the A register 8. An "L" level last renormalizing signal is obtained in the controller 13 in the period $T_{12}$, as shown in FIG. 11F.

This means that in the period $T_{12}$, the A data and the C data latched in the A register 8 and the C register 10 respectively are shifted-up by one bit in a renormalization processing.

Accordingly in the period $T_{12}$, the renormalizing clock signal generator in the controller 13 is not reset because the controller 13 has received "0" indicating "normalization processing will not complete after one more normalization processing" from the last renormalization generator 83 in the A register 8. The controller 13 therefore, outputs a renormalizing clock signal in synchronization with the system clock signal.

When the fall of this renormalizing clock signal is received by the A register 8 and the C register 10, the A data and C data latched therein, namely, the A data and C data already shifted-up by one bit in the period $T_{11}$, are again shifted-up by one bit, and latched again in the A register 8 and the C register 10 respectively.

Since the controller 13 maintains the renewal clock signal at "H" level in this period $T_{12}$ as shown in FIG. 11G, the contents stored in the context table storage device 4 is not updated.

In this period $T_{12}$, the A data stored in the register portion 81 of the A register 8 has a value more than "0.0625" and less than 0.125 in decimal number, because it has been shifted-up by one bit. The value of the most significant bit is however "0", and the value which is one bit lower from the most significant bit is also "0".

Accordingly, a renormalizing signal "1" indicating "carrying out a normalization processing" is outputted from the renormalization generator 82 in the A register 8. An "H" level renormalizing signal is obtained in the controller 13 in the period $T_{13}$, as shown in FIG. 11E.

A last renormalizing signal "0" indicating "normalization will not be completed after one more normalization processing" is outputted from the last renormalization generator 83 in the A register 8. An "L" level 1 last renormalizing signal is obtained in the controller 13 in the period $T_{13}$ as shown in FIG. 11F.

This means that in the period $T_{13}$, the A data and the C data latched in the A register 8 and the C register 10 respectively, are shifted-up by one bit in a renormalization processing.

Accordingly in the period $T_{13}$, the renormalizing clock signal generator in the controller 13 is not reset because the controller 13 has received "0" indicating "normalization processing will not complete after one more normalization processing" from the last renormalization generator 83 of the A register 8. The controller 13 therefore, outputs a renormalizing clock signal in synchronization with the system clock signal.

When the fall of this renormalizing clock signal is received by the A register 8 and the C register 10, the A data and C data latched therein, namely, the A data and C data already shifted-up by one bit in the period $T_{12}$, are again shifted-up by one bit, and latched again in the A register 8 and the C register 10 respectively.

Since the controller 13 maintains the renewal clock signal at "H" level in this period $T_{13}$ as shown in FIG. 11 G, the contents stored in the context table storage device 4 is not updated.

In this period $T_{13}$, the A data stored in the register portion 81 of the A register 8 has a value more than 0.25 and less than 0.5 in decimal number, because it has been shifted-up by one bit. Accordingly, the value of the most significant bit is "0", and the value which is one bit lower from the most significant bit is "1".

Accordingly, a renormalizing signal "1" indicating "carrying out a normalization processing" is outputted from the renormalization generator 82 in the A register 8. An "H" level renormalizing signal is obtained in the controller 13 in the period $T_{14}$, as shown in FIG. 11E.

The last renormalization generator 83 in the A register 8 outputs a last renormalizing signal "1" indicating "normalization will be completed after one more normalization processing". An "H" level last renormalizing signal is obtained in the controller 13 in the period $T_{14}$, as shown in FIG. 11F.

This means that in the period $T_{14}$, the A data and the C data latched in the A register 8 and the C register 10 respectively are shifted-up by one bit in a renormalization processing. This also means that the mode V is completed by the last one normalizing processing.

In other words, since the last renormalization generator 83 outputs "1" indicating "normalization will be completed after one more normalization processing", the renormalization processing is completed in the first clock of the system clock in which an encoding processing for the next target encoding pixel is performed, namely, in the period $T_{14}$ shown in FIGS. 11A~L.

In other words, receiving the rise of the system clock in the period $T_{14}$, the controller 13 obtains a renormalizing signal and a last renormalizing signal, both "H" level, as shown in FIG. 11E and F, respectively, and generates a shift-up selection signal, which rises by receiving the rise of the system clock as shown in FIG. 11I.

When the shift-up selection signal rises, receiving a shift-up selection signal indicating "normalization will be completed by the last one normalization processing", the A selector 9 selects the data obtained by shifting up the A data from the A register 8 by one bit, and also outputs it to the arithmetic calculator 7.

Similarly, receiving the shift-up selection signal, the C selector 11 selects the data obtained by shifting up the C data from the C register 10 by one bit, and outputs it to the arithmetic calculator 7.

In other words, the processing performed in this period $T_{14}$ is the same as the "shift-up" processing in the mode V in which the A data and the C data latched in the A register 8 and in the C register 10 respectively are shifted-up by one bit. As a result, five renormalization processing are performed in the mode V during the periods $T_{10}$~$T_{14}$. The A data and the C data which are outputted from the A selector 9 and from the C selector 11 are the same as those obtained by shifting up the A data and the C data by five bits, which are respectively calculated for the sixth target encoding pixel in the period $T_9$.

Accordingly, in the mode V, for the renormalization processing which are required for five times, the procedures from a context generation to the arithmetic calculation for the target encoding pixel take only one clock time (one cycle) of the system clock to carry out. The A data and the C data calculated by the arithmetic calculator 7 are stored in the A register 8 and the C register 10, respectively. The four renormalization processing need four clocks of the system clock to carry out. The last one renormalization processing is performed in the first clock of the system clock in which an encoding processing for the next target encoding pixel is performed. As a result, substantial operating time in the mode V needs only five clocks system clock.

Furthermore, the one clock should last as long as the procedures from the context generation and the arithmetic operation by the arithmetic calculator 7 is completed. In other words, the time spared for this one system clock substantially equals to the sum of the accessing time of the context table storage device 4 and that of the arithmetic calculator 7.

In the periods $T_{10}$~$T_{13}$, since the controller 13 maintains the renormalizing clock signal to "H" level, the CT count clock signal is maintained to the same clock signal as the system clock shown in FIG. 11J. The controller 13 outputs the four CT count clock signals.

Accordingly, since the total number of clocks before the mode V is 5, when the controller 13 counts the same number of the bits of the encoded data for transmission, namely, eight bits in this first embodiment, the controller 13 outputs a code output clock signal, which becomes "L" level in synchronization with the next system clock as shown in FIG. 11K.

Receiving the code output clock signal from the controller 13 when it falls to the "L" level, the output means 12 takes-in the C data outputted from the C selector 11. This C data, in other words, is the C data latched in the C register 10, or a part of the C data selectively outputted from those obtained by shifting up this C data latched in the C register 10 by one bit. In case of this first embodiment, the output means 12 takes-in the eight most significant bits and latches them. This C data consisting the eight most significant bits are then outputted as an encoded data.

In conclusion, the number of the processing clocks of the system clock signal in the digital signal encoding device having the above mentioned configuration is described as follows.

In the mode I, where there is no renormalization, in other words, no normalization processing is required because the A data for a target encoding pixel is equal or more than 0.5 in decimal number, the number of the processing clocks is one, as shown in FIG. 10.

In the mode II, where a renormalization is performed, In other words, a normalization processing is required because the A data for a target encoding pixel is less than 0.5 in decimal number, the context for the target encoding pixel does not match with the context for the pixel which is immediately subsequent to the target encoding pixel, and renormalization occurs once, the number of the processing clocks is one.

In the mode III, where a renormalization is performed, the context for a target encoding pixel does not match with the context for a pixel which is immediately subsequent to the target encoding pixel, and renormalization occurs more than once, the number of the processing clocks is the same as that of the renormalization processing.

In the mode IV, where a renormalization is performed, the context for a target encoding pixel matches with the context for a pixel which is immediately subsequent to the target encoding pixel, and renormalization occurs once, the number of the processing clocks is two.

In the mode V, where a renormalization is performed, the context for a target encoding pixel matches with the context for a pixel which is immediately subsequent to the target encoding pixel, and renormalization occurs more than once, the number of the processing clocks is the same as that of the renormalization processing.

In other words, in the mode II, III and V, the last renormalization processing is performed together with the processing for the next target encoding pixel at the first clock of the system clock for processing the next target encoding pixel. Therefore, it is possible to substantially reduce the processing time as much as one clock, and speed up the encoding processing.

In the digital signal encoding device constructed in the above-mentioned manner, it is expected that the processing mode for the most of the target encoding pixel will be mode II in case of the worst compression ratio for encoding (compression ratio is about 1). Even in this case, the operation time in the mode II takes substantially no more than one clock of the system clock, and the most of the pixels to be encoded are processed within one clock of the system clock. Accordingly, this can speed up the encoding processing.

The following is a more precise explanation on this point. An investigation has been done to clarify the relationship between the distribution and the compression ratio for each of the above-mentioned five modes. In the investigation, a conventional CCITT facsimile chart is used as a character picture; a real picture and an artificially made picture data are used as a pseudo intermediate picture. The real picture is made from color standard picture (SCID) by means of a dither processing or an error scattering processing. The artificially made picture data is made by controlling the frequency of the LPS (Least Probable Symbol) to obtain a picture having an extreme high compression ratio. The experiment is performed with respect to each of the above-mentioned five modes.

In conclusion, it has been made clear that the ratio of the mode II becomes larger as the compression ratio becomes worse. The ratio of the mode II is 60% when the compression ratio is 1. In addition, the combined ratio of the mode I and II constitutes more than 80% in most of the cases where the compression ratio is equal to or less than 1. Since it takes no more than one clock to complete a processing for one target encoding pixel in the mode I and II, this remarkably can speed up the encoding processing.

The total number of the processing clocks T necessary for encoding is calculated according to the following equation 1. The processing speed, namely, the processing clock per pixel, is obtained as about 1.3 clock/a pixel when the compression ratio is 1.

Furthermore, the one clock should last as long as the procedures from the context generation and the arithmetic operation by the arithmetic calculator 7 is completed. In other words, the time spared for this one system clock substantially equals to the sum of the accessing time of the context table storage device 4 and that of the arithmetic calculator 7. This shortens the period of system clock, contributing to the high-speed processing.

$$T = P + \sum_{r=2}^{15} (r-1)*N[IIIr] + N[IV] + \sum_{r=2}^{15} (r-1)*N[Vr]$$

where
P: the number of pixels/page
N[IIIr]: the number of pixels/page which satisfies the number of renormalization=r in the mode III
N[IV]: the number of pixels/page in the mode W
N[Vr]: the number of pixels/page which satisfies the number of renormalization=r in the mode V Embodiment 2

Figure 13:
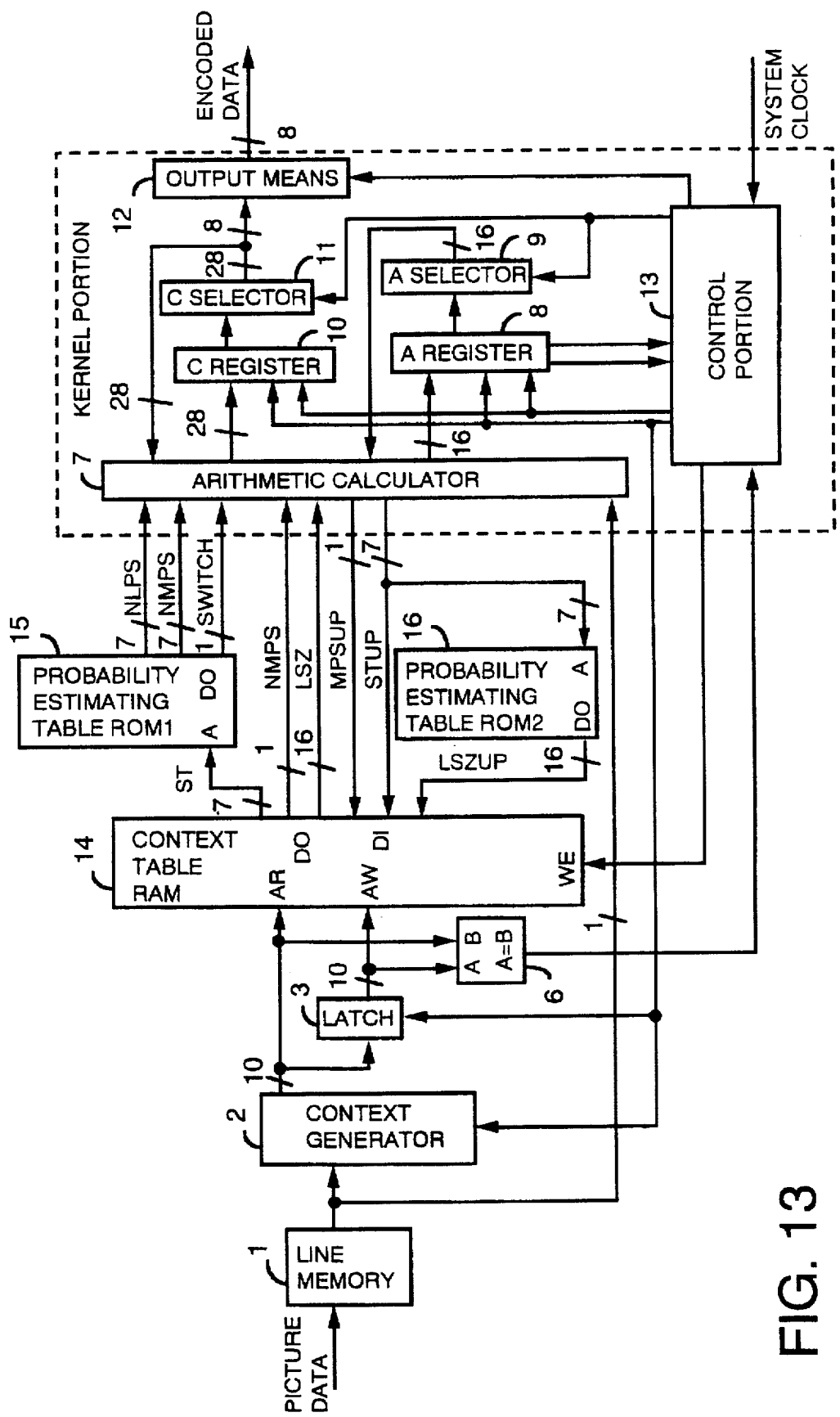
FIG. 13 is a block diagram showing a second embodiment of the present invention.

FIG. 13 shows a second embodiment of the present invention. Only the following points are different from the first embodiment, and the rest is the same as the first embodiment.

First, a prediction symbol and a probability estimating data are stored in the context table storage portion in the context table storage device 4 in the first embodiment. On the other hand, a prediction/index data which indicates a prediction symbol and a probability estimation index and an LSZ data which constitutes a first portion of the probability estimating data are stored in the context table storage portion in the context table storage device 14, in the second embodiment.

Second, according to the above-mentioned first difference, a first and a second probability estimating table storage device 15 and 16 are provided in the second embodiment, instead of the first probability estimating table storage device 5 in the first embodiment. The following explanation focuses on these differential points.

In FIG. 13, the same reference numbers as those in FIG. 13 refer to the same or corresponding portions as those in FIG. 1. A context table storage device 14 comprises a plurality of reading address input nodes AR, a plurality of data output nodes DO, a plurality of a writing address input nodes AW, a plurality of input nodes DI, a write-enable signal input node WE, and a context table storage portion which is capable of reading and writing a prediction/index data and a plurality of storing data. The probability estimation index includes a prediction symbol and a probability estimation index. The plurality of storing data comprises an LSZ data which indicates a mismatching probability constituting a first part of a probability estimating data. The context table storage device 14 reads out the storing data stored in the context table storage portion according to the address based on the context which is received into the reading address input nodes AR from a context generator 2, and then outputs the read-out storing data from the data output nodes DO. Receiving a renewal clock signal on the write-enable signal input node WE, the context table storage device 14 writes the prediction/index data and a renewal data having the first portion of the probability estimating data, which are inputted from the data input nodes DI in the context table storage portion, namely, rewrites the renewal data over previously stored data, according to the address based on the context received at the writing address input nodes AW from a context storage device 3.

Among the storing data which is outputted from the data output nodes DO, a prediction symbol MPS in the prediction/index data and the LSZ data which constitutes the first portion of the probability estimating data are directly outputted to an arithmetic calculator 7.

The number of the reading address input nodes AR and that of the writing address input nodes AW are 10, if a context comprises 10 bits.

Figures 14A, 14B:
FIGS. 14A, and B are a diagram showing an example of a context table in the context table storage device 14, 114.

The following is an example of the number of bits of each data constituting a storing data in this second embodiment. The prediction symbol of the prediction/index data comprises 1 bit. The probability estimation index in the prediction/index data comprises 7 bits. The LSZ data which constitutes the first portion of the probability estimating data comprises 16 bits. The storing data as a whole then comprises 24 bits. At the initial state, "0" is written in all bits in the storing data. They are updated in order according to the renormalize processing. FIGS. 14A, B show examples of the storing data. In FIG. 14A shows a storing data for each address in a certain state, and FIG. 14B shows a storing data after it is updated from the state A (the content at the address 0000000101 in the storing data is updated). The above-mentioned renewal data is the same as the above-mentioned storing data which comprises 24-bit data in total. They comprises a 1-bit prediction symbol MPSU which constitutes a prediction/index data and a 7-bit probability estimation index (indicates a status number) and a 16-bit LSZ data which constitutes the first portion of the probability estimating data. The number of the data output nodes DO and that of the data input nodes DI are 24, if the storing data and the renewal data respectively comprise 24 bits. The context table storage device 14 is able to store the storage data as much as the number of the address designated by the context. For example, if the context comprises 10 bits, storage data of $2^{10}$ is stored in the context table storage portion.

The context table storage device 14 comprises a two port RAM having a context table storage portion as shown in FIG. 4. This context table storage portion comprises 1024 (1k) of lines, and each one line (1address) comprises thirty two bits.

A first probability estimating table storage device 15 comprises a plurality of address input nodes A, a plurality of data output nodes DO, and a probability estimating table storage portion. The probability estimating table storage portion for storing a plurality of a second portion of a probability estimating data is based on the probability table recommend by the ITU (International Telecommunication Union) recommendation T. 82. The second portion of the probability estimating data consists of the data other than the LSZ data, namely an NLPS data, an NMPS data and a SWITCH data. The first probability estimating table storage device 15 receives a probability estimation index ST, which indicates a status number in the prediction index data from the above-mentioned context table storage device 14, on the address input nodes A. The first probability estimating table storage device 15 reads out the second portion of the probability estimating data which is stored in the probability estimating table storage portion corresponding to the address based on the received probability estimation index. The first probability estimating table storage device 15 then outputs a read-out data from the data output nodes DO to the arithmetic calculator 7. The first probability estimating table storage device 15 comprises a ROM and so 11.

The number of the address input nodes A is 7, if the probability estimation index in the prediction/index data stored in the context table storage device 14 comprises 7 bits. The probability estimation index ST to be inputted corresponds to the address of the probability estimating table storage portion.

FIG. 15 is an example of a probability estimating table. The second portion of the probability estimating data which is stored in the probability estimating table storage portion has values according to this probability estimating table of FIG. 15, for example.

In this second embodiment, the number of bits of respective data constituting the second portion of the probability estimating data, namely NLPS data, NMPS data and SWITCH data, is respectively 7 bits (in FIG. 15, it is shown in decimal number, but it is actually represented in binary number), 7 bits (in FIG. 15, it is shown in decimal number, but it is actually represented in binary number) and 1 bit.

The number of data output nodes DO is 15, for example, if the second portion of the probability estimating data comprises a 7-bit NLPS data, a 7-bit NMPS data and a 1-bit SWITCH data.

The probability estimating table storage portion is able to store the probability estimating data as much as the number of the address designated by the probability estimation index. In other words, if the probability estimation index comprises 7 bits for example, it can store as much as $2^7$ probability estimating data. The first probability estimating table 15 is comprised of a ROM which has a probability estimating table storage portion of 128 ($2^7$) rows, where each row (one address) comprises 15 bits, if respective data which constitute the second portion of the probability estimating data, namely NLPS data, NMPS data and SWITCH data, comprise seven bits, seven bits and one bit, respectively, for example.

A second probability estimating table storage device 16 comprises a plurality of address input nodes A, a plurality of data output nodes DO, and a probability estimating table storage portion. The probability estimating table storage portion for storing a plurality of a first portion of a probability estimating data is based on the probability table recommend by the ITU (International Telecommunication Union) recommendation T. 82. The first portion of the probability estimating data comprises an LSZ data. The second probability estimating table storage device 16 receives a probability estimation index STU P, which indicates a status number in the prediction index data from the arithmetic calculator 7, on the address input nodes A. The second probability estimating table storage device 16 reads out the first portion of the probability estimating data which is stored in the probability estimating table storage portion corresponding to the address based on the received probability estimation index STUP. The second probability estimating table storage device 16 then outputs a read-out data from the data output nodes DO to the context table storage device 14 as a first portion of the probability estimating data of a renewal data. The second probability estimating table storage device 16 comprises a ROM and so on.

The number of the address input nodes A is 7, if the probability estimation index STUP from the arithmetic calculator 7 comprises 7 bits. The probability estimation index STUP to be inputted corresponds to the address of the probability estimating table storage portion.

FIG. 16 is an example of a probability estimating table. The first portion of the probability estimating data which is stored in the probability estimating table storage portion has values according to this probability estimating table of FIG. 16, for example.

In this second embodiment, the number of bits of the LSZ data which constitutes the first portion of the probability estimating data, is 16 bits.

The number of data output nodes DO is 16, for example, if the LSZ data which constitutes the first portion of the probability estimating data comprises 16 bits.

The probability estimating table storage portion is able to store the first portion of the probability estimating data as much as the number of the address designated by the probability estimation index. In other words, if the probability estimation index comprises 7 bits for example, it can store as much as $2^7$ first portion of the probability estimating data. The second probability estimating table storage device 16 is comprised of a ROM having a probability estimating table storage portion of 128 ($2^7$) rows, where each row (one address) comprises 16 bits, if the LSZ data comprises 16 bits.

The operation of a digital information encoding device constructed as mentioned is explained below.

The digital information encoding device shown in this second embodiment basically operates in the same way as the first embodiment shown in FIG. 1. The operation has five operation modes as shown in FIG. 10, and operates along with the waveforms shown in FIGS. 11A–L.

The operation in the second embodiment is the same as the first embodiment except providing a prediction symbol and the probability estimating data to the arithmetic calculator 7 and a renewal data to the context table storage device 14, because of the above-mentioned first difference.

45

To explain the above-mentioned difference, the mode III (including a renormalizing processing in the mode II) in the period $T_4 \sim T_6$ is explained in the following, using the waveforms in FIGS. 11A~L. It is assumed that the operations in the other modes are easily understood from the operation in the mode III and in the first embodiment

[mode III]

In the period $T_4$, a pixel processing clock signal is raised by the rise of the system clock. Receiving the rise of the pixel processing clock signal, the context generator 2 reads a context for the fourth target encoding pixel from the storage device 1 and outputs the read context to the reading address input nodes AR of the context table storage device 14.

In the context table storage device 14, an 8-bit prediction/index data and a 16-bit LSZ data, which constitutes the first portion of the probability estimating data, are read out according to the context inputted into the reading address input nodes AR. The probability estimation index ST of the prediction/index data is outputted from the data output nodes DO to the address input nodes A of the first probability estimating table storage device 15. The prediction symbol MPS and the LSZ data are output ted from the data output nodes DO to the arithmetic calculator 7.

Receiving the probability estimation index ST, the first probability estimating table 15 reads out an NLPS data, an NMPS data and a SWITCH data, which constitute the second portion of the probability estimating data shown in FIG. 15, according to the probability estimation index ST inputted to the address input nodes A, and then outputs them to the arithmetic calculator 7.

On the other hand, since one renormalization processing is performed in the mode II, the controller 13 has therefore, receives "1" indicating "carrying out a normalization processing" from the renormalize generator 82 in the A register 8, and "1" indicating "normalization will be completed after one more normalization processing" from the last renormalization generator 83 in the A register 8, in the period $T_4$ of the first clock of the system clock in the mode III. Accordingly, the controller 13 obtains a renormalizing signal and a last renormalizing signal, both "H" level, in the period $T_4$, respectively, as shown in FIG. 11E and FIG. 11F. Also, the controller 13 generates a shift-up selection signal which rises in response to the rise of the system clock as shown in FIG. 11I.

When the shift-up selection signal rises, receiving a shift-up selection signal indicating "normalization will be completed by the last one normalization processing", the A selector 9 selects the data obtained by shifting up the A data from the A register 8 by one bit, and also outputs it to the arithmetic calculator 7.

Similarly, receiving the shift-up selection signal, the C selector 11 selects the data obtained by shifting up the C data from the C register 10 by one bit, and outputs it to the arithmetic calculator 7.

In other words, the A data and the C data latched in the A register 8 and the C register 10 respectively in the mode II are shifted-up by one bit in this period $T_4$.

The A data latched in the A register 8 and the C data latched in the C register 10 in this period $T_4$ are resultants calculated in the mode II (,period $T_3$) by the arithmetic calculator 7. In other words, since the renormalizing signal and also the last renormalizing signal become "H" level in the period $T_4$, a renormalizing clock signal becomes "H" level. Therefore, the contents stored in the A register 8 and the C register 10 are not shifted-up and kept unchanged.

In the prediction conversion signal generator 71 in the arithmetic calculator 7 (ref. FIG. 7), a prediction symbol MPS of the storing data and a picture data of the target encoding pixel are compared to generate a prediction conversion signal.

When this prediction conversion signal indicates that the prediction symbol matches with the picture data (indicates the MPS), the calculator 73 calculates an A data from an LSZ data from the context table storage device 14 and the A data of the third pixels to be encoded, namely, the data A which is shifted-up by one bit, according to the above-mentioned equation (1). The calculated A data is outputted to the A register 8. The C data of the third pixels to be encoded, namely, the C data shifted-up by one bit, is outputted to the C register 10, according to the above-mentioned equation (2).

When this prediction conversion signal indicates that the prediction symbol does not match with the picture data (indicates the LPS), the calculator 73 outputs the LSZ data from the context table storage device 14 to the A register 8 as an A data, according to the above-mentioned equation (3). The calculator 73 further calculates a C data from the LSZ data from the context table storage device 14 and both A and C data of the third pixels to be encoded, namely, the A data and the C data shifted-up by one bit, respectively, according to the above-mentioned equation (4). The calculated C data is outputted to the C register 10.

The concept of an A data and a C data at this stage is explained using the bar graph for the fourth target encoding pixel shown in FIG. 12. The bar graph for this fourth target encoding pixel indicates that a picture data does not match with a prediction symbol. The contents stored in the A register 8 for the third target encoding pixel corresponds to the width of the effective area of the MPS which is the same MPS as that explained in the mode II in the period $T_3$. The contents shifted-up by one bit (two times) corresponds to the substantial width of the effective area.

The contents stored in the C register 10 for the third target encoding pixel has a value corresponding to the bottom of the MPS which is the same MPS as that explained in the mode II in the period $T_3$. The contents shifted-up by one bit corresponds to the substantial width of the effective area.

The width of the LPS corresponds to the value of the LSZ data of a storing data for the fourth target encoding pixel. The width of the MPS corresponds to the value calculated by subtracting the width of the LPS from the value which is obtained by shifting up the contents stored in the A register 8 by one bit, and the width of the LPS corresponds to the width of the effective area for the fourth target encoding pixel.

In other words, the A data calculated and outputted by the calculator 73 has a value corresponding to the width of the LPS, and the C data calculated and outputted by the calculator 73 has a value corresponding to the bottom of the effective area, namely, a value corresponding to the bottom of the LPS.

The A data and the C data calculated by the calculator 73 in this way are inputted to the register portion 81 of the A register 8 (ref. FIG. 8) and to the C register 10 (ref. FIG. 9), respectively, and stored therein (renewal of the stored contents) at the rising edge of a pixel processing clock signal from the controller 13 (period $T_5$).

In this period $T_4$, since the mode II requires one renormalization processing, the controller 13 receives "1" indicating "carrying out a normalization processing" from the renormalization generator 82 in the A register 8. On this account, the controller 13 outputs a renewal clock signal, by receiving the rising edge of the system clock as shown in FIG. 11G.

Receiving the fall of the renewal clock signal, the context table storage device 14 writes and stores a renewal data on the context table storage portion at the address based on the context which is received in the writing address input nodes AW from the context storage device 3, namely, the context of the third target encoding pixel in the mode II.

This renewal data consists of a prediction/index data comprising a prediction symbol MPSUP from the arithmetic calculator 7 and a probability estimation index STUP indicating a status number from the arithmetic calculator 7, and an LSZ data LSZUP which constitutes a first portion of the probability estimating data which is read-out from the second probability estimating table storage device 16 according to the probability estimation index STUP which indicates a status number from the arithmetic calculator 7.

Accordingly, a prediction symbol and a probability estimation index are explained, respectively.

First, a prediction/index data as a renewal data is explained below.

The prediction symbol MPSUP generated by the prediction symbol/probability estimation index generator (renewal data generator) 72 has the same value as that of the prediction symbol of the prediction/index data for the third target encoding pixel, regardless of the SWITCH data of the probability estimating data for the third target encoding pixel, when a prediction conversion signal from the prediction conversion signal generator 71 indicates that a prediction symbol matches with a picture data (indicates the MPS).

When the prediction conversion signal indicates that the prediction symbol does not match with the picture data (indicates the LPS), the prediction symbol becomes the same value obtained by inverting the value of the prediction symbol of the prediction/index data for the third target encoding pixel, if the SWITCH data of the probability estimating data for the third target encoding pixel is "1". The prediction symbol becomes the same value as that of the prediction symbol of the prediction/index data for the third target encoding pixel, if the SWITCH data is "0".

The probability estimation index (status number) STUP generated by the prediction symbol/probability estimation index generator 72 in the arithmetic calculator 7 becomes an NMPS data of the probability estimating data for the third target encoding pixel when the prediction conversion signal from the prediction conversion signal generator 71 indicates MPS, while it becomes an NLPS data of the probability estimating data for the third target encoding pixel when the above-mentioned prediction conversion signal indicates LPS.

The LSZ data which constitutes the first portion of the probability estimating data as a renewal data is explained below.

A probability estimation index STUP which is generated as mentioned above is inputted from the arithmetic calculator 7 to an address node A of the second probability estimating table storage device 16.

Receiving the second probability estimation index, the second probability estimating table storage device 16 outputs the first portion of the probability estimating data which consists of an LSZ data corresponding to the received probability estimation index to the context table storage device 14, according to the probability estimating table shown in FIG. 16, which is stored in the probability estimating table storage portion.

The prediction/index data from the arithmetic calculator 7 and the renewal data which consists of an LSZ data constituting the first portion of the probability estimating data from the second probability estimating table storage device 16 are written in the context table storage portion of the context table storage device 14 according to the address based on the context for the third target encoding pixel.

For example, in a context table shown in FIG. 14A, it is assumed that the address of the context for the third target encoding pixel is "0000000101". The storing data stored in the context table storage portion at the address based on that context consists of the prediction value (prediction symbol) MPS of "0", the probability estimating index ST of "14" (in decimal number, although it is actually represented in binary number), the LSZ data od "0x5a7f".

This storing data is read out so that the probability estimation index ST in the storing data is given to the probability estimating table storage device 15, and the prediction symbol MPS and the LSZ data are given to the arithmetic calculator 7.

The probability estimation index ST which is received in the first probability estimating table storage device 15 is "0001110", for example. The second portion of the probability estimating data stored in the first probability estimating table storage device 15 at the address based on the above-mentioned probability estimation index consists of the NLPS data of "15" (in decimal number, although it is actually represented in binary number), the NMPS data of "15" (in decimal number, although it is actually represented in binary number) and the SWITCH data of "1" as shown in FIG. 15 for example.

This second portion of the probability estimating data is read-out and given to the arithmetic calculator 7.

At this stage, the prediction conversion signal from the prediction conversion signal generator 71 for the third target encoding pixel indicates the MPS. Accordingly, even if the SWITCH data of the probability estimating data is "1", the prediction symbol from the prediction symbol/probability estimation index generator 72 becomes the same value as the prediction value of the storing data for the third target encoding pixel, namely, "0".

This value is given as a prediction symbol MPSUP of a renewal data for the context table storage device 14.

The probability estimating index from the prediction symbol/probability estimation index generator 72 becomes the same value as that of the MNPS, namely "0001111" ("15" in decimal number).

This value serves as an address which is inputted to the input node A of the second probability estimating table 16 and is given to the context table storage device 14 as a probability estimating index in the prediction/index data of a renewal data in the context table storage device 14.

Receiving this probability estimation index "0001111", the second probability estimating table storage device 16 outputs a probability estimating data which corresponds to the address "0001111" (status number) in the probability estimating table shown in FIG. 16, namely the LSZ data of "0x3f25", to the context table storage device 14 as a probability estimating data of a renewal data.

These values are given to the context table storage device 14 as a renewal data. As shown in the updated context table of FIG. 14B, in the context table storage device 14, the prediction value (prediction symbol) of "0", the LSZ data of "0x3f25", and the probability estimation index ST of "15" (in decimal number, although it is actually represented in binary number) are written at the address based on the context of "0000000101" for the third target encoding pixel.

Accordingly, in the period $T_4$ in this mode III, the procedures from a context generation to the arithmetic calculation for the fourth target encoding pixel, and a renormalization processing for the third target encoding pixel are carried out in one clock of the system clock (a cycle). In other words, the storing data in the context table storage device 14 is updated and the A data latched in the A register 8 and the C data latched in the C register 10 are respectively shifted-up by one bit in one clock of the system clock (a cycle).

Furthermore, the time spared for this one system clock substantially equals to the sum of the accessing time of the context table storage device 14 and that of the arithmetic calculator 7, because the prediction symbol MPS and the LSZ data which are necessary for calculation by the arithmetic calculator 7 are directly given to the arithmetic calculator 7 from the context table storage device 14. This shortens the period of system clock, contributing to the high-speed processing.

The time necessary for renewing the context table storage device 14 substantially equals to the accessing time to the probability estimating table storage 15, which is shorter than the time necessary for the procedures from the context generation to the arithmetic calculation.

Since this mode III shows an example in which three renormalization processing are required, the A data which is the resultant calculated by the arithmetic calculator 7, and taken into the register portion 81 of the A register 8 in the period $T_5$, becomes a value more than "0.0625" and less than 0.125 in decimal number.

Accordingly, the value of most the significant bit becomes "0", and the value which is one bit lower from the most significant bit becomes "0".

Accordingly, a renormalizing signal "1" indicating "carrying out a normalization processing" is outputted from the renormalization generator 82 in the A register 8. As shown in FIG. 11E, the controller 13 therefore obtains an "H" level renormalizing signal in the period $T_5$.

The last renormalization generator 83 in the A register 8 outputs a last renormalizing signal "0" indicating "normalization will not be completed after one more normalization processing". An "L" level last renormalizing signal is obtained in the controller 13 in the period $T_5$, as shown in FIG. 11F.

Receiving a context of the fifth pixel from the context generator 2 and a context of the fourth target encoding pixel from the context storage device 3, the context comparison means 6 outputs an "L" level identical context signal indicating that "the contexts do not match with each other" during the period $T_5$ as shown in FIG. 11D.

Accordingly, the mode III is recognized in this period $T_5$, in which the contexts are not identical and at least one renormalization processing has to be performed.

By this recognition, a renormalization processing is performed in the period $T_5$ shown in FIGS. 11A~L. In other words, the storing data in the context table storage device 14 is updated, and the A data in the A register 8 and the C data in the C register 10 are respectively shifted-up one bit.

As mentioned above, in this period $T_5$, at the rise of a pixel clock signal triggered by the rise of a system clock, the A data and the C data calculated for the fourth target encoding pixel are taken into the A register 8 and to the C register 10 respectively and latched therein. Receiving the rise of the pixel processing clock signal, the context generator 2 reads the context for the fifth target encoding pixel from the storage device 1 and outputs the read context to the reading address input nodes AR in the context table storage device 14 and to the context storage device 3.

The pixel processing clock signal however, maintains "H" level during this period $T_5$, since the renormalization generator 82 of the A register 8 outputs "1" indicating "carrying out a normalization processing" and the last renormalization generator 83 of the A register 8 outputs "0" indicating "normalization processing will not complete after one more normalization processing". As a result, the A register 8 and the C register 10 update none of the contents stored therein. The A data and the C data calculated for the fourth target encoding pixel remain to be latched in the A register 8 and the C register 10, respectively.

On the other hand, when the controller 13 receives "1" indicating "carrying out a normalization processing" from the renormalization generator 82 of the A register 8, the renormalizing clock signal generator is set, and the controller 13, therefore, outputs a renormalizing clock signal in synchronization with the system clock signal.

Receiving the fall of this renormalizing clock signal, the A register 8 and the C register 10 shift up the A data and the C data by one bit, which are calculated by the arithmetic calculator 7 in the period $T_4$ for the fourth target encoding pixel, respectively, and latch them again.

Since the controller 13 receives "1" indicating "carrying out a normalization processing" from the renormalization generator 82 in the A register 8, the controller 13 outputs a renewal clock signal in synchronization with the system clock as shown in FIG. 11G.

Receiving the fall of the renewal clock signal, the context table storage device 14 writes and stores the prediction symbol MPSUP and the probability estimation index STUP from the arithmetic calculator 7 and the LSZ data which constitutes the first portion of the probability estimating data from the second probability estimating table storage device 16 on the context table storage portion at the address based on the context from the context storage device 3, which is received in the writing address input nodes AW, namely, the context of the fourth target encoding pixel, as mentioned in the period $T_4$.

In this period $T_5$, the A data stored in the register portion 81 of the A register 8 has a value more than 0.125 and less than 0.25 in decimal number because it has been shifted-up by one bit. The value of the most significant bit is, however "0", and the value which is one bit lower from the most significant bit is also "0".

Accordingly, the renormalization generator 82 in the A register 8 outputs a renormalizing signal "1" indicating "carrying out a normalization processing", therefore, an "H" level renormalizing signal is obtained in the controller 13 in the period $T_6$, as shown in FIG. 11E.

The last renormalization generator 83 in the A register 8 outputs a last renormalizing signal "0" indicating "normalization will not be completed after one more normalization processing". An "L" level last renormalizing signal is obtained in the controller 13 in the period $T_6$, as shown in FIG. 11F.

This means that in the next period $T_6$, the A data and the C data latched in the A register 8 and the C register 10 respectively are shifted-up by one bit in a renormalization processing.

Accordingly in the period $T_6$, when the controller 13 receives "0" indicating "normalization processing will not complete after one more normalization processing" from the last renormalization generator 83 of the A register 8, the renormalizing clock signal generator in the controller 13 is not reset, and the controller 13 therefore outputs a renormalizing clock signal in synchronization with the system clock signal.

Receiving the fall of this renormalizing clock signal, the A register 8 and the C register 10 shift up the A data and the C data by one bit, which are shifted-up by one bit in the period $T_5$, respectively, and latch them again.

Since the last renormalization generator 83 outputs "0" indicating "normalization processing will not complete after one more normalization processing", the pixel processing clock signal maintains "H" level even in this period $T_6$. Accordingly, the controller 13 maintains the renewal clock signal at "H" level as shown in FIG. 11G. As a result, the contents stored in the context table storage device 14 is not updated.

In this period $T_6$, the A data stored in the register portion 81 of the A register 8 has a value more than 0.25 and less than 0.5 in decimal number, because it has been shifted-up by one bit. The value of the most significant bit is, however "0", and the value which is one bit lower from the most significant bit is "1".

Accordingly, the renormalization generator 82 in the A register 8 outputs a renormalizing signal "1" indicating "carrying out a normalization processing", therefore, an "H" level renormalizing signal is obtained in the controller 13 in the period $T_7$, as shown in FIG. 11E.

The last renormalization generator 83 in the A register 8 outputs a last renormalizing signal "1" indicating "normalization will be completed after one more normalization processing". An "H" level last renormalizing signal is obtained in the controller 13 in the period $T_7$, as shown in FIG. 11F.

This means that in the next period $T_7$, the A data and the C data latched in the A register 8 and the C register 10 respectively, are shifted-up by one bit in a renormalization processing. This also means that the mode III is completed by the last one normalizing processing.

In other words, the last renormalization generator 83 in the A register 8 outputs "1" indicating "normalization will be completed after one more normalization processing". In the same manner as the operation in the mode II, the renormalization processing can be performed, at the first clock of the system clock in which an encoding processing for the next target encoding pixel is performed, namely, the period $T_7$ in the mode IV shown in FIGS. 11A~L.

Accordingly, in the mode III, for the renormalization processing which are required for three times, the procedures from a context generation to the arithmetic calculation for the target encoding pixel take only one clock time (one cycle) of the system clock to carry out. The A data and the C data calculated by the arithmetic calculator 7, are stored in the A register 8 and the C register 10, respectively. The two renormalization processing need two clocks of the system clock to carry out. The last one renormalization processing is performed in the first clock of the system clock in which an encoding processing for the next target encoding pixel is performed.

As a result, substantial operating time in the mode III needs only three clocks of the system clock. Furthermore, the one clock should last as long as the procedures from the context generation and the arithmetic operation by the arithmetic calculator 7 is completed. In other words, the time spared for this one system clock substantially equals to the sum of the accessing time of the context table storage device 14 and that of the arithmetic calculator 7. This shortens the period of system clock, contributing to the high-speed processing.

As mentioned above, the same effect as mentioned in the first embodiment is obtained in this second embodiment. Moreover, in case all the elements according to this second embodiment can be integrated into a semiconductor integrated circuit, the size of the semiconductor integrated circuit becomes smaller because the storage capacity of the context table storage device 14 becomes small.

Embodiment 3

Figure 17:
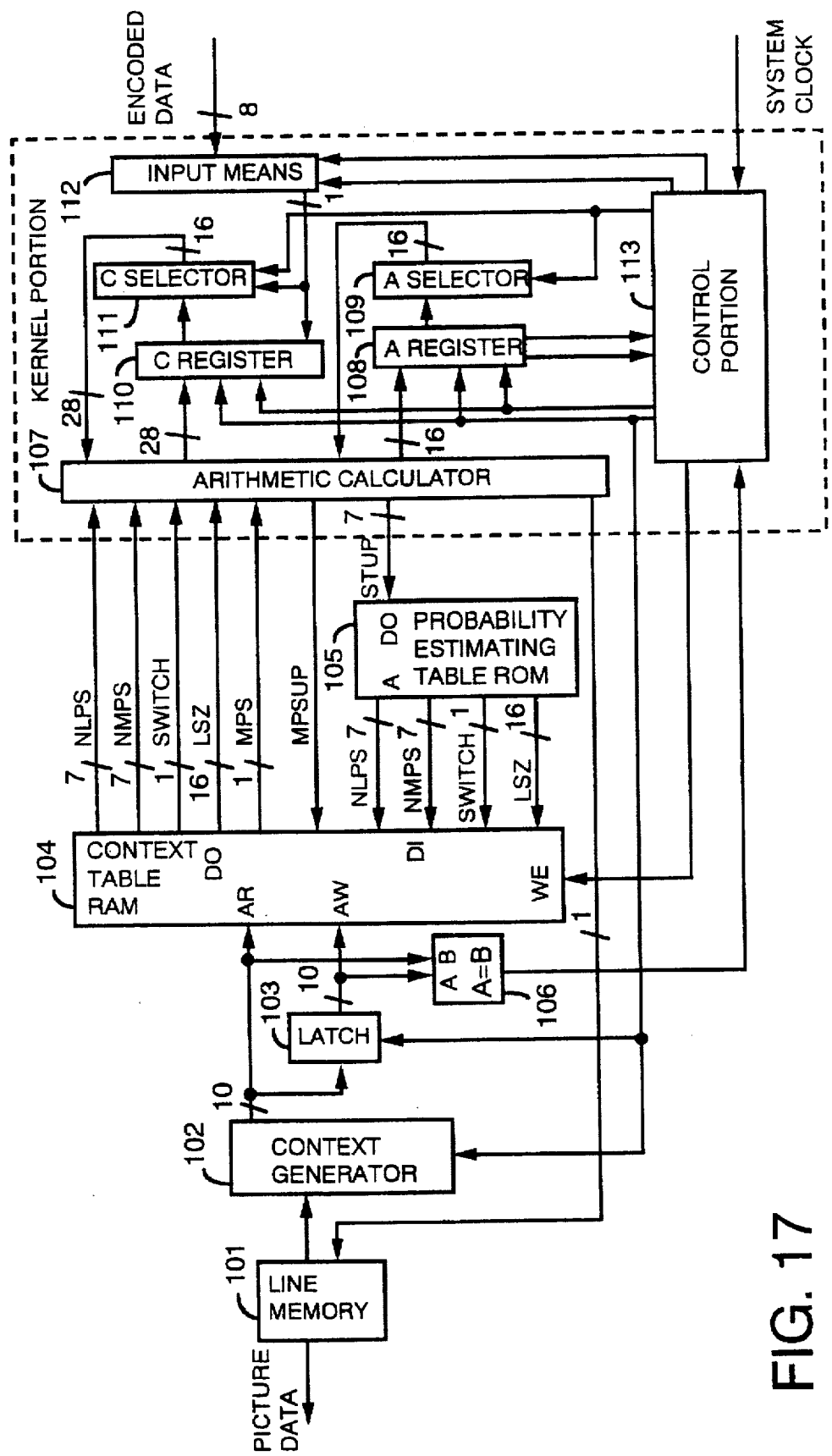
FIG. 17 is a block diagram showing a third embodiment of the present invention.

FIG. 17 shows a digital signal decoding device integrated into a semiconductor integrated circuit which is applied, for example, to a facsimile apparatus of a third embodiment of the present invention. In FIG. 17, a storage device 101 stores a plurality of lines of decoded picture data for every one line, and outputs the stored picture data which consists of digital signals to a picture processing circuit which supplies the stored picture data as picture information (character information, pictorial information, pallet picture information) to a display means such as a printer. The storage device 101 comprises a plurality of line memories which are the same as the storage device 1 of the above-mentioned digital signal encoding device.

A context generator 102 in FIG. 17 extracts a reference pixel according to a template model from the picture data inputted from the above-mentioned storage device 101. It is the same as the context generator 2 in the above mentioned digital signal encoding device. A context storage device 103 in FIG. 17 comprises a latch circuit where a context for the target decoding pixel which is received from the above-mentioned context generator 102 is temporarily stored in synchronization with the clock of the picture processing clock signal, and the temporarily stored context is outputted as a context for the target decoding pixel in synchronization with the next clock of the above-mentioned picture processing clock signal. The context storage device 103 is similar to the context storage device 3 in the above-mentioned digital signal encoding device.

A context table storage device 104 of FIG. 17 comprises a plurality of reading address input nodes AR, a plurality of data output nodes DO, a plurality of a writing address input nodes AW, a plurality of input nodes DI, a write-enable signal input node WE, and a context table storing portion which is able to read and write a plurality of storing data comprising a plurality of bits including a prediction symbol and a probability estimating data. The context table storage device 104 reads out the storing data stored in the context table storing portion at the address based on the context which is received into the reading address input nodes AR from the above-mentioned context generator 102, and then outputs from the data output nodes DO.

Receiving a renewal clock signal on the write-enable signal input node WE, the context table storage device writes a renewal data inputted from the data input nodes DI (rewrite the renewal data over previously stored data) in the context table storing portion at the address based on the context which is received on the writing address input nodes AW from the above-mentioned context storage device 103. The context table storage device 104 comprises a two port RAM and so on and similar to the context table storage device 4 in the above-mentioned digital signal encoding device.

A probability estimating table storage device 105 comprises a plurality of address input nodes A, a plurality of data output nodes DO, and a probability estimating table storing portion. The probability estimating table storing portion for storing a probability estimating data comprising a plurality of bits is based on the probability table recommend by the ITU (International Telecommunication Union) recommendation T. 82. The probability estimating table storage device 105 receives the probability estimation index STUP which indicates a status number at the address input nodes A and reads out the probability estimating data stored in the probability estimating table storing portion at the address based on the received probability estimation index, and outputs it from the data output nodes DO. The probability estimating table storage device 105 comprises a ROM and so on, and is similar to the probability estimating table storage device 5 in the above-mentioned digital encoding device.

A context comparator 106 in FIG. 13 compares a context from the context generator 102 and the context from the context storage device 103. If the resultant shows the same, the context comparison means 6 outputs "1". Otherwise, it outputs "0". The context comparator 106 is similar to the context comparison means 6 in the above-mentioned digital encoding device.

Figure 18:
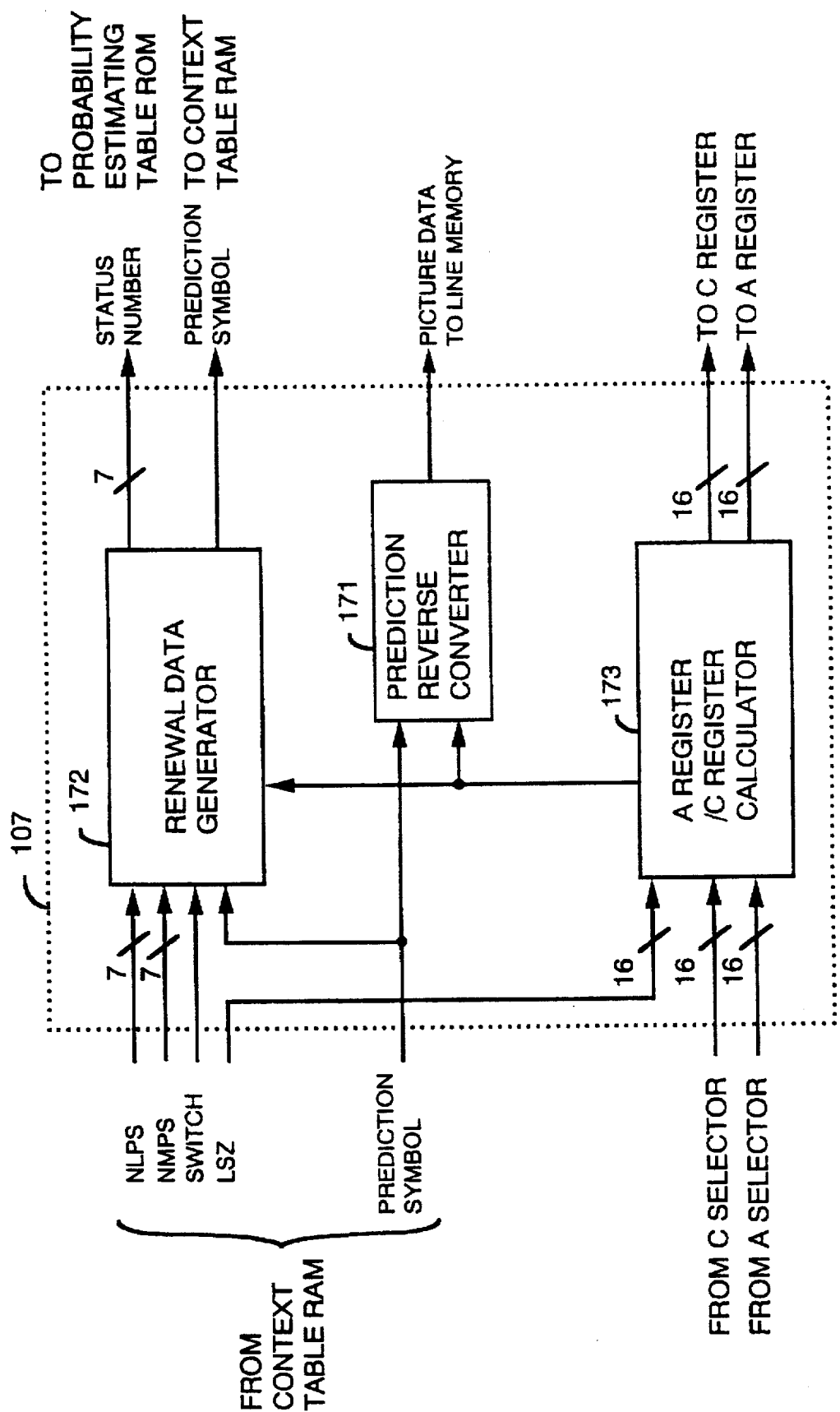
FIG. 18 is a block diagram showing an example of the arithmetic calculator according to the third through sixth embodiments of the present invention.

An arithmetic calculator 107 in FIG. 17 receives a storing data from the context table storage device 104, an A data which shows a width A of the effective area for the pixel which immediately precedes target decoding pixel (hereinafter, referred to as an immediately preceding A data), and a C data which shows an code word C for the pixel which immediately precedes target decoding pixel (hereinafter, referred to as an immediately preceding C data). The arithmetic calculator 107 performs a predetermined arithmetic processing and outputs an A data which shows the width A of the effective area for the target decoding pixel (hereinafter, just referred to as A data) and a C data which shows the decode word C for the target decoding pixel (hereinafter, just referred to as C data). The arithmetic calculator 107 further outputs a picture data for the target decoding pixel to the above-mentioned storage device 101. The arithmetic calculator 107 further outputs a prediction symbol MPSUP for a renewal data to the context table storage device 104, and the probability estimation index STUP which indicates a status number to the probability estimating table 15. A detailed configuration of the arithmetic calculator 107 is shown in FIG. 18.

The predetermined arithmetic processing for obtaining A data and C data is done is described below.

$$C(k-1) < A(k-1) - LSZ(k) \quad (5)$$

When the equation (5) is satisfied (decoding as an MPS):

$$A(k) = A(k-1) - LSZ(k) \quad (6)$$

$$C(k) = C(k-1) \quad (7)$$

When the equation (5) is not satisfied (decoding as an LPS):

$$A(k) = LSZ(k) \quad (8)$$

$$C(k) = C(k-1) + \{A(k-1) - LSZ(k)\} \quad (9)$$

where, A(k) is an A data of the k-th target decoding pixel, A(k-1) is an A data of the (k-1)-th target decoding pixel, C(k) is a C data of the k-th target decoding pixel, C(k-1) is a C data of the (k-1)-th target decoding pixel, LSZ (k) is an LSZ data in a probability estimating data from the probability estimating table storage 105 for the k-th target decoding pixel, k=1, 2, 3, . . . . The initial value A(0)=1.0 . . . 0, and the initial value C (0), for example, is a coded data consisted of 16 bits.

In FIG. 18, a picture data generator (prediction inverse converter) 171 receives a prediction symbol of a storing data for the target decoding pixel from the context table storage device 104 and a prediction conversion signal. When the prediction conversion signal, which shows whether the above-mentioned equation (5) is satisfied ("1", for example) or not ("0", for example), matches the prediction symbol, the picture data generator 171 outputs a picture data "0", for example, to the storage device 101. The picture data generator 171 outputs a picture data "1", for example, to the storage device 101, when the prediction conversion signal does not match with the prediction symbol. The picture data generator 171 comprises a comparison means such as an exclusive OR circuit, for example.

A prediction symbol/probability estimation index generator (a renewal data generator) 172 in FIG. 18, receives a SWITCH data, an NLPS data and an NMPS data of a storing data for a target decoding pixel from the context table storage device 104, and the prediction conversion signal. When the SWITCH data is "1", for example, and the prediction conversion signal shows that the above-mentioned equation (5) is not satisfied (in other words, the value of the prediction symbol shows a combination of "1", for example), the inputted value of the prediction symbol is inverted. The prediction symbol, after its value was inverted, is outputted as a prediction symbol of a renewal data for the context table storage device 104. If the combination of the values of the above-mentioned SWITCH data and the above-mentioned prediction conversion signal is otherwise, the value of the prediction symbol, not being inverted, is outputted as a prediction symbol of the above-mentioned renewal data. Moreover, when the prediction conversion signal indicates the above-mentioned equation (5) is not satisfied, the NLPS data is selected and outputted as a probability estimation index (a status signal) STUP of the probability estimating table 105. If the prediction conversion signal is "0", for example, which indicates that the above-mentioned equation (5) is satisfied, the NMPS data is selected and outputted as a probability estimation index (a status signal) STUP of the probability estimating table 105.

A calculator 173 receives the LSZ data of a probability estimating data for a target decoding pixel from the context table storage device 104, the immediately preceding A data, and the immediately preceding C data. The calculator 173 carries out the above-mentioned arithmetic processing shown by the equations (5)–(9) and outputs a prediction conversion signal, and an A data and a C data, to the picture data generator 171 and to the prediction symbol/probability estimation index generator 172. The calculator 173 comprises a prediction conversion signal generating portion where the LSZ data, the immediately preceding A data and the immediately preceding are received and a prediction conversion signal is outputted according to the equation (5), an A data generating portion where the LSZ data, the immediately preceding A data and the above-mentioned prediction conversion signal are received and A data is outputted, and a C data generating portion where the LSZ data, the immediately preceding A data, the immediately preceding C data and the above-mentioned prediction conversion signal are received and C data is outputted.

Referring back to FIG. 17, an A register 108 receives an A data from the arithmetic calculator 107, the pixel processing clock signal and a renormalizing clock signal. In synchronization with the inputted picture processing clock signal, the A register receives the A data from the arithmetic calculator 7 and latches them. In synchronization with the inputted renormalizing clock signal, the A register shifts-up the latched data by one bit and latches them again, and outputs them as the A data. The A register 108 outputs a renormalize (normalization) signal for performing a normalization processing (extension of areas) and a last renormalizing signal indicating that normalization will be completed after one more normalization processing. A detailed configuration of the A register 108 is shown in FIG. 19.

Figure 19:
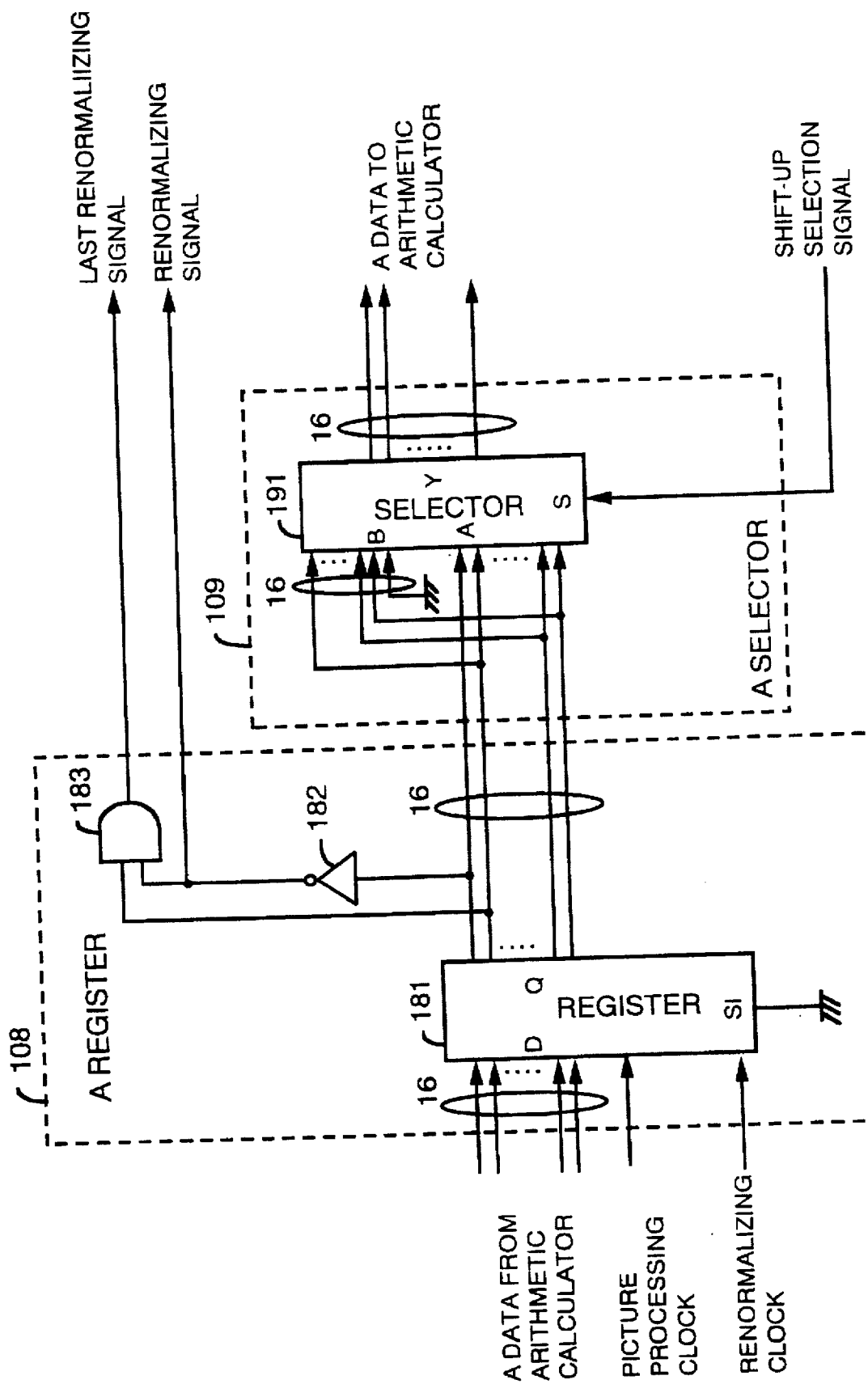
FIG. 19 is a block diagram showing an example of the A register 108 and the A selector 109 in the arithmetic calculator 107 according to the third through sixth embodiments of the present invention.

In FIG. 19, an A register portion 181 takes-in the A data from the arithmetic calculator 107 and latches it therein in synchronization with the inputted pixel processing clock signal. In synchronization with the inputted renormalizing clock signal, the register portion 181 shifts-up the data latched by one bit, and latches them again, and outputs them as the A data. If the A data comprises 16 bits, for example, the shift register can perform the data writing (data renewal) for every bit in synchronization with the pixel processing clock signal. The shift register performs data writing (data renewal), each in synchronization with the pixel processing clock signal. Then, the shift register shifts-up the contents by one bit in synchronization with a renormalizing clock signal. In other words, the least significant bit is connected to the earth electric potential node and stores "0", while the contents in the remaining bits are updated to the latch contents of the immediately preceding stage. At initial state, the contents stored in the most significant latch portion is set to "1", while those in the remaining of 15 latch portions are set to "0".

A renormalization generator 182 in FIG. 19 receives a most significant bit signal (hereinafter, referred to as MSB signal) of the A data which is outputted from the register portion 181. Based on the received MSB signal, the renormalization generator 182 outputs a renormalizing signal, indicating "prosecuting a normalization processing", when the width A of the effective area becomes less than 50%, namely, the A data becomes less than 0.5 in decimal number. The renormalization generator 182 comprises an invertor circuit which outputs "1", for example, indicating "prosecuting a normalization processing", if the MSB signal is "0", in FIG. 15

A last renormalization generator 183 in FIG. 19 receives a signal (hereinafter, referred to as the MSB-1 signal) which is placed one bit lower from the most significant bit of the A data outputted from the register portion 181 and a renormalizing signal from the renormalization generator 182. When the renormalizing signal from the renormalization generator 182 indicates "prosecuting a normalization processing", and the MSB-1 signal is "1", for example, the last renormalization generator 183 outputs a last renormalizing signal. The last renormalization generator 183 comprises an AND circuit. When the MSB signal is "0" and the MSB-1 signal is "1", the AND circuit outputs "1" which indicates "the normalization processing will be completed by one more normalization processing".

Referring back to FIG. 17, an A selector 109 receives the A data from the A register 108 and a shift-up selection signal generated based on the last renormalizing signal. When the shift-up selection signal indicates "shift-up", the A selector 109 outputs a data which is obtained by shifting-up the A data from the A register 108 by one bit to the arithmetic calculator 107 as an A data which shows the width A of the effective area of the pixels which immediately precedes the target decoding pixel (an which immediately precedes A data). Otherwise, the A selector 109 outputs the A data from the A register 108 as it is to the arithmetic calculator 107 as an A data which shows the width A of the effective area of the pixels which immediately precedes the target decoding pixel (an which immediately precedes A data). The A selector 109, for example, as shown in FIG. 19, comprises a selector 191. The selector 191 has one input terminal A where the A data is received directly from the A register 108, and the other input terminal B where the A data from the A register 108 is received after the contents of the A data are shifted-up by one bit to the MSB side and its least significant bit is connected to an earth electric potential node. The selector 191 selects either one of the input terminal A and the input terminal B according to the shift-up selection signal, and connects it to the output terminal Y.

Figure 20:
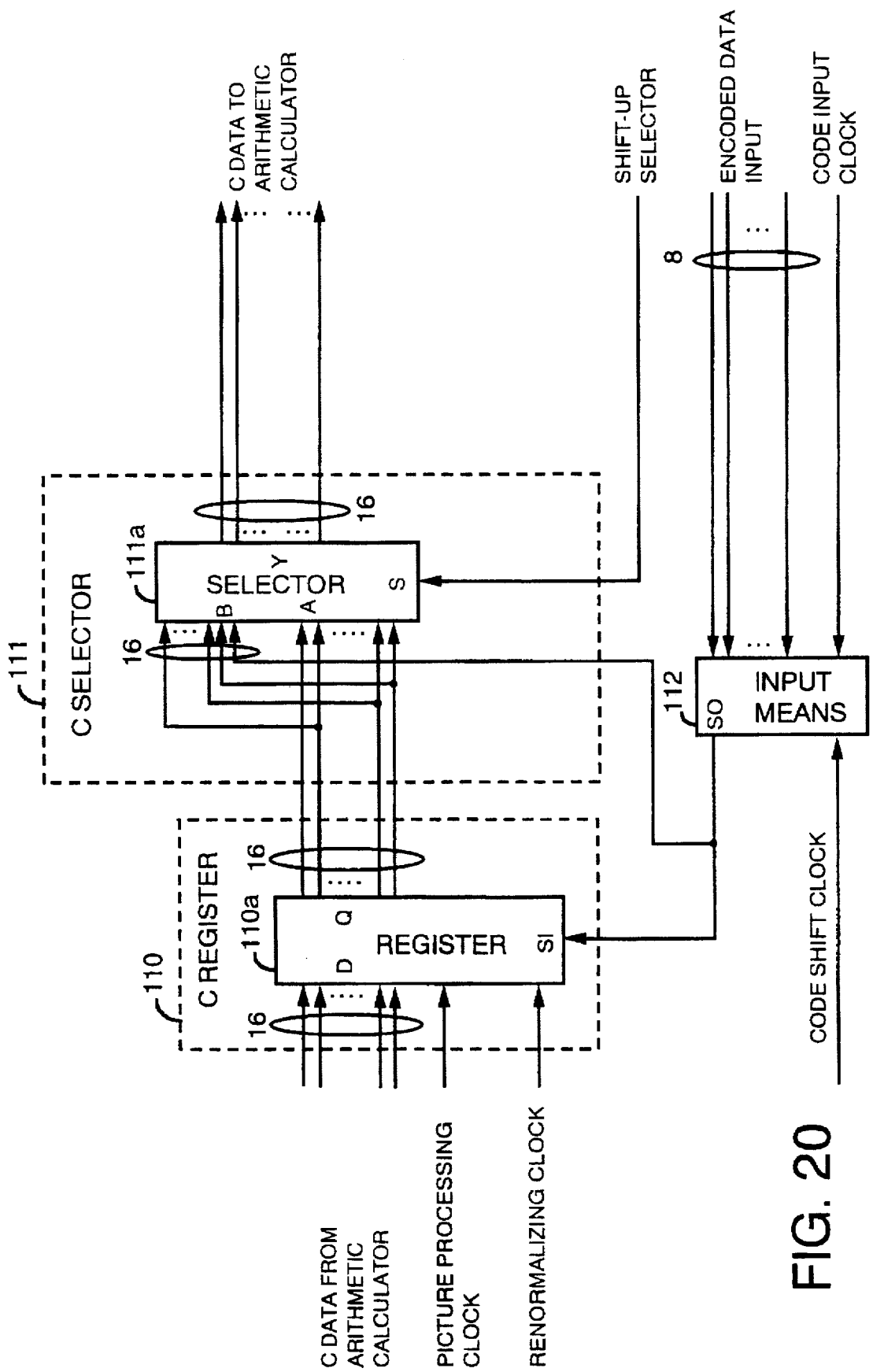
FIG. 20 is a block diagram showing an example of the C register 110 and the C selector 111 in the arithmetic calculator 107 according to the third through sixth embodiments of the present invention.

A C register 110 in FIG. 17 receives a C data from the arithmetic calculator 107, the pixel processing clock signal and a renormalizing clock signal. In synchronization with the inputted picture processing clock signal, the C register 110 receives the C data from the arithmetic calculator 107 and latches them. In synchronization with the inputted renormalizing clock signal, the C register shifts-up the latched data by one bit and latches them again, and outputs them as the C data. For example, as shown in FIG. 20, the C register takes-in the C data from the arithmetic calculator 107 and latches in synchronization with the inputted pixel processing clock signal, then shifts-up the latched data by one bit and latches it again in synchronization with the inputted renormalizing clock signal, and then outputs it as a C data. The C register 110 comprises a shift register 110a which comprises 16 latch portions, if the C data comprises 16 bits for example. The shift register 110a performs data writing (data renewal), each in synchronization with the pixel processing clock signal. The shift register 110a shifts-up the contents one bit in synchronization with a renormalizing clock signal. In other words, one bit of the coded data of the least significant bit is inputted and stored therein, while in the remaining bits, the contents latched in each bit is shifted-up by one bit, and written over therein. At initial state, the stored contents in the 16 latch portions are the inputted 16 bits coded data.

A C selector 111 receives a C data from the C register 110 and the shift-up selection signal. The C selector 111 outputs a data which is shifted-up by one bit from the C data, when the shift-up selection signal indicates "shift-up", and outputs a data as it is when the shift-up selection signal does not indicate "shift-up", to the arithmetic calculator 107 as a C data showing a decode word for the pixel which immediately precedes target decoding pixel (an which immediately precedes C data). Otherwise, the C data as transmitted from the C register 110 is given to the arithmetic calculator 107 as an which immediately precedes C data mentioned in the above. The C selector, as shown in FIG. 20, comprises a selector 111a, for example. The selector 111a has one input terminal A where the C data is received directly from the C register 110, and the other input terminal B where the C data from the C register 110 is received after the contents of this C data are shifted-up by one bit to the MSB side and one bit of the data to be coded is inputted to the least significant bit of this C data. The selector 111a selects either one of the input terminal A and the input terminal B according to the shift-up selection signal, and connects it to the output terminal Y.

An input means 112 receives an encoded data and a code input clock signal, and code shift clock signal. In synchronization with the inputted code input clock signal, the input means 112 latches the encoded data therein. In synchronization with the inputted code shift clock signal, the input means 112 shifts-up the encoded data latched therein, and outputs the contents of the most significant bit of the latched encoded data to the C register 110 and the C selector 111. For example, as shown in FIG. 20, if the inputted encoded data comprises eight bits, the input means 112 has eight latch portions. The eight latch portions take-in an 8-bit encoded data in parallel in synchronization with the inputted code input clock signal. The input means 112, which comprises a shift register and so on, outputs in serial the encoded data which is taken therein in parallel, in synchronization with the code shift clock signal.

A controller 113 in FIG. 17 receives a system clock signal, an identical context signal from the context comparator 106, a renormalizing signal and a last renormalizing signal from the A register 108. The controller 113 then outputs a pixel processing clock signal to the context generating circuit 102, the context storage device 103, the A register 108 and the C register 110. The controller 113 further outputs a renewal clock to the context table storage device 104 and a renormalizing clock signal to the A register 108 and the C register 110. The controller 113 further outputs a shift-up selection signal to the A selector 109 and the C selector 111, and a code input lock signal and the code shift signal to the input means 112. A kernel portion comprises the arithmetic calculator 107, the A register 108, the A selector 109, the C register 110 and the C selector 111 and the controller 113.

The pixel processing clock signal from the controller 113 is a signal showing a timing for processing the data for the target decoding pixel. The pixel processing clock signal is generated by the controller 113 according to a system clock signal, a renormalizing signal, a last renormalizing signal and an identical context signal, and synchronizes with a system clock signal. The pixel processing clock signal from the controller 113 maintains either one of the levels, when the renormalizing signal indicates "carrying out a normalization processing", and the last renormalizing signal does not indicate "normalization will be completed after one more normalization processing". The pixel processing clock signal from the controller 113 also maintains either one of the levels, when the renormalizing signal indicates "carrying out a normalization processing", the last renormalizing signal indicates "normalization will be completed after one more normalization processing", and the identical context signal indicates "identical context". Otherwise, the pixel processing clock signal from the controller 113 becomes the same signal as the system clock signal.

Figure 21:
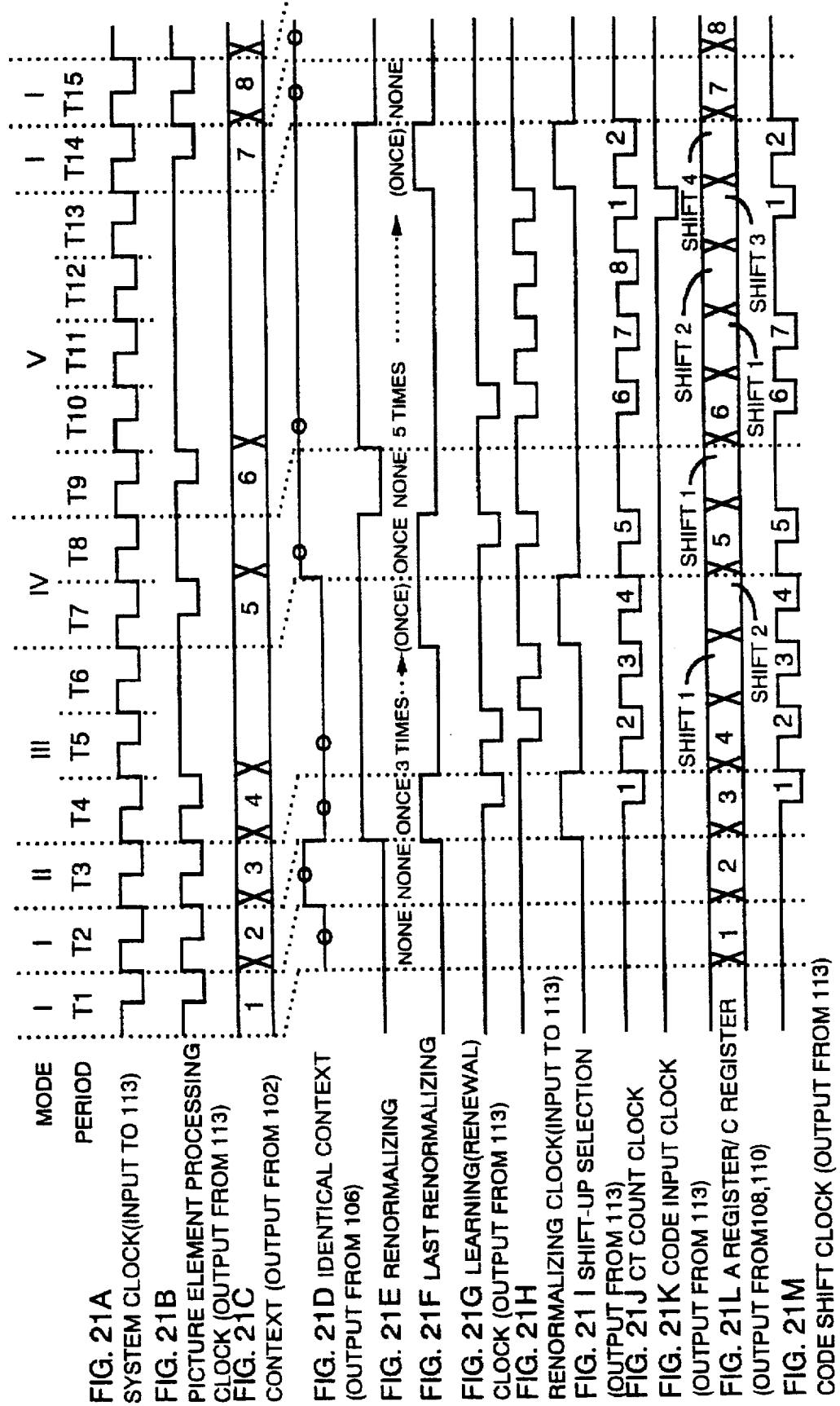
FIG. 21A through M are waveform diagrams showing signal waveforms in the main portions according to the third through sixth embodiments of the present invention.

For example, as shown in FIG. 21B, when the renormalizing signal (FIG. 21E) is "1" indicating "carrying out a normalization processing", and the last renormalizing signal (FIG. 21F) is "0", not indicating "normalization will be completed after one more normalization processing", (where "1" indicates "H" level and "0" indicates "L" level in this second embodiment in the below, except some specific cases), the pixel processing clock signal from the controller 113 becomes "H" level regardless of the system clock signal.

When the renormalizing signal is "1" indicating "carrying out a normalization processing", the last renormalizing signal is "1" indicating "normalization will be completed after one more normalization processing", and the identical context signal (FIG. 21D) is "1" indicating "identical context", the pixel processing clock signal from the controller 113 becomes "H" level regardless of the system clock signal. Otherwise, the pixel processing clock signal from the controller 113 becomes the same signal as the system clock signal.

The renormalizing signal shown in FIG. 21E is generated from the renormalizing signal from the A register 108 in synchronization with the system clock signal. It may be generated in the controller 113.

For example, based on the renormalizing signal from the A register 108, the renormalizing signal of FIG. 21E is generated so that it synchronizes with the rising edge of the system clock. In other words, the renormalizing signal of FIG. 21E is generated in order to decide whether the target decoding pixel is normalized or not at the subsequent timing of the system clock used when the context generator 102 takes-in a context for the target decoding pixel.

Similarly, the last renormalizing signal shown in FIG. 21F is generated from the last renormalizing signal from the A register 108 in synchronization with the system clock signal. It may be generated in the controller 113. For example, based on the last renormalizing signal from the A register 108, the last renormalizing signal of FIG. 21F is generated so that it synchronizes with the rising edge of the system clock. In other words, the last renormalizing signal of FIG. 21F is generated in order to specify the last normalizing signal at the subsequent timing of the system clock used when the context generator 102 takes-in a context for the target decoding pixel.

The shift-up selection signal from the controller 113 is generated in the controller 113 according to the last renormalizing signal from the A register 108, the system clock signal and the identical context signal, and synchronizes with the system clock signal. When the last renormalizing signal shown in FIG. 21F synchronized with the system clock signal indicates "normalization will be completed after one more normalization processing", and the identical context signal does not indicates "identical context", the shift-up selection signal indicates a "shift-up" state. Otherwise, the shift-up selection signal does not indicates the "shift-up" state.

For example, as shown in FIG. 21I, when the last renormalizing signal shown in FIG. 21F is "1", indicating "normalization will be completed after one more normalization processing", and the identical context signal shown in FIG. 21D is "0" which does not indicates "identical context", the shift-up selection signal becomes "1" indicating a "shift-up" state. Otherwise, the shift-up selection signal becomes "0" which does not indicates the "shift-up" state.

The renewal clock signal from the controller 113 is a signal showing a timing signal for renewing a storing data stored in the context table storage device 104. The renewal clock signal from the controller 113 is generated in the controller 113 according to a system clock signal, a pixel processing clock signal and a renormalizing signal. The renewal clock signal synchronizes with a system clock signal, and becomes the system clock signal when the renormalizing signal indicates "carrying out a normalization processing" in the next cycle of the system clock signal after the appearance of the pixel processing clock signal. Otherwise, the renewal clock signal maintains either one of the levels.

For example, as shown in FIG. 21G, when the rising of the pixel processing clock signal is detected and the renormalizing signal shown in FIG. 21E is "1" indicating "carrying out a normalization processing" at the rising of the system clock signal after the rising of the pixel processing clock signal is detected, the renewal clock signal becomes the same clock as that of the system clock. Otherwise, the renewal clock maintains "H" level, for example, regardless of the system clock.

The renormalizing clock signal, shown in FIG. 21H, from the controller 113 is a signal for shifting up the contents stored in the register portion 181 of the A register 108 and the C register 110. The renormalizing clock signal from the controller 113 is generated in the controller 113 according to a renormalizing signal and a last renormalizing signal from the A register 108, a system clock signal and an identical context signal, and synchronizes with the system clock signal. When the renormalizing signal indicates "carrying out a normalization processing", and the last renormalizing signal does not indicate "normalization will be completed after one more normalization processing", the renormalizing clock signal becomes the same clock as the system clock signal ("set"). When the renormalizing signal indicates "carrying out a normalization processing", the last renormalizing signal indicates "normalization will be completed after one more normalization processing", and the identical context signal indicates "identical context", the renormalizing clock signal becomes the same clock as the system clock signal ("set"). Otherwise, the renormalizing clock signal becomes in a clock halt state (maintaining either one of the levels or "reset"), as shown in FIG. 21H.

When the pixel processing clock signal outputs a clock synchronized with the system clock signal, the renormalizing clock signal maintains either one of the levels, and when the pixel processing clock signal maintains either one of the levels, the renormalizing clock signal outputs a clock synchronized with the system clock signal.

The encoded output clock signal from the controller 113 is a timing signal for taking-in the encoded data transmitted to the input means 112. The code output clock signal is generated in the controller 113 according to a renormalizing signal from the A register 108 and a system clock signal. When the renormalizing signal indicates "carrying out a normalization processing", the code output clock signal becomes the same clock signal as the system clock signal. Otherwise, the code output clock signal becomes a pulse, when a predetermined number of clocks of the CT count clock signal is counted, according to a CT count clock signal maintaining either one of the levels (FIG. 21J). For example, as shown in FIG. 21K, when the renormalizing signal is "1" indicating "carrying out a normalization processing", the code output clock signal first generates a count clock signal (for example, FIG. 21J) which becomes a system clock signal. When the number of the clocks of this count clock signal becomes eight, the code output clock signal becomes "L" level, for example, at the next cycle of the system clock signal.

The code shift clock signal from the controller 113 shows a timing signal for shifting up the encoded data latched in the input means 112 by one bit. The controller 113 generates a code shift clock signal from a renormalizing signal and a system clock signal from the A register 108. According to the CT count clock signal (FIG. 21J) and the code input clock signal (FIG. 21K), the code shift clock signal becomes the same clock signal as the CT count clock signal (for example, FIG. 21M), when the code input clock signal does not output any clock, namely, at "H" level in this case.

An operation of a digital signal decoding device having the above-mentioned configuration is explained below. In the same manner as the digital signal encoding device in the first embodiment, the operating mode of the digital signal decoding device is also divided into 5 modes, I–V, as shown in FIGS. 21A–M according to the transmitted encoded data. The operation in each mode is explained in the following using the waveforms shown in FIGS. 21A–M.

[mode I]

FIG. 21A shows an example of major signal waveform in the mode I in the periods $T_1$ and $T_2$ of the system clock signal. In the period $T_1$, a context for the target decoding pixel is not identical with the context for a pixel which is immediately subsequent to the target decoding pixel. In the period $T_2$, a context for the target decoding pixel is identical with the context for a pixel which is immediately subsequent to the target decoding pixel.

First, it is assumed that a decoding processing has been done for the first target decoding pixel during the period $T_1$ in the mode I. In the period $T_1$, a pixel processing clock signal is raised by the rise of the system clock. Receiving the rise of the pixel processing clock signal, the context generator 102 reads a context for the first target decoding pixel from the storage device 101 and outputs the read context to the reading address input nodes AR of the context table storage device 104.

The code 1 in FIG. 21C indicates that a context has been generated by the context generator 102 for the first target decoding pixels.

In the context table storage device 104, a 32-bit storing data, which is shown in the probability estimating table of FIG. 6, is read out according to the context inputted into the reading address input nodes AR, and then outputted from the data output nodes DO to the arithmetic calculator 107.

In the arithmetic calculator 107 (ref. FIG. 18), the calculator 173 generates a prediction conversion signal from the LSZ data from the context table storage device 104, the A data of the target decoding pixel which precedes the first target decoding pixel, and the C data of the target decoding pixel which precedes the first target decoding pixel, according to the above-mentioned equation (5).

At initial state, the A data comprises "1" in its most significant bit and "0" in the remaining bits. The contents of the C data is the same as the transmitted encoded data which comprises 16 bits.

When the prediction conversion signal matches with the prediction symbol, the picture data generator 171 stores, for example, the picture data "1" in the storage device 101 as the picture data for the first target decoding pixel, and when the prediction conversion signal does not match with the prediction symbol, the picture data generator 171 stores, for example, the picture data "0" in the storage device 101 as the picture data for the first target decoding pixel.

On the other hand, when the prediction conversion signal shows that the equation (5) is satisfied, the calculator 173 calculates an A data from an LSZ data from the context table storage device 104 and the A data of the target decoding pixel which precedes the first target decoding pixel, according to the above-mentioned equation (6). The calculated A data is outputted to the A register 108. The C data of the target decoding pixel which precedes the first target decoding pixel is outputted to the C register 110, according to the above-mentioned equation (7). When the prediction conversion signal shows that the equation (5) is not satisfied, the calculator 173 outputs the LSZ data from the context table storage device 104 to the A register 108 as an A data, according to the above-mentioned equation (8). The calculator 173 calculates a C data from the LSZ data from the context table storage device 104 and both A and C data of the target decoding pixel which precedes the first target decoding pixel, according to the above-mentioned equation (9). The calculated C data is outputted to the C register 110.

The A data and the C data calculated by the calculator 173 in this way are inputted to the register portion 181 of the A register 108 (ref. FIG. 19) and to the C register 110 (ref. FIG. 20) respectively, and stored therein (the stored contents in each register has been updated) on the rise of a pixel processing clock signal from the controller 113 (period $T_2$).

The A data which is stored in the register portion 181 of the A register 108 at this stage has a value larger than 0.5 in decimal number, since no renormalize processing is required in the mode I. Accordingly, the value of the most significant bit is "1", and a renormalizing signal "0" indicating "not carrying out a normalization processing" is outputted from renormalization generator 182 in the A register 108. The last renormalization generator 183 in the A register 108 then outputs a last renormalizing signal "0".

On the other hand, receiving a context of the second pixel from the context generator 102 and a context of the first target decoding pixel from the context storage device 103, the context comparator 105 outputs an "L" level identical context signal indicating that "the contexts do not match with each other" in the period $T_2$ as shown in FIG. 21D.

Accordingly, during this period $T_2$, the mode is recognized. Here, it is recognized that no renormalization is performed, and the contexts do not match with each other and the mode I in the period $T_1$ has been completed for the period $T_2$.

Since recognizing the renormalization is not required in the mode I in the period $T_1$ during the period $T_2$, operations from a context generation to the arithmetic calculation are carried out during the mode I in the next period of $T_2$.

Accordingly, receiving a renormalizing signal from the renormalization generator 182 of the A register 108, the controller 113 outputs the renewal clock signal and a renormalizing clock signal, both at "H" level, in the period $T_2$ as shown in FIG. 21G and H respectively, because the received renormalizing signal is at "L" level.

Receiving an "H" level renewal clock signal, the context table storage device 104 keeps its stored contents intact. Receiving an "H" level renormalizing clock signal, the register portion 181 of the A register 108 and the C register 110 does not shift-up the contents stored therein, and keep latching the received contents.

The code 1 in FIG. 21L indicates that the first pixels to be decoded are latched to the A register 108 and the C register 110.

Since the controller 113 maintains the renormalizing clock signal at "H" level, the CT count clock signal is maintained at "H" level too. The code input clock signal and the code shift clock from the controller 113 therefore, remains "H" level. Accordingly,the input means 112 neither takes-in an encoded data nor shifts-up the encoded data latched therein by one bit.

Accordingly, in the mode I in this period $T_1$, it takes only one clock (a cycle) of the system clock to carry out the procedures from a context generation to the arithmetic calculation for the target decoding pixel. The A data and the C data calculated by the arithmetic calculator 107 are stored in the A register 108 and the C register 110 respectively, and the storing data in the context table storage device 104 are not updated. As a result, substantial operating time in the period $T_1$ in the mode I takes no more than one clock of the system clock. Furthermore, the time spared for this one system clock substantially equals to the sum of the accessing time of the context table storage device 104 and that of the arithmetic calculator 107. This shortens the period of system clock, contributing to the high-speed processing.

An operation in the mode I in the period $T_2$ is explained below. It is assumed that the decoding processing has been completed for the second target decoding pixel in the operation in the mode I in the period $T_2$. The mode I in the period $T_2$ is different from the mode I in the period $T_1$ mentioned in the above only in that the context for the target decoding pixel does not match or match with the context for the subsequent target decoding pixel. The operation is the same as the mode I in the period $T_1$.

Accordingly, it takes only one clock (a cycle) of the system clock to carry out the procedures from the context generation by the context generator 102 to the arithmetic calculation by the arithmetic calculator 107 for the second target decoding pixel. The A data and the C data calculated by the arithmetic calculator 107 are stored in the A register 108 and the C register 110 respectively. The storing data in the context table storage device 104 are not updated. Accordingly, the input means 112 neither takes-in an encoded data nor shifts-up the encoded data latched therein by one bit.

As a result, the substantial operation is carried out only within one system clock in the mode I in the period $T_2$.

Furthermore, the time spared for this one system clock substantially equals to the sum of the accessing time of the context table storage device 104 and that of the arithmetic calculator 107. This shortens the period of system clock, contributing to the high-speed processing.

According to the above equation (5), the picture data, the result calculated by the arithmetic calculator 107, indicates "1", for example, when the prediction symbol matches with the prediction conversion signal which is generated from the LSZ data from the context table storage device 104, the A data of the target decoding pixel which precedes the first target decoding pixel, and the C data of the target decoding pixel which precedes the first target decoding pixel. When the prediction conversion signal does not match with the prediction symbol, the picture data indicates "0", for example. This picture data, the result calculated by the arithmetic calculator 107, is stored in the storage device 101 as a picture data for the second target decoding pixel.

In the same manner as the recognition of the mode I in the period $T_1$, the mode I in the period $T_2$ is also recognized during the period $T_3$, namely, the next clock following the clock in which the context generation is performed. By recognizing that no renormalization is performed and the contexts match with each other, the operation is performed from the context generation to the arithmetic calculation in the next mode, namely, the mode II in the period $T_3$.

[mode II]

FIG. 21A shows an example of each major signal waveform in the mode II in the period $T_3$ of the system clock signal. First, it is assumed that an encoding processing has been done for the third target decoding pixel in the mode II in the period $T_3$. In the period $T_3$, a pixel processing clock signal is raised by the rise of the system clock. Receiving the rise of the pixel processing clock signal, the context generator 102 reads a context for the third target decoding pixel from the storage device 101 and outputs the read context to the reading address input nodes AR of the context table storage device 104.

The code 3 in FIG. 21C indicates that a context has been generated by the context generator 102 for the third target decoding pixel.

In the context table storage device 104, a 32-bit storing data is read out according to the context inputted into the reading address input nodes AR, and then outputted from the data output nodes DO to the arithmetic calculator 107.

In the arithmetic calculator 107 (ref. FIG. 18), a prediction conversion signal is generated by the calculator 173 from the LSZ data from the context table storage device 104, the A data of the second target decoding pixel, and the C data of the second target decoding pixel according to the above-mentioned equation (5).

When the prediction conversion signal matches with the prediction symbol, the picture data "1" for example from the picture data generator 171 is stored in the storage device 101 as the picture data for the third target decoding pixel. When the prediction conversion signal does not match with the prediction symbol, the picture data "0", for example, from the picture data generator 171 is stored in the storage device 101 as the picture data for the third target decoding pixel.

On the other hand, when the prediction conversion signal shows that the equation (5) is satisfied, the calculator 173 calculates an A data according to an LSZ data from the context table storage device 104 and the A data of the second target decoding pixel, according to the equation (6). The calculated A data is then outputted to the A register 108. The C data of the second target decoding pixel is outputted to the C register 110 according to the above-mentioned equation (7). When prediction conversion signal shows that the equation (5) is not satisfied, the calculator 173 outputs the LSZ data from the context table storage device 104 to the A register 108 as an A data, according to the above-mentioned equation (8). The calculator 173 calculates a C data from the LSZ data from the context table storage device 104 and both A and C data of the second target decoding pixel, according to the above-mentioned equation (9). The calculated C data is outputted to the C register 110.

The A data and the C data calculated by the calculator 173 in this way are inputted to the register portion 181 of the A register 108 (ref. FIG. 19) and to the C register 110 (ref. FIG. 20) respectively, and stored therein (the stored contents in each register has been updated) on the rise of a pixel processing clock signal from the controller 113 (period $T_4$).

In the period $T_3$, since a renormalization processing is not required in the mode I in the period $T_2$, a renormalizing signal is at "L" level as shown in FIG. 21E, and a renewal clock signal and a renormalizing clock signal outputted from the controller 113 are at "H" level as shown in, FIGS. 21G and H respectively.

Receiving an "H" level renewal clock signal, the context table storage device 104 keeps its stored contents intact. Receiving an "H" level renormalizing clock signal, the register portion 181 of the A register 108 and the C register 110 shift up none of the contents stored therein, and keep them latched.

During the period $T_3$, since the controller 113 maintains the renormalizing clock signal to "H" level, the CT count clock signal is maintained to "H" level too. The code input clock signal and the code shift clock signal from the controller 113 therefore, remains "H" level. Accordingly, the input means 112 neither takes-in an encoded data nor shifts-up a data by one bit.

On the other hand, since one renormalization processing is required in the mode II, the A data calculated by the arithmetic calculator 107 and inputted in the register portion 181 of the A register 108 in the period $T_4$ has a value more than 0.25 and less than 0.5 in decimal number. Accordingly, the value of the most significant bit is "0", and the value which is one bit lower from the most significant bit is "1".

Accordingly, the renormalization generator 182 in the A register 108 outputs a renormalizing signal "1" indicating "carrying out a normalization processing", therefore, an "H" level renormalizing signal is obtained at the controller 113 in the period $T_4$, as shown in FIG. 21E.

The last renormalization generator 183 in the A register 108 outputs a last renormalizing signal "1" indicating "normalization will be completed after one more normalization processing". An "H" level last renormalizing signal is obtained at the controller 113 in the period $T_4$, as shown in FIG. 21F.

Receiving a context of the fourth pixel from the context generator 102 and a context of the third target decoding pixel from the context storage device 103, the context comparator 106 outputs an "L" level identical context signal indicating that "the contexts do not match with each other" during the period $T_4$ as shown in FIG. 21D.

Accordingly, the mode II is recognized in this period $T_4$, in which the contexts are not identical and one renormalization processing has to be performed.

By this recognition, a renormalization processing is performed in the period $T_4$ shown in FIGS. 21A~M. In other words, the storing data in the context table storage device 104 is updated, and the A data in the A register 108 and the C data in the C register 110 are respectively shifted-up by one bit.

In this third embodiment, the context table storage device 104 comprises a two port RAM, in which the stored contents can be read out and written over (updated) within one clock of the system clock. Also in this third embodiment, when the A selector 109 and the C selector 111 receive the "H" level in the shift-up selection signal, the A selector 109 and the C selector 111 respectively selects and outputs the data obtained by shifting up the A data and the C data latched in the A register 108 and in the C register 110 by one bit, respectively.

Accordingly in the third embodiment, the renormalization processing can be carried out in the first clock of the system clock in which the decoding processing for the next target decoding pixel is performed, that is in concrete, in the period $T_4$ in the mode III shown in FIG. 21A-M. This renormalization processing will be explained more in detail in the next explanation on the operation of the mode III.

Accordingly, in this mode II, it takes only one clock (a cycle) of the system clock to carry out the procedures from a context generation to the arithmetic calculation for the target decoding pixel. The A data and the C data calculated by the arithmetic calculator 107 are stored in the A register 108 and the C register 110 respectively. The renormalization processing is performed in the first clock of the system clock in which a decoding processing for the next target decoding pixel is performed.

As a result, substantial operation in the mode II is carried out only within one system clock. Furthermore, the time spared for this one system clock substantially equals to the sum of the accessing time of the context table storage device 104 and that of the arithmetic calculator 107. This shortens the period of system clock, contributing to the high-speed processing.

[mode III]

FIG. 21A shows examples of major signal waveforms in the mode III (it is assumed that the number of the renormalization processing is three) in the periods $T_4$~$T_6$ of the system clock signal.

First, it is assumed that a decoding processing has been done for the fourth target decoding pixel during the period $T_4$ in the mode III. In the period $T_4$, a pixel processing clock signal is raised by the rise of the system clock. Receiving the rise of the pixel processing clock signal, the context generator 102 reads the contexts for the fourth target decoding pixel from the storage device 101 and outputs the read context to the reading address input nodes AR in the context table storage device 104.

The code 4 in FIG. 21C indicates that a context has been generated by the context generator 102 for the fourth target decoding pixel.

In the context table storage device 104, a 32-bit storing data is read out according to the context inputted into the reading address input nodes AR, and outputted from the data output nodes DO to the arithmetic calculator 107.

On the other hand, since one renormalization processing is performed in the above-mentioned mode II, the controller 13 has therefore, receives "1" indicating "carrying out a normalization processing" from the renormalize generator 82 in the A register 108 and "1" indicating "normalization will be completed after one more normalization processing" from the last renormalization generator 183 in the A register 108, in the period $T_4$ of the first clock of the system clock in the mode III. The controller 13 therefore obtains a renormalizing signal and a last renormalizing signal, both "H" level, in the period $T_4$, respectively, as shown in FIGS. 21E and F. Also the controller 13 generates a shift-up selection signal which rises in response to the rise of the system clock as shown in FIG. 21I.

When the shift-up selection signal rises, receiving a shift-up selection signal indicating "normalization will be completed by the last one normalization processing", the A selector 109 selects the data obtained by shifting up the A data from the A register 108 by one bit, and also outputs it to the arithmetic calculator 107.

Similarly, receiving the shift-up selection signal, the C selector 111 selects the data obtained by shifting up the C data from the C register 110 by one bit, and outputs it to the arithmetic calculator 107. The least significant bit of this C data which is shifted-up by one bit will be the encoded data of the most significant bit which is outputted from the input means 112, and latched in the input means 112. In the following, the C data shifted-up by one bit means the data of this kind.

In other words, the A data and the C data latched in the A register 108 and the C register 110 respectively are shifted-up by one bit in the mode III in this period $T_4$.

The A data latched in the A register 108 and the C data latched in the C register 110 in this period $T_4$ are the results calculated in the mode II (period $T_3$) by the arithmetic calculator 107. In other words, since the renormalizing signal and also the last renormalizing signal become "H" level in the period $T_4$, a renormalizing clock signal becomes "H" level. Therefore, the contents stored in the A register 108 and the C register 110 are not shifted-up and kept unchanged. This state is shown in FIG. 21L. The code 3 in FIG. 21L indicates that the A register 108 and the C register 110 are latched for the third target decoding pixel.

In the arithmetic calculator 107 (ref. FIG. 18), a prediction conversion signal is generated by the calculator 173 according to the LSZ data from the context table storage device 104, the A data of the third target decoding pixel, namely, the A data shifted-up by one bit, and the C data of the third target decoding pixel, namely, the C data which has been shifted-up by one bit, according to the above-mentioned equation (5).

When the prediction conversion signal matches with the prediction symbol, the picture data "1" for example from the picture data generator 171 is stored in the storage device 101 as the picture data for the fourth target decoding pixel. When the prediction conversion signal does not match with the prediction symbol, the picture data "0" for example from the picture data generator 171 is stored in the storage device 101 as the picture data for the fourth target decoding pixel.

On the other hand, when the prediction conversion signal shows that the equation (5) is satisfied, the calculator 173 calculates an A data according to an LSZ data from the context table storage device 104 and the A data of the third target decoding pixel, namely, the A data shifted-up by one bit, according to the equation (6), and outputs the calculated A data to the A register 108. The calculator 173 outputs the C data of the third target decoding pixel, namely, the C data shifted-up by one bit, to the C register 110 according to the above-mentioned equation (7). When prediction conversion signal shows that the equation (5) is not satisfied, the calculator 173 outputs the LSZ data from the context table storage device 104 to the A register 108 as an A data, according to the above-mentioned equation (8) and also calculates a C data from the LSZ data from the context table storage device 104 and both the A data and the C data of the third target decoding pixel, namely, the A data and the C data shifted-up by one bit, according to the above-mentioned equation (9) and outputs the calculated C data to the C register 110.

The A data and the C data calculated by the calculator 173 in this way are inputted to the register portion 181 of the A register 108 (ref. FIG. 19) and to the C register 110 (ref. FIG. 20) respectively, and stored therein (the stored contents in each register has been updated) on the rise of a pixel processing clock signal from the controller 113 (period $T_5$).

In this period $T_4$, since the mode III requires one renormalization processing, receiving the rise of a pixel processing clock and "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 104 writes and stores a renewal data on the context table storage portion at the address based on the context from the context storage device 103, which is received in the writing address input nodes AW, namely, the context of the third target decoding pixel in the mode II.

This renewal data consists of a prediction symbol MPSUP from the arithmetic calculator 107 and a probability estimating data (LSZ data, NLPS data, NMPS data and SWITCH data) which is read out from the probability estimating table storage device 105 according to a probability estimation index STUP which indicates a status number from the arithmetic calculator 107.

The renewal data is explained with regard to a prediction symbol and a probability estimating data respectively in the following.

First, a prediction symbol as a renewal data is explained.

As shown in the arithmetic calculator 107 in FIG. 18, when a prediction conversion signal from the calculator 173 indicates that the equation (5) is satisfied, the prediction symbol generated by the prediction symbol/probability estimation index generator (renewal data generator) 172 has the same value as that of the prediction symbol of the prediction/ index data for the third target decoding pixel, regardless of the SWITCH data of the probability estimating data for the third target decoding pixel. When the prediction conversion signal indicates that the equation (5) is not satisfied, and the SWITCH data of the probability estimating data for the third target decoding pixel is "1", the prediction symbol has a value obtained by inverting the value of the prediction symbol of the prediction/index data for the third target decoding pixel. When the prediction conversion signal indicates that the equation (5) is not satisfied and the SWITCH data is "0", this prediction symbol has the same value as that of the prediction symbol of the prediction/index data for the third target decoding pixel.

A probability estimating data as a renewal data is explained below.

As shown in the arithmetic calculator 107 in FIG. 18, a probability estimation index (a status number) generated by the prediction symbol/probability estimation index generator 172 becomes an NMPS data of the probability estimating data for the third target decoding pixel, when a prediction conversion signal from the calculator 173 indicates that the equation (5) is satisfied. The probability estimation index becomes an NLPS data of the probability estimating data for the third target decoding pixel, when a prediction conversion signal indicates that the equation (5) is not satisfied.

The probability estimation index STUP from the arithmetic calculator 107, which is generated in the above-mentioned way, is inputted to the address input nodes A of the probability estimating table storage device 105.

Receiving the probability estimating index STUP, the probability estimating table storage device 105 outputs a probability estimating data, which consists of an LSZ data, NLPS data, NMPS data and SWITCH data corresponding to the received probability estimation index, to the context table storage device 104 according to the probability estimating table shown in FIG. 6 which is stored in the probability estimating table storage portion.

In this way, a prediction symbol MPSUP from the arithmetic calculator 107 and a renewal data consisting a probability estimating data from the probability estimating table storage device 105 are written on the context table storage portion of the context table storage device 104 at the address based on the context of the third target decoding pixel.

The controller 113 obtains a CT count clock signal which will be a clock as shown in FIG. 21J, and generates a code shift clock signal which synchronizes with the system clock signal, in the period $T_4$ as shown in FIG. 21M. Receiving the fall of this code shift clock signal, the input means 112 shifts-up the stored contents latched therein by one bit, and stores it again.

Since the code input clock signal remains "H" level as shown in FIG. 21K, the input means 112 however, does not newly takes-in an encoded data again.

Accordingly, in the period $T_4$ in this mode III, the procedures from a context generation to the arithmetic calculation for the fourth target decoding pixel, and a renormalization processing for the third target decoding pixel are carried out within one system clock (a cycle). In other words, the prediction/index data in the context table storage device 104 is updated and the A data latched in the A register 108 and the C data latched in the C register 110 are respectively shifted-up by one bit within one system clock (a cycle).

Since this mode III shows an example in which three renormalization s processing are required, the A data which is the resultant calculated by the arithmetic calculator 107 taken into the register portion 181 of the A register 108 in the period $T_5$ becomes a value more than "0.0625" and less than 0.125 in decimal number. Accordingly, the value of most the significant bit becomes "0", and the value which is one bit lower from the most significant bit becomes "0".

Accordingly, a renormalizing signal "1" indicating "carrying out a normalization processing" is outputted from the renormalization generator 182 in the A register 108. As shown in FIG. 21E, the controller 113 therefore obtains an "H" level renormalizing signal in the period $T_5$.

The last renormalization generator 183 in the A register 108 outputs a last renormalizing signal "0" indicating "normalization will not be completed after one more normalization processing". An "L" level last renormalizing signal is obtained at the controller 113 in the period $T_5$, as shown in FIG. 21F.

Receiving a context of the fifth pixel from the context generator 102 and a context of the fourth target decoding pixel from the context storage device 103, the context comparator 106 outputs an "L" level identical context signal indicating that "the contexts do not match with each other" during the period $T_5$ as shown in FIG. 21D.

Accordingly, the mode III is recognized in this period T5, in which the contexts are not identical and at least two renormalization processing has to be performed.

By this recognition, a renormalization processing is performed in the period $T_5$ shown in FIGS. 21A~M. In other words, the storing data in the context table storage device 104 is updated, and the A data in the A register 108 and the C data in the C register 110 are respectively shifted-up by one bit.

As mentioned above, in this period $T_5$, on the rise of a pixel clock signal triggered by the rise of a system clock, the A data and the C data calculated for the fourth target decoding pixel are inputted to the A register 108 and to the C register 110 respectively and latched therein. Receiving the rise of the pixel processing clock signal, the context generator 102 reads the context for the fifth target decoding pixel from the storage device 101 and outputs the read context to the reading address input nodes AR in the context table storage device 104 and to the context storage device 103.

The pixel processing cock signal however, maintains "H" level in this period $T_5$, since the renormalization generator 182 of the A register 108 outputs "1" indicating "carrying out a normalization processing" and the last renormalization generator 183 of the A register 108 outputs "0" indicating "normalization processing will not complete after one more normalization processing". As a result, the A register 108 and the C register 110 shift up none of the contents stored therein. The A data and the C data calculated for the fourth target decoding pixel remains to be latched in the A register 108 and the C register 110, respectively.

On the other hand, when the controller 113 receives "1" indicating "carrying out a normalization processing" from the renormalization generator 182 of the A register 108, the renormalizing clock signal generator is set, and the controller 113 therefore, outputs a renormalizing clock signal and a code shift clock signal both of which synchronize with the system clock signal.

Receiving the fall of this code shift clock signal, the input means 112 shifts-up the encoded data by one bit and latches it again.

Receiving the fall of the renormalizing clock signal, the A register 108 and the C register 110 shift-up the respective A data and C data latched therein by one bit, namely the A data and the C data for the forth target decoding pixel which are calculated by the arithmetic calculator 107 in the period $T_4$, and latch the respective data again.

Since the controller 113 receives "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 104 writes and stores a renewal data consists of a prediction symbol MPS UP from the arithmetic calculator 107 and a probability estimating data (LSZ data, NLPS data, NMPS data and SWITCH data) from the probability estimating table storage device 105, on the context table storage portion at the address based on the context from the context storage device 103, which is received in the writing address input nodes AW, namely, the context of the fourth target decoding pixel, in the same way as mentioned in the period $T_4$.

In this period $T_5$, the A data stored in the register portion 181 of the A register 108 has a value more than 0.125 and less than 0.25 in decimal number because it has been shifted-up by one bit. The value of the most significant bit is, however "0", and also that of the next bit is "0".

Accordingly, the renormalization generator 182 in the A register 108 outputs a renormalizing signal "1" indicating "carrying out a normalization processing", therefore, an "H" level renormalizing signal is obtained at the controller 113 in the period $T_6$, as shown in FIG. 21E.

The last renormalization generator 183 in the A register 108 outputs a last renormalizing signal "0" indicating "normalization will not be completed after one more normalization processing". An "L" level last renormalizing signal is obtained at the controller 113 in the period $T_6$, as shown in FIG. 21F.

This means that in the next period $T_6$, the A data and the C data latched in the A register 108 and the C register 110 respectively are shifted-up by one bit in a renormalization processing.

Accordingly in the period $T_6$, the renormalizing clock signal generator in the controller 113 is not reset because the controller 113 has received "0" indicating "normalization processing will not complete after one more normalization processing" from the last one renormalization generator 183 of the A register 108. The controller 113 therefore, outputs a renormalizing clock signal in synchronization with the system clock signal and a code shift clock signal in synchronization with the system clock signal.

Receiving the fall of this code shift clock signal, the input means 112 shifts-up the encoded data latched therein by one bit and latches the data again.

Receiving the fall of this renormalizing clock signal, the A register 108 and the C register 110 shift up the A data and the C data by one bit, which are shifted-up by one bit in the period $T_5$, respectively, and latch them again.

Since the last one renormalization generator 183 outputs "0" indicating "normalization processing will not complete after one more normalization processing", the pixel processing clock signal maintains "H" level even in this period $T_6$. Accordingly, the controller 113 maintains the renewal clock signal at "H" level as shown in FIG. 21G. As a result, the contents stored in the context table storage device 104 is not updated.

In this period $T_6$, the A data stored in the register portion 181 of the A register 108 has a value more than 0.25 and less than 0.5 in decimal number, because it has been shifted-up by one bit. The value of the most significant bit is, however "0", and the value which is one bit lower from the most significant bit is "1".

Accordingly, the renormalization generator 182 in the A register 108 outputs a renormalizing signal "1" indicating "carrying out a normalization processing", therefore, an "H" level renormalizing signal is obtained at the controller 113 in the period $T_7$, as shown in FIG. 21E.

The last renormalization generator 183 in the A register 108 outputs a last renormalizing signal "1" indicating "normalization will be completed after one more normalization processing". An "H" level last renormalizing signal is obtained at the controller 113 in the period $T_7$, as shown in FIG. 21F.

This means that in the next period $T_7$, the A data and the C data latched in the A register 108 and the C register 110 respectively, are shifted-up by one bit in a renormalization processing. This also means that the mode III is completed by the last one normalizing processing.

In other words, the last renormalization generator 183 in the A register 108 outputs "1" indicating "normalization will be completed after one more normalization processing". In the same manner as the operation in the mode II, the renormalization processing can be performed, at the first clock of the system clock in which a decoding processing for the next target decoding pixel is performed, namely, the period $T_7$ in the mode W shown in FIGS. 21A–M.

This renormalization processing will be explained more precisely in the following explanation on the operation in the mode IV.

Accordingly, in the mode III, for the renormalization processing which are required for three times, the procedures from a context generation to the arithmetic calculation for the target decoding pixel, take only one clock time (one cycle) of the system clock to carry out. The A data and the C data calculated by the arithmetic calculator 107, are stored in the A register 108 and the C register 110, respectively. The two renormalization processing need two clocks of the system clock to carry out. The last one renormalization processing is performed in the first clock of the system clock in which a decoding processing for the next target decoding pixel is performed. As a result, substantial operating time in the mode III needs only three clocks of the system clock.

In the period $T_4$–$T_6$, since the controller 113 maintains the renormalizing clock signal at "H" level, the CT count clock signal is maintained to the same clock signal as the system clock shown in FIG. 21J. Since the CT count clock signal lasts, however, during three clocks, the code output clock signal from the controller 113 remains "H" level. Accordingly, the input means 112 does not takes-in an encoded data.

[mode IV]

FIG. 21A shows an example of each major signal waveform in the mode IV in the period of $T_7$–$T_8$ of the system clock signal.

It is assumed that a decoding processing has been done for the fifth target decoding pixel in the mode IV. In the period $T_7$, the context generator 102 has already (in period $T_5$) read the context for the fifth target decoding pixel from the storage device 101 and has outputted the read context to the reading address input nodes AR of the context table storage device 104.

The code 5 in FIG. 21C shows that a context has been generated by the context generator 102 for the fifth target decoding pixel.

In the context table storage device 104, a 32-bit storing data is read out according to the context inputted into the reading address input nodes AR, and outputted from the data output nodes DO to the arithmetic calculator 107.

On the other hand, since the last renormalization processing is performed in the above-mentioned mode III in the period $T_6$, the controller 113 has therefore, receives "1" indicating "carrying out a normalization processing" from the renormalize generator 82 in the A register 108 and "1" indicating "normalization will be completed after one more normalization processing" from the last renormalization generator 183 in the A register 108, in the period $T_7$ of the first clock of the system clock in the mode IV, the controller 113 obtains a renormalizing signal and a last renormalizing signal, both "H" level, in the period $T_7$, respectively, as shown in FIGS. 21E and F. Also the controller 113 generates a shift-up selection signal which rises in response to the rise of the system clock as shown in FIG. 21L.

When the shift-up selection signal rises, receiving a shift-up selection signal indicating "normalization will be completed by the last one normalization processing", the A selector 109 selects the data obtained by shifting up the A data from the A register 108 by one bit, and also outputs it to the arithmetic calculator 107.

Similarly, receiving the shift-up selection signal, the C selector 111 selects the data obtained by shifting up the C data from the C register 110 by one bit, and outputs it to the arithmetic calculator 107.

In other words, the processing performed in this period $T_7$ is the same as the "shift-up" processing in the mode III in which the A data and the C data latched in the A register 108 and in the C register 110 respectively are shifted-up by one bit. As a result, three renormalization processing are performed in the mode III during the period $T_5$–$T_7$. The A data and the C data therefore outputted from the A selector 109 and from the C selector 111 respectively are those obtained by shifting-up the A data and the C data calculated for the fourth target decoding pixel in the period $T_4$ in the mode III by three bits. In other words, both the A data and the C data outputted from respective selectors become eight times as large as the A data and the C data calculated for the fourth target decoding pixel.

In the arithmetic calculator 107 (ref. FIG. 18), a prediction conversion signal is generated by the calculator 173 from the LSZ data from the context table storage device 104, the A data of the fourth target decoding pixel, namely, the A data shifted-up by three bits, and the C data of the fourth target decoding pixel, namely, the C data shifted-up by three bits, according to the above-mentioned equation (5).

When the prediction conversion signal matches with the prediction symbol, the picture data "1" for example from the picture data generator 171 is stored in the storage device 101 as the picture data for the fifth target decoding pixel. When the prediction conversion signal does not match with the prediction symbol, the picture data "0" for example from the picture data generator 171 is stored in the storage device 101 as the picture data for the fifth target decoding pixel.

On the other hand, when the prediction conversion signal shows that the equation (5) is satisfied, the calculator 173 calculates an A data according to an LSZ data from the context table storage device 104 and the A data of the fourth target decoding pixel, i.e. the A data calculated for the fourth target decoding pixel which is shifted-up by three bits, according to the equation (6). The calculated A data is then outputted to the A register 108. The C data of the fourth target decoding pixel, namely, the C data calculated for the fourth target decoding pixel which is shifted-up by three bits, is also outputted to the C register 110 according to the above-mentioned equation (7).

When the prediction conversion signal shows that the equation (5) is not satisfied, the calculator 173 outputs the LSZ data from the context table storage device 104 to the A register 108 as an A data according to the above-mentioned equation (8). The calculator 173 calculates a C data according to the LSZ data from the context table storage device 104 and both the A data and the C data of the fourth target decoding pixel, i.e. the A data and the C data calculated for the fourth target decoding pixel, both of which are shifted-up by three bits, according to the above-mentioned equation (9). The calculated C data is outputted to the C register 110.

The A data and the C data calculated by the calculator 173 in this way are inputted to the register portion 181 of the A register 108 (ref. FIG. 19) and to the C register 110 (ref. FIG. 20) respectively, and stored therein (the stored contents in each register has been updated) on the rise of a pixel processing clock signal from the controller 113 (period $T_8$).

Although the controller 113 receives "1" indicating "carrying out a normalization processing" from the renormalization generator 182 of the A register 108, the contents stored in the context table storage device 104 is not updated because the renewal clock signal maintains "H" level in the period $T_7$.

The controller 113 obtains a CT count clock signal which will be a clock as shown in FIG. 21J, and generates a code shift clock signal in synchronization with the system clock signal in the period $T_7$ as shown in FIG. 21M. Receiving the fall of this code shift clock signal, the input means 112 shifts-up the stored contents latched therein by one bit, and stores it again.

Accordingly, in the period $T_7$ in the mode IV, the procedures from a context generation to the arithmetic calculation for the fifth target decoding pixel, and a last renormalization processing for the fourth target decoding pixel are carried out within one system clock (a cycle). In other words, the processing which shifts-up the A data and the C data latched in the A register 108 and the C register 110, respectively, by one bit, are carried out within one system clock (one cycle).

Since this mode IV shows an example in which one renormalization processing is required, the A data stored in the register portion 181 of the A register 108, has a value more than 0.25 and less than 0.5 in decimal number. Accordingly, the value of its most significant bit becomes "0", and the value which is one bit lower from the most significant bit becomes "1".

Accordingly, a renormalizing signal "1" indicating "carrying out a normalization processing" is outputted from the renormalization generator 182. As shown in FIG. 21E, the controller 113 obtains an "H" level renormalizing signal in the period $T_8$.

The last renormalization generator 183 in the A register 108 outputs a last renormalizing signal "1" indicating "normalization will be completed after one more normalization processing". An "H" level last renormalizing signal is obtained at the controller 113 in the period $T_5$, as shown in FIG. 21F.

Receiving a context of the sixth pixel from the context generator 102 and a context of the fifth target decoding pixel from the context storage device 103, the context comparator 106, in the period $T_8$, outputs an "H" level identical context signal indicating that "the contexts match with each other" as shown in FIG. 21D.

Accordingly, the mode IV is recognized in this period $T_8$ in which the contexts are identical and one renormalization processing has to be performed.

By this recognition, a renormalization processing is performed in the period $T_8$ shown in FIGS. 21A–M. In other words, the storing data in the context table storage device 104 is updated, and the A data in the A register 108 and the C data in the C register 110 are respectively shifted-up by one bit.

As mentioned above, in this period $T_8$, on the rise of a pixel clock signal triggered by the rise of a system clock, the A data and the C data calculated for the fifth target decoding pixel are inputted to the A register 108 and to the C register 110 respectively and latched therein. Receiving the rise of the pixel processing clock signal, the context generator 102 reads the context for the sixth target decoding pixel from the storage device 101 and outputs the read context to the reading address input nodes AR in the context table storage device 104 and to the context storage device 103.

The pixel processing clock signal however, maintains "H" level in this period $T_8$, since the renormalization generator 182 of the A register 108 outputs "1" indicating "carrying out a normalization processing", the last renormalization generator 183 of the A register 108 outputs "1" indicating "normalization processing will be completed after one more normalization processing", and the identical context signal from the context comparator 106 shows that contexts are identical. As a result, the contents stored in the A register 108 and in the C register 110 are not updated. The A data and the C data calculated for the fifth target decoding pixel are continuously latched in the A register 108 and in the C register 110.

On the other hand, when the controller 113 receives "1" indicating "carrying out a normalization processing" from the renormalization generator 182 of the A register 108, the renormalizing clock signal generator is set, and the controller 113 therefore, outputs a renormalizing clock signal and a code shift clock signal both of which synchronize with the system clock signal.

Receiving the fall of this code shift clock signal, the input means 112 shifts-up the encoded data latched therein by one bit and latches the data again.

Receiving the fall of this renormalizing clock signal, the A register 108 and the C register 110 shift up the A data and the C data by one bit, which are calculated by the arithmetic calculator 107 in the period $T_8$ for the fifth target decoding pixel, respectively, and latch them again.

Since the controller 113 receives "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 104 writes and stores a renewal data on the context table storage portion at the address based on the context from the context storage device 103, which is received in the writing address input nodes AW, namely, the context of the fifth target decoding pixel, in the same way as mentioned in the period $T_4$. The renewal data consists of a prediction symbol from the arithmetic calculator 107 and a probability estimating data (LSZ data, NLPS data, NMPS data and SWITCH data) from the probability estimating table storage device 105.

In this period $T_8$, the A data stored in the register portion 181 of the A register 108 has a value more than 0.5 in decimal number, since it has been shifted-up by one bit. Accordingly, the value of the most significant bit becomes "1".

Accordingly, the renormalization generator 182 in the A register 108 outputs a renormalizing signal "0" indicating "not carrying out a normalization processing", therefore, an "L" level renormalizing signal is obtained at the controller 113 in the period $T_9$, as shown in FIG. 21E.

The last renormalization generator 183 in the A register 108 outputs a last renormalizing signal "0" indicating "normalization will not be completed after one more normalization processing". An "L" level last renormalizing signal is obtained at the controller 113 in the period $T_9$, as shown in FIG. 21F.

Accordingly, in the mode IV, it is meant that the renormalization processing has been already completed. For the renormalization processing which is required for once, the procedures from a context generation to the arithmetic calculation for the target decoding pixel, take only one clock time (one cycle) of the system clock to carry out. The A data and the C data calculated by the arithmetic calculator 107, are stored in the A register 108 and the C register 110, respectively. One renormalization processing takes one clock of the system clock to carry out. As a result, substantial operating time in the mode IV need only two clocks of the system clock.

In the period $T_7 \sim T_5$, the renormalizing signal shown in FIG. 21E is "H" level. The controller 113 therefore, makes the CT count clock signal the same clock signal as the system clock signal as shown in FIG. 21J. However, since the CT count clock holds two clocks and the number of the clocks and the total number of the clock accumulated from the preceding modes is 5, the code output clock signal from the controller 113 remains "H" level. Accordingly, the input means 112 neither takes-in nor outputs the contents stored in the C register 11.

[mode V]

FIG. 21A shows an example of each major signal waveform in the mode V, in the period of $T_9 \sim T_{13}$ of the system clock signal.

It is assumed that a decoding processing has been done for the sixth target decoding pixel in the mode V. In the period $T_9$, the context generator 102 has already read the context for the sixth target decoding pixel from the storage device 101. The read context is outputted to the reading address input nodes AR of the context table storage device 104.

The code 6 in FIG. 21C shows that a context has been generated by the context generator 102 for the sixth target decoding pixel.

In the context table storage device 104, a 32-bit storing data is read out according to the context inputted into the reading address input nodes AR, and outputted from the data output nodes DO to the arithmetic calculator 107.

On the other hand, since the processing has been already completed in the above-mentioned mode IV in the period $T_8$, the controller 113 obtains a renormalizing signal of "L" lever, and a last renormalizing signal, as shown in FIGS. 21E and F respectively, and no renormalization processing is performed.

In the period $T_8$, since the pixel processing clock signal maintains "H" level, the pixel processing clock signal remains "H" level, even if the system clock rises in the period $T_9$. The A data and the C data latched in the register 8 and in the C register 110 are those obtained by shifting-up the A data and the C data by one bit, both of which are calculated in the period $T_7$, for the fifth target decoding pixel, and latched in the period $T_8$.

In the arithmetic calculator 107 (ref. FIG. 18), a prediction conversion signal is generated by the calculator 173 from the LSZ data from the context table storage device 104, the A data of the fifth target decoding pixel and the C data of the fifth target decoding pixel, according to the above-mentioned equation (5).

When the prediction conversion signal matches with the prediction symbol, the picture data "1" for example from the picture data generator 171 is stored in the storage device 101 as the picture data for the sixth target decoding pixel. When the prediction conversion signal does not match with the prediction symbol, the picture data "0" for example from the picture data generator 171 is stored in the storage device 101 as the picture data for the sixth target decoding pixel.

On the other hand, when the prediction conversion signal shows that the equation (5) is satisfied, the calculator 173 calculates an A data from the LSZ data from the context table storage device 104 and the A data of the fifth target decoding pixel, namely, the A data shifted-up by one bit, according to the above-mentioned equation (6). The calculated A data is outputted to the A register 108. The C data of the fifth target decoding pixel, namely, the C data shifted-up by one bit, is outputted to the C register 110, according to the above-mentioned equation (7).

When prediction conversion signal shows that the equation (5) is not satisfied, the calculator 173 outputs the LSZ data from the context table storage device 104 to the A register 108 as an A data, according to the above-mentioned equation (8).

The calculator 173 also calculates a C data from the LSZ data from the context table storage device 104 and both the A data and the C data of the fifth target decoding pixel, namely, the A data and C data shifted-up by one bit respectively, according to the above-mentioned equation (9). The calculated C data is outputted to the C register 110.

The A data and the C data calculated by the calculator 173 in this way are inputted to the register portion 181 of the A register 108 (ref. FIG. 19 and to the C register 110 (ref. FIG. 20) respectively, and stored therein (the stored contents in each register has been updated) on the rise of a pixel processing clock signal from the controller 113 (period $T_{10}$).

On the other hand, since the renewal clock signal from the controller 113 maintains "H" level as shown in FIG. 21G, the contents stored in the context table storage device 104 is not updated.

Since this mode V shows an example in which five renormalization processing are required, the A data stored in the register portion 181 of the A register 108, has a value more than 0.15625 and less than 0.03125 in decimal number. Accordingly, the value of its most significant bit becomes "0", and the value which is one bit lower from the most significant bit becomes "0".

Accordingly, a renormalizing signal "1" indicating "carrying out a normalization processing" is outputted from the renormalization generator 182 in the A register 108. As shown in FIG. 21E, the controller 113 obtains an "H" level renormalizing signal in the period $T_{10}$.

The last renormalization generator 183 in the A register 108 outputs a last renormalizing signal "0" indicating "normalization will not be completed after one more normalization processing". An "L" level last renormalizing signal is obtained at the controller 113 in the period $T_{10}$, as shown in FIG. 21F.

Receiving a context of the seventh pixel from the context generator 102 and a context of the sixth target decoding pixel from the context storage device 103, the context comparator 106 outputs an "H" level identical context signal indicating that "the contexts match with each other" during the period $T_{10}$ as shown in FIG. 21D.

Accordingly, the mode V is recognized in this period $T_{10}$ in which the contexts are not identical and at least one renormalization processing has to be performed.

By this recognition, a renormalization processing is performed in the period $T_{10}$ shown in FIGS. 21A~M. In other words, the storing data in the context table storage device 104 is updated, and the A data in the A register 108 and the C data in the C register 110 are respectively shifted-up one bit.

As mentioned above, in this period $T_{10}$, at the rise of a pixel clock signal triggered by the rise of a system clock, the A data and the C data calculated for the sixth target decoding pixel are inputted to the A register 108 and to the C register 110 respectively and latched therein. Receiving the rise of the pixel processing clock signal, the context generator 102 reads the context for the seventh target decoding pixel from the storage device 101 and outputs the read context to the reading address input nodes AR in the context table storage device 104 and to the context storage device 103.

The pixel processing clock signal however, maintains "H" level in this period $T_{10}$, since the renormalization generator 182 of the A register 108 outputs "1" indicating "carrying out a normalization processing", and the last one renormalization generator 183 of the A register 108 outputs "0" indicating "normalization processing will not complete after one more normalization processing". As a result, the A register 108 and the C register 110 shift none of the contents stored therein. The A data and the C data calculated for the sixth target decoding pixel remains to be latched in the A register 108 and the C register 110, respectively.

On the other hand, when the controller 113 receives "1" indicating "carrying out a normalization processing" from the renormalization generator 182 of the A register 108, the renormalizing clock signal generator is set, and the controller 113 therefore, outputs a renormalizing clock signal and a code shift clock signal both of which synchronize with the system clock signal.

Receiving the fall of this code shift clock signal, the input means 112 shifts-up the encoded data latched therein by on bit, and latched it again.

Receiving the fall of this renormalizing clock signal, the A register 108 and the C register 110 shift up the A data and the C data by one bit, which are calculated by the arithmetic calculator 107 in the period $T_9$ for the sixth target decoding pixel, respectively, and latch them again.

Since the controller 113 receives "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 104 writes and stores a renewal data from the arithmetic calculator 107, which consists of a prediction symbol MPSUP and a probability estimating data (LSZ data, NLPS data, NMPS data and SWITCH data) from the probability estimating table storage device 105, on the context table storage portion at the address based on the context from the context storage device 103, which is received in the writing address input nodes AW, namely, the context of the target decoding pixel for the sixth in this mode V.

In this period $T_{10}$, the A data stored in the register portion 181 of the A register 108 has a value more than 0.03125 and less than "0.0625" in decimal number because it has been shifted-up by one bit. The value of the most significant bit is however "0", and the value which is one bit lower from the most significant bit is "0".

Accordingly, the renormalization generator 182 in the A register 108 outputs a renormalizing signal "1" indicating "carrying out a normalization processing", therefore, an "H" level renormalizing signal is obtained at the controller 113 in the period $T_{11}$, as shown in FIG. 21E.

The last renormalization generator 183 in the A register 108 outputs a last renormalizing signal "0" indicating "normalization will not be completed after one more normalization processing". An "L" level last renormalizing signal is obtained at the controller 113 in the period $T_{11}$, as shown in FIG. 21F.

This means that in the period $T_{11}$, the A data and the C data latched in the A register 108 and the C register 110 respectively are shifted-up by one bit in a renormalization processing.

Accordingly in the period $T_{11}$, when the controller 113 receives "0" indicating "normalization processing will not complete after one more normalization processing" from the last renormalization generator 183 of the A register 108, the renormalizing clock signal generator in the controller 113 is not reset, the controller 113 therefore outputs a renormalizing clock signal in synchronization with the system clock signal.

Receiving the fall of this code shift clock signal, the input means 112 shifts-up the encoded data latched therein by one bit and latches the data again.

Receiving the fall of this renormalizing clock signal, the A register 108 and the C register 110 shift up the A data and the C data by one bit, which are shifted-up by one bit in the period $T_{10}$, respectively, and latch them again.

Since the controller 113 maintains the renewal clock signal at "H" level in this period $T_{11}$, the contents stored in the context table storage device 104 is not updated.

In this period $T_{11}$, the A data stored in the register portion 181 of the A register 108 has a value more than "0.0625" and less than 0.125 in decimal number, because it has been shifted-up by one bit. The value of the most significant bit is however "0", and the value which is one bit lower from the most significant bit is also "0".

Accordingly, a renormalizing signal "1" indicating "carrying out a normalization processing" is outputted from the renormalization generator 182 in the A register 108. An "H" level renormalizing signal is obtained in the controller 113 in the period $T_{12}$, as shown in FIG. 21E.

A last renormalizing signal "0" indicating "normalization will not be completed after one more normalization processing" is outputted from the last one renormalization generator 183 in the A register 108. An "L" level last renormalizing signal is obtained in the controller 113 in the period $T_{12}$, as shown in FIG. 21F.

This means that in the next period $T_{12}$, the A data and the C data latched in the A register 108 and the C register 110 respectively are shifted-up by one bit in a renormalization processing.

Accordingly in the period $T_{12}$, the renormalizing clock signal generator in the controller 113 is not reset because the controller 113 has received "0" indicating "normalization processing will not complete after one more normalization processing" from the last one renormalization generator 183 in the A register 108. The controller 113 therefore, outputs a renormalizing clock signal in synchronization with the system clock signal.

In this period $T_{12}$, the number of the counts of the CT count clock signal is 8 as shown in FIG. 21J. In the third embodiment, the number of the bits of the encoded data for transmission is also 8. Accordingly, the controller 113 maintains the code system clock signal at "H" level, instead of synchronizing it with the system clock signal, and synchronizes the code input clock signal with the system clock signal.

Receiving the fall of this code input clock signal, the input means 112 takes-in the transmitted eight bit encoded data, writes it over the old encoded data, and stores it therein.

When the fall of this renormalizing clock signal is received by the A register 108 and the C register 110, the A data and C data latched therein, namely, the A data and C data already shifted-up by one bit in the period $T_{11}$, are again shifted-up by one bit, and latched again in the A register 8 and the C register 10 respectively.

Since the controller 113 maintains the renewal clock signal at "H" level in this period T12 as shown in FIG. 21G, the contents stored in the context table storage device 104 is not updated.

In this period $T_{12}$, the A data stored in the register portion 181 of the A register 108 has a value more than 0.125 and less than 0.25 in decimal number, because it has been shifted-up by one bit. The value of the most significant bit is however, "0", and the value which is one bit lower from the most significant bit is also "0".

Accordingly, a renormalizing signal "1" indicating "carrying out a normalization processing" is outputted from the renormalization generator 182 in the A register 108. An "H" level renormalizing signal is obtained in the controller 113 in the period $T_{13}$, as shown in FIG. 21E.

A last renormalizing signal "0" indicating "normalization will not be completed after one more normalization processing" is outputted from the last renormalization generator 183 in the A register 108. An "L" level I last renormalizing signal is obtained in the controller 113 in the period $T_{13}$ as shown in FIG. 21F.

This means that in the period $T_{13}$, the A data and the C data latched in the A register 108 and the C register 110 respectively, are shifted-up by one bit in a renormalization processing.

Accordingly in the period $T_{13}$, the renormalizing clock signal generator in the controller 113 is not reset because the controller 113 has received "0" indicating "normalization processing will not complete after one more normalization processing" from the last renormalization generator 183 of the A register 108. The controller 113 therefore, outputs a renormalizing clock signal and a code shift clock signal, both of which synchronize with the system clock signal. Receiving the fall of this code shift clock signal, the input means 112 shifts-up the encoded data latched therein by one bit and latches the data again. When the fall of this renormalizing clock signal is received by the A register 108 and the C register 110, the A data and C data latched therein, namely, the A data and C data already shifted-up by one bit in the period $T_{12}$, are again shifted-up by one bit, and latched again in the A register 8 and the C register 10 respectively. Since the controller 113 maintains the renewal clock signal at "H" level in this period $T_{13}$ as shown in FIG. 21G, the contents stored in the context table storage device 104 is not updated.

In this period $T_{13}$, the A data stored in the register portion 181 of the A register 108 has a value more than 0.25 and less than 0.5 in decimal number, because it has been shifted-up by one bit. Accordingly, the value of the most significant bit is "0", and the value which is one bit lower from the most significant bit is "1". Accordingly, a renormalizing signal "1" indicating "carrying out a normalization processing" is outputted from the renormalization generator 182 in the A register 108. An "H" level renormalizing signal is obtained in the controller 113 in the period $T_{14}$, as shown in FIG. 21E.

The last renormalization generator 183 in the A register 108 outputs a last renormalizing signal "1" indicating "normalization will be completed after one more normalization processing". An "H" level last renormalizing signal is obtained at the controller 113 in the period $T_{14}$, as shown in FIG. 21F.

This means that in the period $T_{14}$, the A data and the C data latched in the A register 108 and the C register 110 respectively are shifted-up by one bit in a renormalization processing. This also means that the mode V is completed by the last one normalizing processing.

In other words, since the last one renormalization generator 183 has outputted "1" indicating "normalization will be completed after one more normalization processing", the renormalization processing is completed in the first clock of the system clock in which an encoding processing for the next target decoding pixel is performed, namely, the period $T_{14}$ shown in FIGS. 21A~M.

In other words, receiving the rise of the system clock in the period $T_{14}$, the controller 113 obtains a renormalizing signal and a last renormalizing signal, both "H" level, as shown in FIGS. 21E and F, respectively, and generates a shift-up selection signal, which rises receiving the rise of the system clock as shown in FIG. 21I.

When the shift-up selection signal rises, receiving a shift-up selection signal indicating "normalization will be completed by the last one normalization processing", the A selector 109 selects the data obtained by shifting up the A data from the A register 108 by one bit, and also outputs it to the arithmetic calculator 107.

Similarly, receiving the shift-up selection signal, the C selector 111 selects the data obtained by shifting up the C data from the C register 110 by one bit, and outputs it to the arithmetic calculator 107.

In other words, the processing performed in this period $T_{14}$ is the same as the "shift-up" processing in the mode V in which the A data and the C data latched in the A register 108 and in the C register 110 respectively are shifted-up by one bit. As a result, five renormalization processing are performed in the mode V during the periods $T_{10}$-$T_{14}$. The A data and the C data which are outputted from the A selector 109 and from the C selector 111 are the same as those obtained from the A data and the C data, respectively, calculated for the sixth target decoding pixel in the period $T_9$ in the mode V by shifting up them five bits.

Accordingly, in the mode V, for the renormalization processing which are required for five times, the procedures from a context generation to the arithmetic calculation for the target decoding pixel, take only one clock time (one cycle) of the system clock to carry out. The A data and the C data calculated by the arithmetic calculator 107, are stored in the A register 108 and the C register 110, respectively. The four renormalization processing need four clocks of the system clock to carry out. The last one renormalization processing is performed in the first clock of the system clock in which a decoding processing for the next target decoding pixel is performed. As a result, substantial operating time in the mode V needs only five clocks of the system clock.

In the periods $T_{10}$-$T_{13}$, since the controller 113 maintains the renormalizing clock signal to "H" level, the CT count clock signal is maintained to the same clock signal as the system clock shown in FIG. 21J. The controller 113 outputs the four CT count clock signals.

Accordingly, since there are five total clocks until the mode V, when the controller 113 counts the same number of the bits of the encoded data for transmission, namely, eight bits in this third embodiment, the controller 113 outputs a code input clock signal, which becomes "L" level in synchronization with the next system clock as shown in FIG. 21K.

In this third embodiment, receiving the falling code input clock signal to the "L" level from the controller 113, the input means 112 takes-in the all transmitted eight bits encoded data in parallel, and latches them again.

In conclusion, with regard to the digital signal decoding device having the above mentioned configuration, the number of the processing clocks of the system clock signal is as follows. In the mode I where there is no renormalization, in other words, no normalization processing is required because the A data for a target decoding pixel is equal or more than 0.5 in decimal number, the number of the processing clocks is one. In the mode II where a renormalization is performed, in other words, a normalization processing is required because the A data for a target decoding pixel is less than 0.5 in decimal number, the context for the target decoding pixel does not match with the context for the pixel which is immediately subsequent to the target decoding pixel, and renormalization occurs once, the number of the processing clocks is one. In the mode III where a renormalization is performed, the context for a target decoding pixel does not match with the context for a pixel which is immediately subsequent to the target decoding pixel, and renormalization occurs more than once, the number of the processing clocks is the same as that of the renormalization processing.

In the mode IV where a renormalization is performed, the context for a target decoding pixel matches with the context for a pixel which is immediately subsequent to the target decoding pixel, and renormalization occurs once, the number of the processing clocks is two.

In the mode V where a renormalization is performed, the context for a target decoding pixel matches with the context for a pixel which is immediately subsequent to the target decoding pixel, and renormalization occurs more than once, the number of the processing clocks is the same as that of the renormalization processing.

In other words, in the mode II, III and V, the last renormalization processing is performed together with the processing for the next target decoding pixel at the first clock of the system clock for processing the next target decoding pixel. Therefore, it is possible to substantially reduce the processing time as much as one clock, and speed up the decoding processing.

With regard to the digital signal decoding device formed in the above-mentioned way, it is expected that the processing mode for the most of the target decoding pixel will be mode II in case of the worst compression ratio for decoding (compression ratio is almost 1). Even in this case, the operation time takes substantially no more than one clock of the system clock to complete the processing for the most of the target decoding pixel. Accordingly, this can speed up the decoding processing. Furthermore, the time spared for this one system clock substantially equals to the sum of the accessing time of the context table storage device 104 and that of the arithmetic calculator 107. This shortens the period of system clock, contributing to the high-speed processing.

Furthermore, the encoded data encoded by the digital signal encoding device explained in the first embodiment is decoded in real time. Accordingly, the capacity of a storage for accumulating the transmitted encoded data, namely, the input means 112, is made smaller. As a result, a semiconductor integrated circuit device comprising the digital signal decoding device can be made smaller and manufactured in a low cost.

Embodiment 4

Figure 22:
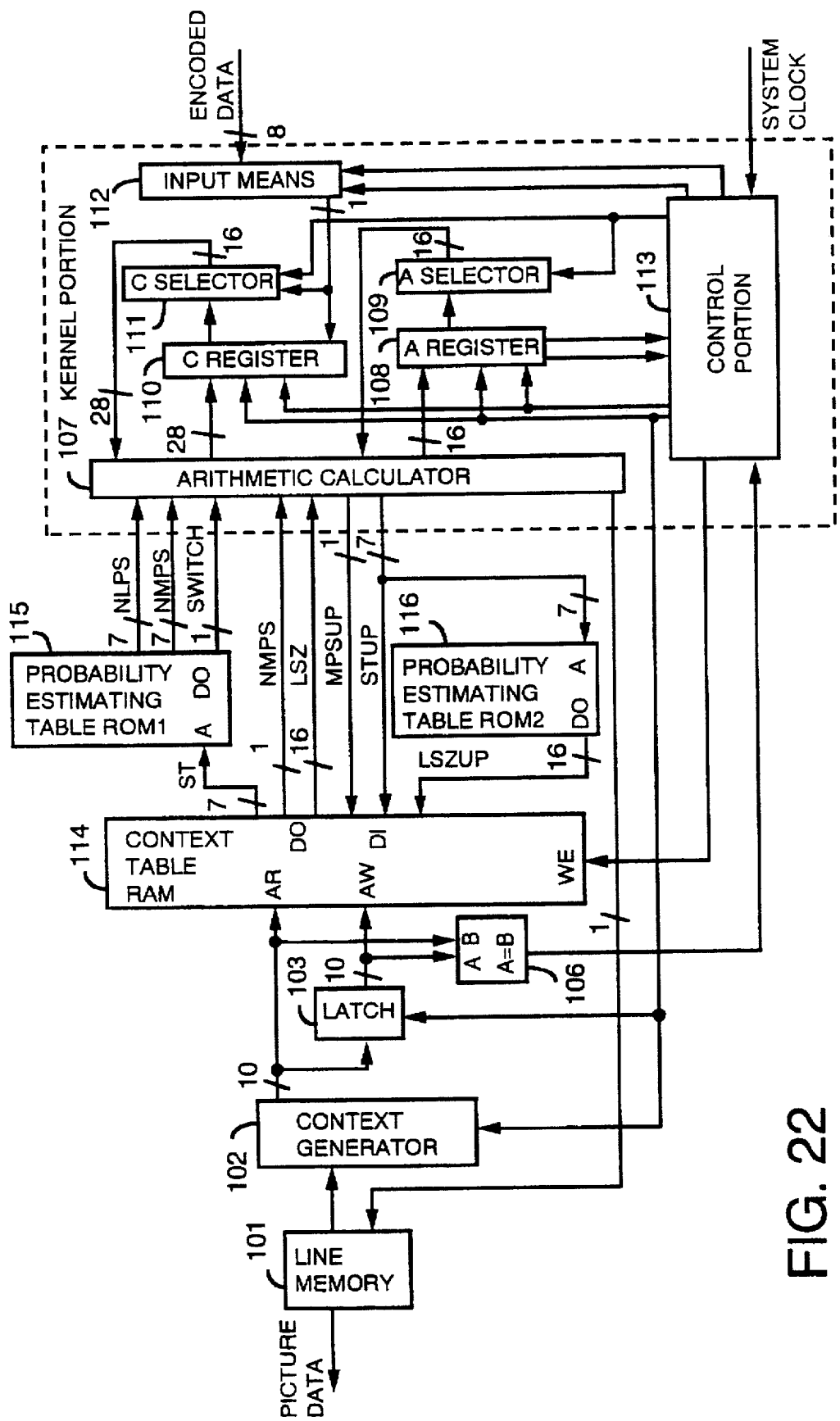
FIG. 22 is a block diagram showing a fourth embodiment of the present invention.

FIG. 22 shows a fourth embodiment of the present invention. Only the following points are different from the third embodiment, and the rest is the same as that of the third embodiment.

First, the contents stored in the context table storage portion of the context table storage device 104 is a prediction symbol, a prediction/index data indicating a probability estimation index and an LSZ data which constitutes the first portion of the probability estimating data in this fourth embodiment, while in the third embodiment, it is a prediction symbol and a probability estimating data.

Second, according to the above-mentioned first difference, a first and a second probability estimating table storage device 115, 116 are provided in this fourth embodiment, instead of the probability estimating table storage device 105 in the third embodiment.

The following explanation focuses on these differences.

In FIG. 22, the same reference numbers as those in FIG. 17 refer to the same or corresponding portions as those in FIG. 17. A context table storage device 114 comprises a plurality of reading address input nodes AR, a plurality of data output nodes DO, a plurality of a writing address input nodes AW, a plurality of input nodes DI, a write-enable signal input node WE, and a context table storage portion which is capable of reading and writing, where a plurality of storing data comprising a plurality of bits are stored. The storing data comprises a prediction/index data including a prediction symbol and a probability estimation index and an LSZ data which constitutes a first part of a probability estimating data, indicating a mismatching probability. The context table storage device 114 reads out the storing data stored in the context table storage portion based on the context which is received into the reading address input nodes AR from a context generator 102, and then outputs from the data output nodes DO. Receiving a renewal clock signal on the write-enable signal input node WE, the context table storage device 114 writes the prediction/index data and a renewal data having the first portion of the probability estimating data, which are inputted from the data input nodes DI (rewrite the renewal data over previously stored data) in the context table storage portion, which is based on the context received on the writing address input nodes AW from a context storage device 103.

Of all the storing data which is outputted from the data output nodes DO, a prediction symbol MPS in the prediction/index data and the LSZ data which constitutes the first portion of the probability estimating data are directly outputted to an arithmetic calculator 107.

The number of the reading address input nodes AR and that of the writing address input nodes AW are 10, if a context comprises 10 bits.

The following is an example of the number of bits of each data constituting a storing data in this fourth embodiment. The prediction symbol of the prediction/index data comprises 1 bit. The probability estimation index in the prediction/index data comprises 7 bits. The LSZ data which constitutes the first portion of the probability estimating data comprises 16 bits. The storing data as a whole then comprises 24 bits.

At the initial state, "0" is written in all the bits in the storing data. They are updated according to the necessity of the renormalize processing. FIGS. 14A, B show how the storing data is stored, which is the same as the stored contents in the context table storage device 14 shown in the second embodiment.

The above-mentioned renewal data is the same as the above-mentioned storing data. It is a 24-bit data comprising a 1-bit prediction symbol MPSU and a 7-bit probability estimation index (indicates a status number) which constitutes a prediction/index data and a 16-bit LSZ data which constitutes the first portion of the probability estimating data.

The number of the data output nodes DO and that of the data input nodes DI are 24, if the storing data and the renewal data respectively comprise 24 bits.

The context table storage device 114 is able to store the storage data as much as the number of the address designated by the context. For example, if the context comprises 10 bits, storage data of $2^{10}$ is stored in the context table storage portion.

The context table storage device 114 comprises a two port RAM having a context table storage portion as shown in FIG. 4. This context table storage portion comprises 1024 (1k) of lines, and each one line (1address) comprises 24 bits.

A first probability estimating table storage device 115 comprises a plurality of address input nodes A, a plurality of data output nodes DO, and a probability estimating table storage portion. The probability estimating table storage portion for storing a plurality of a second portion of a probability estimating data is based on the probability table recommend by the ITU (International Telecommunication Union) recommendation T. 82. The second portion of the probability estimating data consists of the data other than the LSZ data, namely an NLPS data and an NMPS data. The first probability estimating table storage device 115 receives a probability estimation index ST which indicates a status number in the prediction/index data from the above-mentioned context table storage device 114 on the address input nodes A. The first probability estimating table storage device 115 reads out the second portion of the probability estimating data which is stored in the probability estimating table storage portion corresponding to the address based on the received probability estimation index. The first probability estimating table storage device 115 outputs a mad-out data from the data output nodes DO to the arithmetic calculator 107. The first probability estimating table storage device 115 comprises a ROM and so on.

The number of the address input nodes A is 7, if the probability estimation index in the prediction/index data stored in the context table storage device 114 comprises 7 bits. The probability estimation index ST to be inputted corresponds to the address in the probability estimating table storage portion.

FIG. 15 is an example of a probability estimating table. The second portion of the probability estimating data which is stored in the probability estimating table storage portion has a value according to this probability estimating table of FIG. 15, for example, in the same way as that shown in the second embodiment.

In this fourth embodiment, the number of bits of respective data constituting the second portion of the probability estimating data, namely NLPS data, NMPS data and SWITCH data, am respectively 7 bits (in FIG. 15, it is shown in decimal number, but it is actually represented in decimal number), 7 bits (in FIG. 15, it is shown in decimal number, but it is actually represented in decimal number) and 1 bit.

The number of data output node DO is 15 for example, if the second portion of the probability estimating data comprises a 7-bit NLPS data, a 7-bit NMPS data and a 1-bit SWITCH data.

The probability estimating table storage portion is able to store the probability estimating data as much as the number of the address designated by the context. In other words, if the probability estimation index comprises 7 bits for example, it can store as much as 27 probability estimating data. The first probability estimating table 115 comprises a ROM having a probability estimating table storage portion of 128 ($2^7$) rows, where each row (one address) comprises 15 bits, if respective data which constitute the second portion of the probability estimating data, namely NLPS data, NMPS data and SWITCH data, comprise seven bit, seven bit and one bit, respectively for example.

A second probability estimating table storage device 116 comprises a plurality of address input nodes A, a plurality of data output nodes DO, and a probability estimating table storage portion. The probability estimating table storage portion for storing a plurality of a first portion of a probability estimating data is based on the probability table recommend by the ITU (International Telecommunication Union) recommendation T. 82. The first portion of the probability estimating data comprises an LSZ data. The second probability estimating table storage device 116 receives a probability estimation index STUP which indicates a status number in the prediction index data from the arithmetic calculator 107 on the address input nodes A. The second probability estimating table storage device 116 reads out the first portion of the probability estimating data which is stored in the probability estimating table storage portion corresponding to the address based on the received probability estimation index STUP. The second probability estimating table storage device 116 then outputs a read-out data from the data output nodes DO to the context table storage device 114 as a first portion of the probability estimating data of a renewal data. The second probability estimating table storage device 116 comprises a ROM and so on.

The number of the address input nodes A is 7, if the probability estimation index STUP from the arithmetic calculator 107 comprises 7 bits. The probability estimation index STUP to be inputted corresponds to the address in the probability estimating table storage portion.

FIG. 16 is an example of a probability estimating table. The first portion of the probability estimating data which is stored in the probability estimating table storage portion has a value according to this probability estimating table of FIG. 16, for example, in the same way as that shown in the second embodiment.

In this fourth embodiment, the number of bits of the LSZ data which constitutes the first portion of the probability estimating data, is 16 bits.

The number of data output node DO is 16 for example, if the LSZ data which constitutes the first portion of the probability estimating data comprises 16 bits.

The probability estimating table storage portion is able to store the first portion of the probability estimating data as much as the number of the address designated by the probability estimation index. In other words, if the probability estimation index comprises 7 bits for example, it can store as much as $2^7$ first portion of the probability estimating data. The second probability estimating table storage device 116 comprises a ROM having a probability estimating table storage portion of 128 ($2^7$) rows, where each row (one address) comprises 16 bits, if the LSZ data comprises 16 bits.

The operation of a digital information encoding device constructed as mentioned is explained below.

The digital information encoding device shown in this fourth embodiment basically operates in the same way as that of the third embodiment shown in FIG. 17. The operation has five operation modes as shown in FIG. 10, and is proceeded along with the waveforms shown in FIGS. 21A~M.

The operation in the fourth embodiment is the same as the third embodiment except the way to give a prediction symbol to the arithmetic calculator 107 and a renewal data to the context table storage device 114, because of the above-mentioned first difference.

Accordingly, in order to explain the above-mentioned difference, the mode III (including a renormalizing processing in the mode II) in the period $T_4$~$T_6$ is explained in the following, using the waveforms in FIGS. 21A~M. It is assumed that the operations in the other modes are easily understood from the operation in the mode III and in the third embodiment

[mode III]

The examples of major signal waveforms in the mode III (it is assumed that the number of the renormalization processing is three) are shown in the periods $T_4$~$T_6$ of the system clock signal in FIG. 21A.

As for the mode III, it is assumed that a decoding processing has been done for the fourth target decoding pixel. In the period $T_4$, a pixel processing clock signal is raised by the rise of the system clock. Receiving the rise of the pixel processing clock signal, the context generator 102 reads a context for the fourth target decoding pixel from the storage device 101 and outputs the read context to the reading address input nodes AR of the context table storage device 114.

In the context table storage device 114, a 24-bit storage data which comprises a prediction/index data and an LSZ data which constitutes the first portion of a probability estimating data is read out according to the context inputted into the reading address input nodes AR and outputted from the data output nodes DO.

The prediction symbol MPS and the LSZ data of the prediction/index data are outputted to the arithmetic calculator 107. The probability estimation index of the prediction/index data is outputted to the first probability estimating table storage device 115.

Receiving the probability estimation index of the prediction/index data, the first probability estimating table storage device 115 reads out the second portion (NLPS data, NMPS data and SWITCH data) of the 15-bit probability estimating data shown in the probability estimating table in FIG. 15, according to the probability estimation index inputted to the address input nodes A, and then outputs it to the arithmetic calculator 107.

On the other hand, since one renormalization processing is performed in the mode II, the controller 113 has therefore, receives "1" indicating "carrying out a normalization processing" from the renormalize generator 182 in the A register 108, and "1" indicating "normalization will be completed after one more normalization processing" from the last renormalization generator 183 in the A register 108, in the period $T_4$ of the first clock of the system clock in the mode III. Accordingly, the controller 113 obtains a renormalizing signal and a last renormalizing signal, both "H" level, in the period $T_4$, respectively, as shown in FIG. 21E and FIG. 21F. Also, the controller 113 generates a shift-up selection signal which rises in response to the rise of the system clock as shown in FIG. 21I.

When the shift-up selection signal rises, receiving a shift-up selection signal indicating "normalization will be completed by the last one normalization processing", the A selector 109 selects the data obtained by shifting up the A data from the A register 108 by one bit, and also outputs it to the arithmetic calculator 107.

Similarly, receiving the shift-up selection signal, the C selector 111 selects the data obtained by shifting up the C data from the C register 110 by one bit, and outputs it to the arithmetic calculator 107. The least significant bit of the C data which is shifted-up by one bit at the time, corresponds to the encoded data for the most significant bit which is latched in the input means 112, and outputted from the input means 112.

The A data and the C data latched in the A register 108 and the C register 11.0 respectively are shifted-up by one bit in the mode III, in this period $T_4$.

The A data latched in the A register 108 and the C data latched in the C register 110 in this period $T_4$ are resultants calculated in the mode II (period $T_3$) by the arithmetic calculator 107. In other words, since the renormalizing signal and also the last renormalizing signal become "H" level in the period $T_4$, a renormalizing clock signal becomes "H" level. Therefore, the contents stored in the A register 108 and the C register 110 are not shifted-up and kept unchanged.

In the arithmetic calculator 107 (ref. FIG. 18), a prediction conversion signal is generated by the calculator 173 from the LSZ data from the context table storage device 114, the A data for the third target decoding pixel, namely the A data which is shifted-up by one bit, and the C data for the third target decoding pixel, namely the C data which is shifted-up by one bit, according to the above-mentioned equation (5).

When this prediction conversion signal matches with the prediction symbol, the picture data "1" for example from the picture data generator 171 is stored in the storage device 101 as the picture data for the fourth target decoding pixel. When the prediction conversion signal does not match with the prediction symbol, the picture data "0", for example, from the picture data generator 171 is stored in the storage device 101 as the picture data for the fourth target decoding pixel.

On the other hand, when the prediction conversion signal shows that the equation (5) is satisfied, the calculator 173 calculates an A data according to an LSZ data from the context table storage device 114 and the A data of the third target decoding pixel, namely the A data which is shifted-up by one bit, according to the equation (6). The calculated A data is then outputted to the A register 108. The C data of the third target decoding pixel, namely the C data which is shifted-up by one bit, is outputted to the C register 110 according to the above-mentioned equation (7). When prediction conversion signal shows that the equation (5) is not satisfied, the calculator 173 outputs the LSZ data from the context table storage device 114 to the A register 108 as an A data, according to the above-mentioned equation (8). The calculator 173 calculates a C data from the LSZ data from the context table storage device 114 and both A and C data of the third target decoding pixel, namely the A data and the C data both of which are shifted-up by one bit, according to the above-mentioned equation (9). The calculated C data is outputted to the C register 110.

The A data and the C data calculated by the calculator 173 in this way are inputted to the register portion 181 of the A register 108 (ref. FIG. 19) and to the C register 110 (ref. FIG. 20) respectively, and stored therein (the stored contents in each register has been updated) on the rise of a pixel processing clock signal from the controller 113 (period $T_5$).

In this period $T_4$, since the mode III requires one renormalization processing, receiving the rise of a pixel processing clock and "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 114 writes and stores a renewal data on the context table storage portion at the address based on the context from the context storage device 103, which is received in the writing address input nodes AW, namely, the context of the third target decoding pixel in the mode II.

This renewal data consists of a prediction/index data comprising a prediction symbol MPSUP and a probability estimation index STUP which indicates a status number from the arithmetic calculator 107, and an LSZ data which constitutes the first portion of the probability estimating data which is read-out from the probability estimating table storage device 105 according to a probability estimation index STUP from the arithmetic calculator 107.

Accordingly, the renewal data is explained with regard to a prediction/index data and the first portion of the probability estimating data respectively in the following.

First, a prediction/index data as a renewal data is explained.

As shown in the arithmetic calculator 107 in FIG. 18, when a prediction conversion signal from the calculator 173 indicates that the equation (5) is satisfied, the prediction symbol generated by the prediction symbol/probability estimation index generator (renewal data generator) 172 in the arithmetic calculator 107 has the same value as that of the prediction symbol of the prediction/index data for the third target decoding pixel, regardless of the SWITCH data of the probability estimating data for the third target decoding pixel. When the prediction conversion signal indicates that the equation (5) is not satisfied, and the SWITCH data of the probability estimating data for the third target decoding pixel is "1", the prediction symbol has a value obtained by inverting the value of the prediction symbol of the prediction/index data for the third target decoding pixel. When the prediction conversion signal indicates that the equation (5) is not satisfied and the SWITCH data is "0", this prediction symbol has the same value as that of the prediction symbol of the prediction/index data for the third target decoding pixel.

As shown in FIG. 18, a probability estimation index (a status number) generated by the prediction symbol/probability estimation index generator 172 in the arithmetic calculator 107 becomes an NMPS data of the probability estimating data for the third target decoding pixel, when a prediction conversion signal from the calculator 173 indicates that the equation (5) is satisfied. The probability estimation index becomes an NLPS data of the probability estimating data for the third target decoding pixel, when a prediction conversion signal indicates that the equation (5) is not satisfied.

The first portion of the probability estimating data as a renewal data is explained below.

The probability estimation index STUP from the arithmetic calculator 107, which is generated in the above-mentioned way, is inputted to the address input nodes A of the second probability estimating table storage device 116.

Receiving the probability estimating index STUP, the first probability estimating table storage device 115 outputs the first portion of the probability estimating data which consists of an LSZ data corresponding to the received probability estimation index, to the context table storage device 114, according to the probability estimating table shown in FIG. 16 which is stored in the probability estimating table storage portion.

In this way, a prediction/index data comprising a prediction symbol MPSUP and a probability estimation index STUP from the arithmetic calculator 107, and a renewal data consisting of an LSZ data which constitutes the first portion of the probability estimating data from the second probability estimating table storage device 116, are written on the context table storage portion of the context table storage device 114 at the address based on the context of the third target decoding pixel.

The controller 113 obtains a CT count clock signal which will be a clock as shown in FIG. 21J, and generates a code shift clock signal which synchronizes with the system clock signal, in the period $T_4$ as shown in FIG. 21M. Receiving the fall of this code shift clock signal, the input means 112 shifts-up the stored contents latched therein by one bit, and stores it again.

Since the code input clock signal remains "H" level as shown in FIG. 21K, the input means 112 however, does not newly takes-in an encoded data again.

Accordingly, in the period $T_4$ in this mode III, the procedures from a context generation to the arithmetic calculation for the fourth target decoding pixel, and a renormalization processing for the third target decoding pixel are carried out within one system clock (a cycle). In other words, the prediction/index data in the context table storage device 114 is updated and the A data latched in the A register 108 and the C data latched in the C register 110 are respectively shifted-up by one bit within one system clock (a cycle).

Since this mode III shows an example in which three renormalization processing are required, the A data which is the resultant calculated by the arithmetic calculator 107 taken into the register portion 181 of the A register 108 in the period $T_5$ becomes a value more than "0.0625" and less than 0.125 in decimal number. Accordingly, the value of most the significant bit becomes "0", and the value which is one bit lower from the most significant bit becomes "0".

Accordingly, a renormalizing signal "1" indicating "carrying out a normalization processing" is outputted from the renormalization generator 182 in the A register 108. As shown in FIG. 21E, the controller 113 therefore obtains an "H" level renormalizing signal in the period $T_5$.

The last renormalization generator 183 in the A register 108 outputs a last renormalizing signal "0" indicating "normalization will not be completed after one more normalization processing". An "L" level last renormalizing signal is obtained at the controller 113 in the period $T_5$, as shown in FIG. 21F.

Receiving a context of the fifth pixel from the context generator 102 and a context of the fourth target decoding pixel from the context storage device 103, the context comparator 106 outputs an "L" level identical context signal indicating that "the contexts do not match with each other" during the period $T_5$ as shown in FIG. 21D.

Accordingly, the mode III is recognized in this period $T_5$, in which the contexts are not identical and at least two renormalization processing has to be performed.

By this recognition, a renormalization processing is performed in the period $T_5$ shown in FIGS. 21A~M. In other words, the storing data in the context table storage device 114 is updated, and the A data in the A register 108 and the C data in the C register 110 are respectively shifted-up by one bit.

As mentioned above, in this period $T_5$, on the rise of a pixel clock signal triggered by the rise of a system clock, the A data and the C data calculated for the fourth target decoding pixel are inputted to the A register 108 and to the C register 110 respectively and latched therein. Receiving the rise of the pixel processing clock signal, the context generator 102 reads the context for the fifth target decoding pixel from the storage device 101 and outputs the read context to the reading address input nodes AR in the context table storage device 114 and to the context storage device 103.

The pixel processing clock signal however, maintains "H" level in this period $T_5$, since the renormalization generator 182 of the A register 108 outputs "1" indicating "carrying out a normalization processing" and the last renormalization generator 183 of the A register 108 outputs "0" indicating "normalization processing will not complete after one more normalization processing". As a result, the A register 108 and the C register 110 shift up none of the contents stored therein. The A data and the C data calculated for the fourth target decoding pixel remains to be latched in the A register 108 and the C register 110, respectively.

On the other hand, when the controller 113 receives "1" indicating "carrying out a normalization processing" from the renormalization generator 182 of the A register 108, the renormalizing clock signal generator is set, and the controller 113 therefore, outputs a renormalizing clock signal and a code shift clock signal both of which synchronize with the system clock signal.

Receiving the fall of this code shift clock signal, the input means 112 shifts-up the encoded data by one bit and latches it again.

Receiving the fall of the renormalizing clock signal, the A register 108 and the C register 110 shift-up the respective A data and C data latched therein by one bit, namely the A data and the C data for the forth target decoding pixel which are calculated by the arithmetic calculator 107 in the period $T_4$, and latch the respective data again.

Since the controller 113 receives "1" indicating "carrying out a normalization processing" from the renormalization generator 182 in the A register 108, the controller 113 outputs a renewal clock signal in synchronization with the system clock as shown in FIG. 21G.

Receiving the fall of the renewal clock signal, the context table storage device 114 writes and stores a renewal data on the context table storage portion at the address based on the context from the context storage device 103, which is received in the writing address input nodes AW, namely, the context of the fourth target decoding pixel. The renewal data consists of a prediction/index data comprising a prediction symbol MPSUP and a probability estimating index STUP from the arithmetic calculator 107, and an LSZ data which constitutes the first portion of the probability estimating data from the second probability estimating table storage device 116, in the same way as mentioned above in the period $T_4$.

In this period $T_5$, the A data stored in the register portion 181 of the A register 108 has a value more than 0.125 and less than 0.25 in decimal number because it has been shifted-up by one bit. The value of the most significant bit is, however "0", and also that of the next bit is "0".

Accordingly, the renormalization generator 182 in the A register 108 outputs a renormalizing signal "1" indicating "carrying out a normalization processing", therefore, an "H" level renormalizing signal is obtained at the controller 113 in the period $T_6$, as shown in FIG. 21E.

The last renormalization generator 183 in the A register 108 outputs a last renormalizing signal "0" indicating "normalization will not be completed after one more normalization processing". An "L" level last renormalizing signal is obtained at the controller 113 in the period $T_6$, as shown in FIG. 21F.

This means that in the next period $T_6$, the A data and the C data latched in the A register 108 and the C register 110 respectively are shifted-up by one bit in a renormalization processing.

Accordingly in the period $T_6$, the renormalizing clock signal generator in the controller 113 is not reset because the controller 113 has received "0" indicating "normalization processing will not complete after one more normalization processing" from the last one renormalization generator 183 of the A register 108. The controller 113 therefore, outputs a renormalizing clock signal in synchronization with the system clock signal and a code shift clock signal in synchronization with the system clock signal.

Receiving the fall of this code shift clock signal, the input means 112 shifts-up the encoded data latched therein by one bit and latches the data again.

Receiving the fall of this renormalizing clock signal, the A register 108 and the C register 110 shift up the A data and the C data by one bit, which are shifted-up by one bit in the period $T_5$, respectively, and latch them again.

Since the last one renormalization generator 183 outputs "0" indicating "normalization processing will not complete after one more normalization processing", the pixel processing clock signal maintains "H" level even in this period $T_6$. Accordingly, the controller 113 maintains the renewal clock signal at "H" level as shown in FIG. 21G. As a result, the contents stored in the context table storage device 104 is not updated.

In this period $T_6$, the A data stored in the register portion 181 of the A register 108 has a value more than 0.25 and less than 0.5 in decimal number, because it has been shifted-up by one bit. The value of the most significant bit is, however "0", and the value which is one bit lower from the most significant bit is "1".

Accordingly, the renormalization generator 182 in the A register 108 outputs a renormalizing signal "1" indicating "carrying out a normalization processing", therefore, an "H" level renormalizing signal is obtained at the controller 113 in the period $T_7$, as shown in FIG. 21E.

The last renormalization generator 183 in the A register 108 outputs a last renormalizing signal "1" indicating "normalization will be completed after one more normalization processing". An "H" level last renormalizing signal is obtained at the controller 113 in the period $T_7$, as shown in FIG. 21F.

This means that in the next period $T_7$, the A data and the C data latched in the A register 108 and the C register 110 respectively, are shifted-up by one bit in a renormalization processing. This also means that the mode III is completed by the last one normalizing processing.

In other words, the last renormalization generator 183 in the A register 108 outputs "1" indicating "normalization will be completed after one more normalization processing". In the same manner as the operation in the mode II, the renormalization processing can be performed at the first clock of the system clock in which a decoding processing for the next target decoding pixel is performed, namely, the period $T_7$ in the mode IV shown in FIGS. 21A–M.

Accordingly, in the mode III, for the renormalization processing which are required for three times, the procedures from a context generation to the arithmetic calculation for the target decoding pixel take only one clock time (one cycle) of the system clock to carry out. The A data and the C data calculated by the arithmetic calculator 107, are stored in the A register 108 and the C register 110, respectively. The two renormalization processing need two clocks of the system clock to carry out. The last one renormalization processing is performed in the first clock of the system clock in which a decoding processing for the next target decoding pixel is performed. As a result, substantial operating time in the mode III needs only three clocks of the system clock.

In the period $T_418 T_6$, since the controller 113 maintains the renormalizing clock signal at "H" level, the CT count clock signal is maintained to the same clock signal as the system clock shown in FIG. 21J. Since the CT count clock signal lasts, however, during three clocks, the code output clock signal from the controller 113 remains "H" level. Accordingly, the input means 112 does not takes-in an encoded data.

As mentioned above, the same effect can be obtained in this fourth embodiment in the same way as that of the third embodiment. Moreover, since the storage capacity of the context table storage device 114 can be made of a small one, the chip size becomes smaller if the structure of the fourth embodiment is integrated into a semiconductor integrated circuit.

Embodiment 5

Figure 23A:
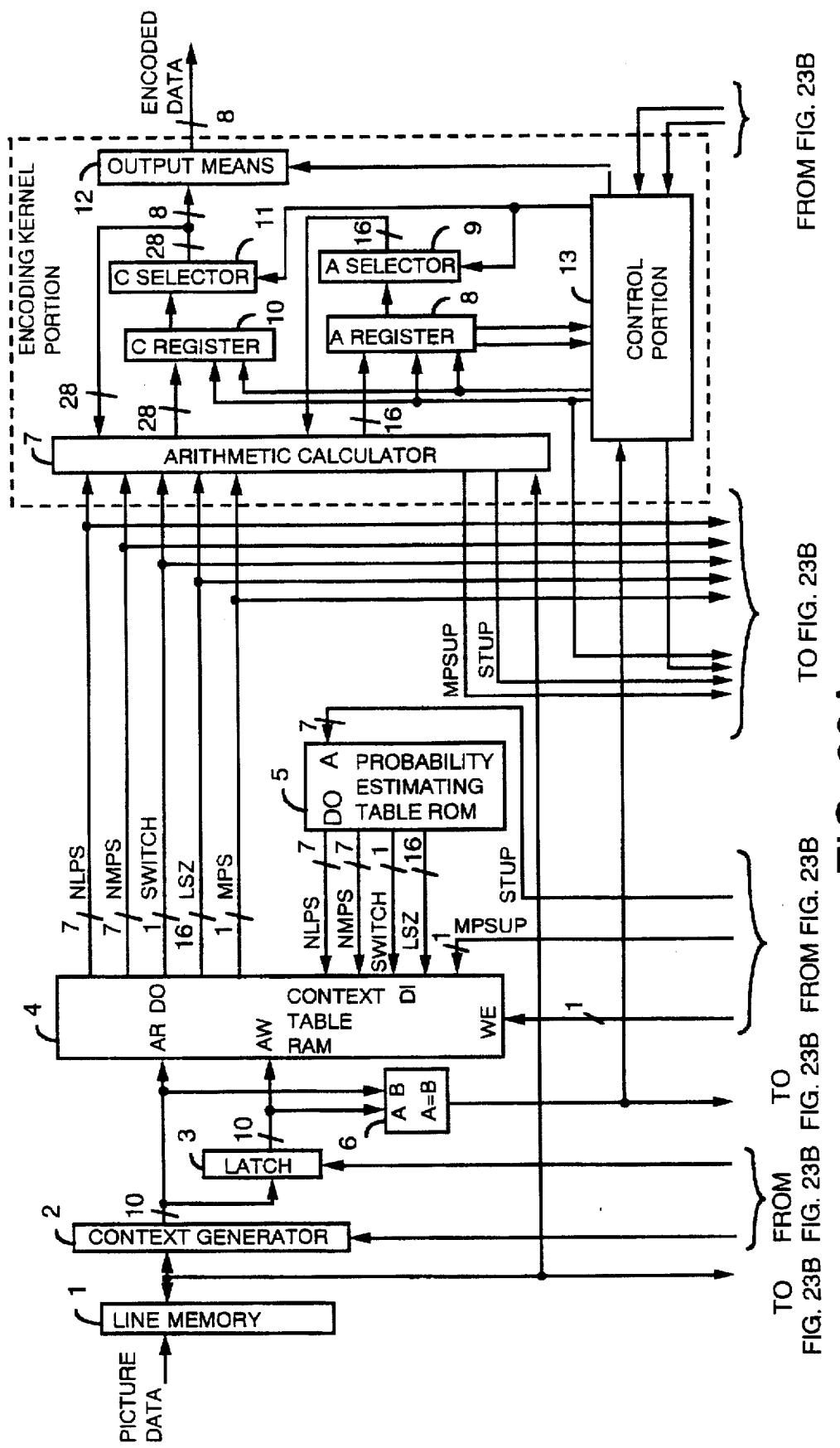
FIG. 23A, and B are a block diagram showing a fifth embodiment of the present invention.
Figure 23B:
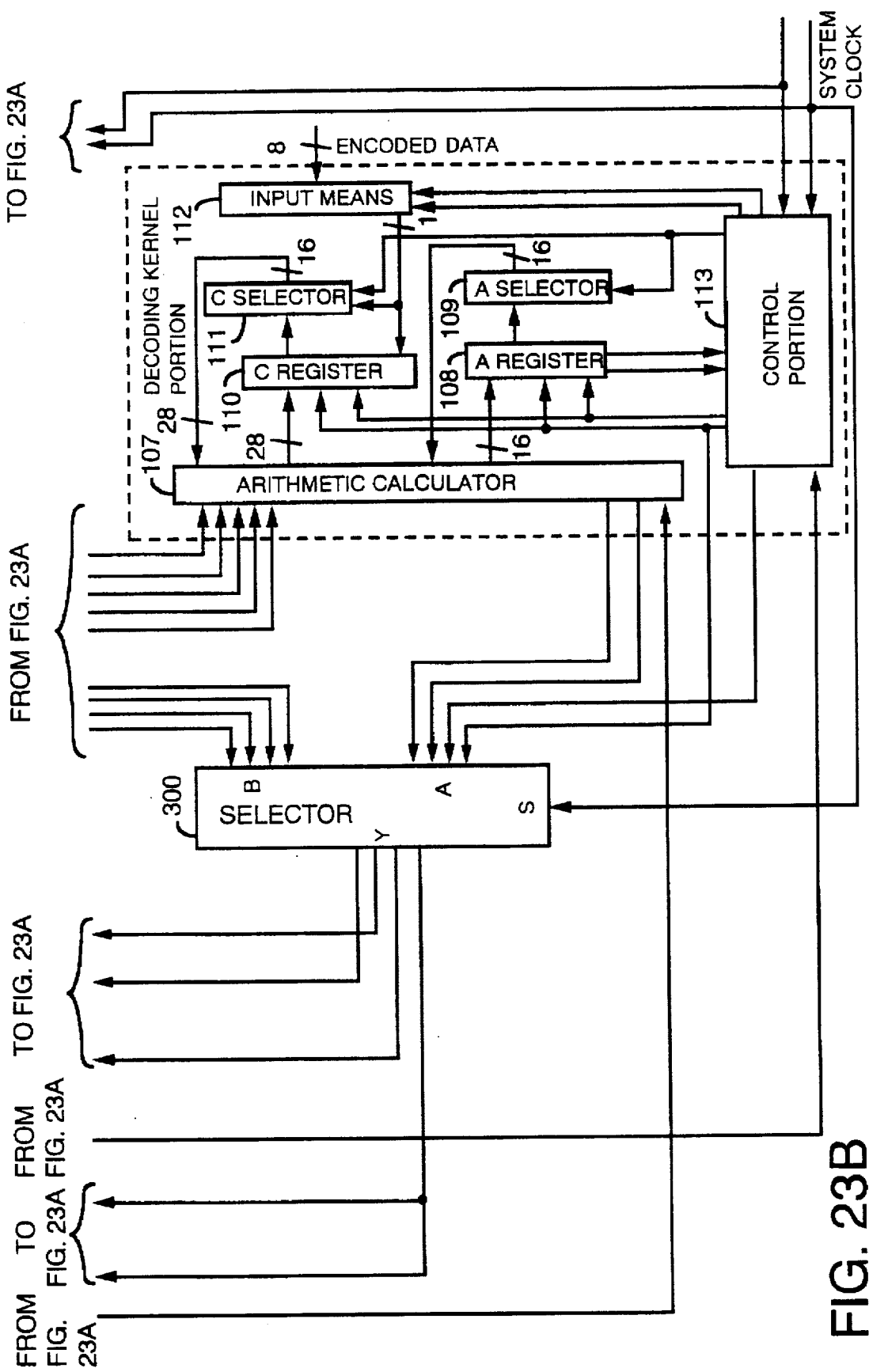

FIG. 23 shows a fifth embodiment of the present invention, in which a digital signal encoding/decoding device is integrated into a semiconductor integrated circuit, which is, for example, applied to a facsimile apparatus.

This digital signal encoding/decoding device fundamentally comprises the above-mentioned digital signal encoding device of the first embodiment and the above-mentioned digital signal decoding device of the third embodiment, both of which are integrated into one semiconductor integrated circuit device.

In other words, the digital signal encoding/decoding device comprises a storage device 1, a context generator 2, a context storage device 3, a context table storage device 4, a probability estimating table storage device 5 and context comparison means 6, all of which are the same as those in the first embodiment and used for both encoding and decoding.

The digital signal encoding/decoding device also comprises an encoding kernel portion which consists of an arithmetic calculator 7, an A register 8, an A selector 9, a C register 10, a C selector 11, an output means 12 and a controller 13, all of which are the same as those of the first embodiment. The active/inactive state of the encoding kernel portion is controlled according to the encode/decode switching signal. When the controller 13 is turned on an active state, these elements work the same as they did in the first embodiment.

A decoding kernel portion, which comprises an arithmetic calculator 107, an A register 108, an A selector 109, a C register 110, a C selector 111, an input means 112 and a controller 113, is the same as those of the third embodiment. The active/inactive state of the decoding kernel portion is also controlled according to the encode/decode switching signal. When the controller 13 is turned on an active state, the decoding kernel portion works the same as they do in the third embodiment.

An encoding/decoding selector 300 is provided in order to use the storage device 1, the context generator 2, the context storage device 3, the context table storage device 4, the probability estimating table storage device 5 and the context comparison means 6 as either encoding or decoding purpose.

This encoding/decoding selector 300 receives a renewal data from the arithmetic calculator 107, a pixel processing clock signal and renewal clock signal from the controller 113 at the input terminal A. The encoding/decoding selector 300 also receives a renewal data from the arithmetic calculator 107, a pixel processing clock signal and a renewal clock signal from the controller 13 at the other input terminal B. According to the encode/decode switching signal, the encoding/decoding selector 300 selects either the signal inputted into the one input terminal A or the signal inputted into the other input terminal B.

When the inputted encode/decode switching signal indicates "encode", the encoding/decoding selector 300 selects the signal inputted into the other input terminal B. The encoding/decoding selector 300 respectively outputs the renewal data from the arithmetic calculator 7 to the data input nodes DI of the context table storage device 4, the pixel processing clock signal from the controller 13 to the context generator 2 and to the context storage device 3, the renewal clock signal from the controller 13 to the write enable signal input node WE of the context table storage device 4.

When the inputted encode/decode switching signal indicates "decode", the encoding/decoding selector 300 selects the signal inputted into the input terminal A. The encoding/decoding selector 300 respectively outputs the renewal data from the arithmetic calculator 107 to the data input nodes DI of the context table storage device 4, the pixel processing clock signal from the controller 113 to the context generator 2 and to the context storage device 3, the renewal clock signal from the controller 113 to the write enable signal input node WE of the context table storage device 4.

In short, the digital signal encoding/decoding device constructed as mentioned operates in the same manner as the above-mentioned digital encoding device of the first embodiment by means of the storage device 1, the context generator 2, the context storage device 3, the context table storage device 4, the probability estimating table storage device 5, the context comparator 6, the arithmetic calculator 7, the A register 8, the A selector 9, the C register 10, the C selector 11, the output means 12, the controller 13, and the encoding/decoding selector 300, when the encode/decode signal indicates "encode".

The digital signal encoding/decoding device constructed as mentioned operates in the same manner as the above-mentioned digital decoding device of the third embodiment by means of the storage device 1, the context generator 2, the context storage device 3, the context table storage device 4, the probability estimating table storage device 5, the context comparator 6, the arithmetic calculator 107, the A register 108, the A selector 109; the C register 110, the C selector 111, the input means 112, the controller 113, and the encoding/decoding selector 300, when the encode/decode signal indicates "decode".

As an alternative configuration of the above-mentioned digital signal encoding/decoding device, it is possible to apply a constant voltage, for example, power supply voltage or earth voltage, instead of applying an encode/decode switching signal. In such a case, the digital signal encoding/ decoding device operates as a digital signal encoding device, when the encoding kernel portion is always kept active, the decoding kernel portion is always kept inactive, and the signal inputted into the terminal B is always selected by the encoding/decoding selector 300. On the other hand, the digital signal encoding/decoding device operates as a digital signal decoding device, when the decoding kernel portion is always kept inactive, the decoding kernel portion is always kept active, and the signal inputted into the terminal A is always selected by the encoding/decoding selector 300.

The digital signal encoding/decoding device constructed as mentioned above provides the same effect obtained in the first and the third embodiments, respectively. Moreover, since the encoding device and the decoding device are integrated into one semiconductor integrated circuit device, an encoding/decoding device, an encoding device, and a decoding device are provided by one semiconductor integrated circuit device, instead of manufacturing each device separately.

Embodiment 6

Figure 24A:
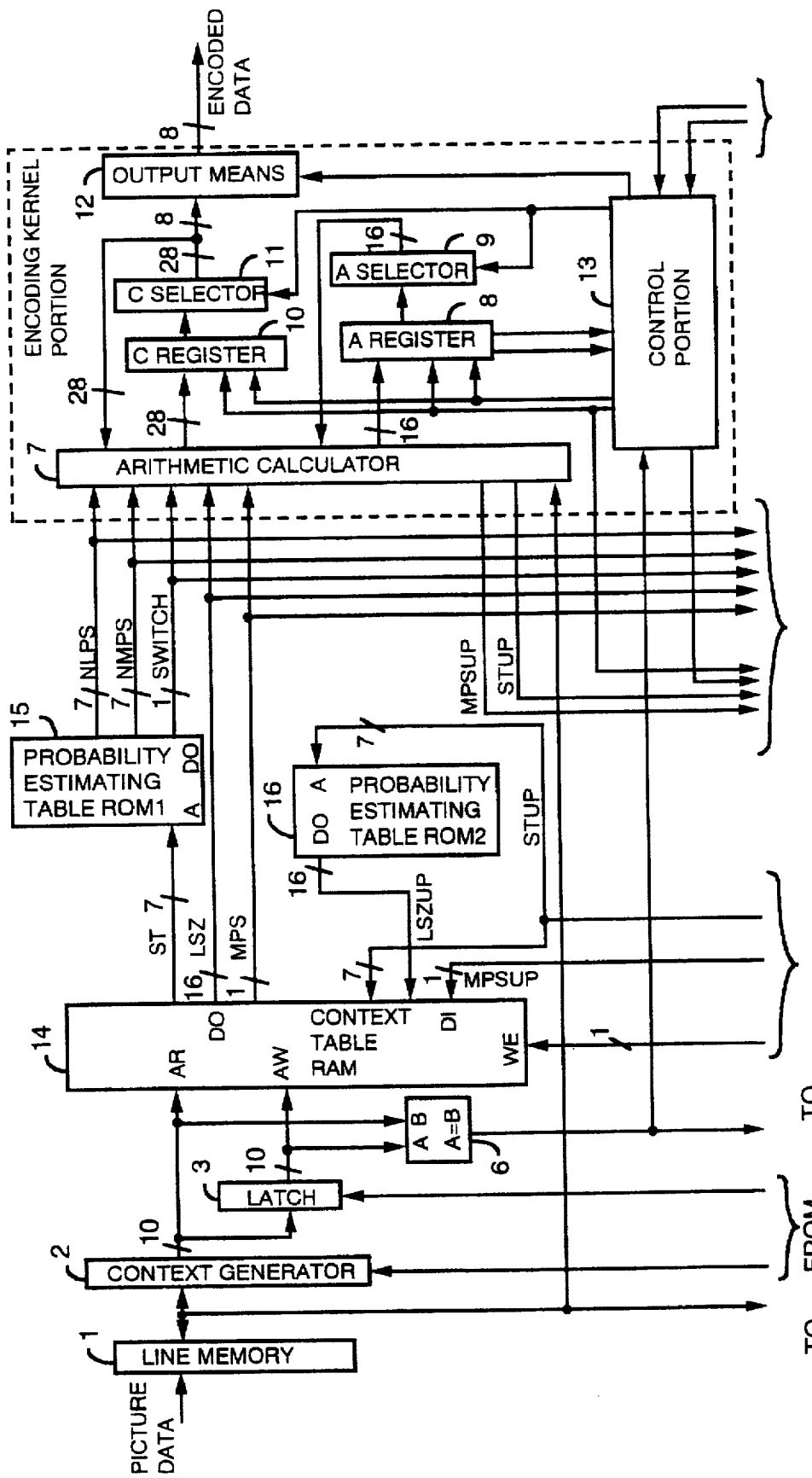
FIG. 24 A, and B are a block diagram showing a sixth embodiment of the present invention.
Figure 24B:
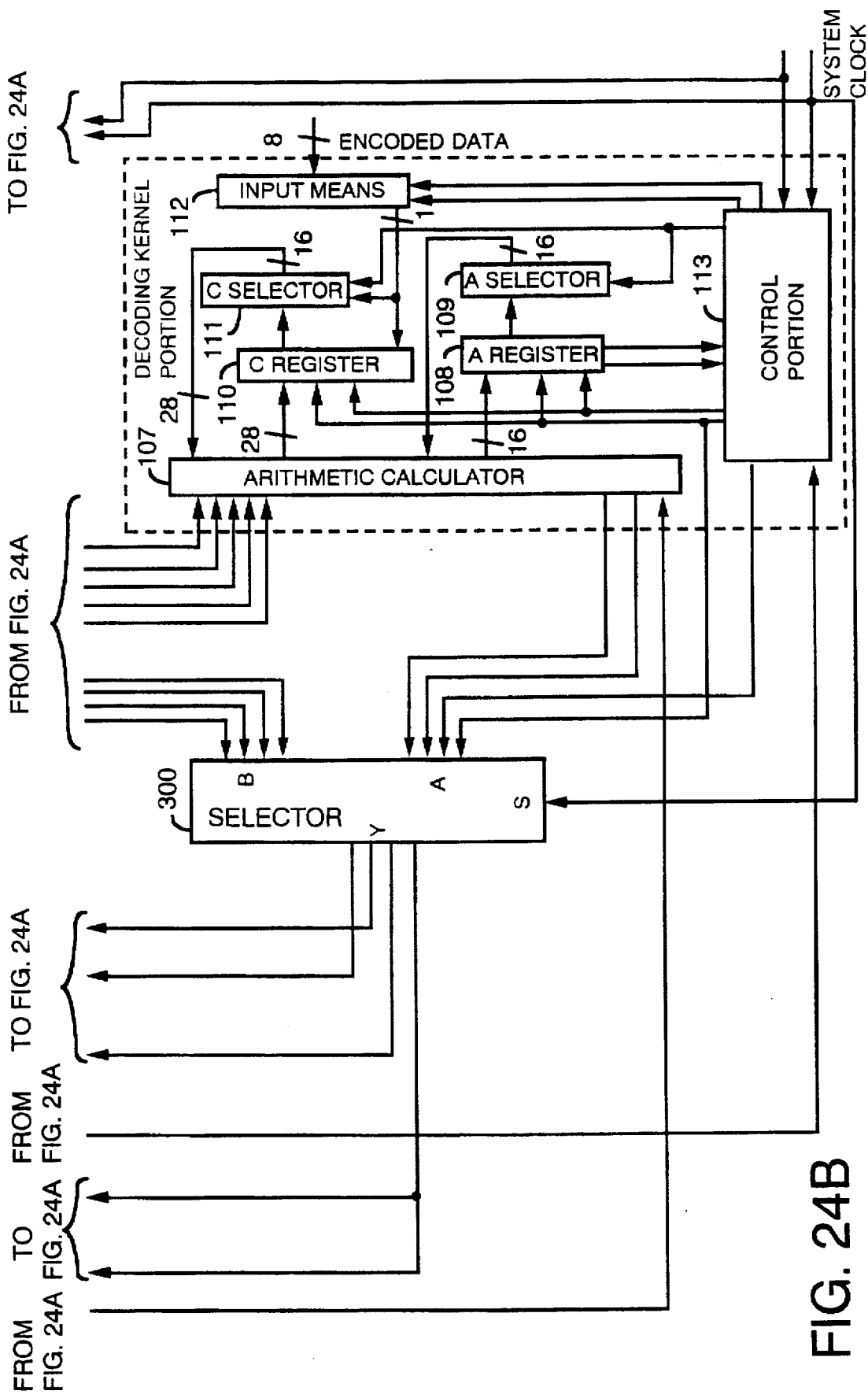

FIG. 24 shows a sixth embodiment of the present invention, in which a digital signal encoding/decoding device is integrated into a semiconductor integrated circuit, which is, for example, applied to a facsimile apparatus.

This digital signal encoding/decoding device fundamentally comprises the above-mentioned digital signal encoding device of the second embodiment and the above-mentioned digital signal decoding device of the fourth embodiment, both of which are integrated into one semiconductor integrated circuit device.

In other words, the digital signal encoding/decoding device comprises a storage device 1, a context generator 2, a context storage device 3, a context table storage device 14, a first probability estimating table storage device 15, a second probability estimating table 16, and a context comparison means 6, all of which are the same as those in the second embodiment and used for encoding and decoding.

The digital signal encoding/decoding device also comprises an encoding kernel portion which consists of an arithmetic calculator 7, an A register 8, an A selector 9, a C register 10, a C selector 11, an output means 12 and a controller 13, all of which are the same as those of the second embodiment. The active/inactive state of the encoding kernel portion is controlled according to the encode/decode switching signal. When the controller 13 is turned on an active state, these elements work in the same way as they do in the second embodiment.

A decoding kernel portion, which comprises an arithmetic calculator 107, an A register 108, an A selector 109, a C register 110, a C selector 111 and an input means 112 and a controller 113, is the same as those of the fourth embodiment. The active/inactive state of the decoding kernel portion is also controlled according to the encode/decode switching signal. When the controller 13 is turned on an active state, the decoding kernel portion works in the same way as they do in the fourth embodiment.

An encoding/decoding selector 300 is provided in order to use the storage device 1, the context generator 2, the context storage device 3, the context table storage device 14, the first probability estimating table storage device 15, the second probability estimating table storage device 16 and the context comparison means 6 as either encoding or decoding purpose.

This encoding/decoding selector 300 receives a renewal data from the arithmetic calculator 107, a pixel processing clock signal and renewal clock signal from the controller 113 at the input terminal A. The encoding/decoding selector 300 also receives a renewal data from the arithmetic calculator 7, a pixel processing clock signal and a renewal clock signal from the controller 13 at the other input terminal B. According to the encode/decode switching signal, the encoding/decoding selector 300 selects either the signal inputted into the one input terminal A or the signal inputted into the other input terminal B.

When the inputted encode/decode switching signal indicates "encode", the encoding/decoding selector 300 selects the signal inputted into the other input terminal B. The encoding/decoding selector 300 respectively outputs the renewal data from the arithmetic calculator 7 to the data input nodes DI of the context table storage device 14, the pixel processing clock signal from the controller 13 to the context generator 2 and to the context storage device 3, the renewal clock signal from the controller 13 to the write enable signal input node WE of the context table storage device 14.

When the inputted encode/decode switching signal indicates "decode", the encoding/decoding selector 300 selects the signal inputted into the input terminal A. The encoding/decoding selector 300 respectively outputs the renewal data from the arithmetic calculator 107 to the data input nodes DI of the context table storage device 14, the pixel processing clock signal from the controller 113 to the context generator 2 and to the context storage device 3, the renewal clock signal from the controller 113 to the write enable signal input node WE of the context table storage device 14.

In short, the digital signal encoding/decoding device constructed as mentioned operates in the same manner as the above-mentioned digital encoding device of the second embodiment by means of the storage device 1, the context generator 2, the context storage device 3, the context table storage device 14, the first probability estimating table storage device 15, the second probability estimating table storage device 16, the context comparator 6, the arithmetic calculator 7, the A register 8, the A selector 9, the C register 10, the C selector 11, the output means 12, the controller 13, and the encoding/decoding selector 300, when the encode/decode signal indicates "encode".

The digital signal encoding/decoding device constructed as mentioned operates in the same manner as the above-mentioned digital decoding device of the fourth embodiment by means of the storage device 1, the context generator 2, the context storage device 3, the context table storage device 14, the first probability estimating table storage device 15, the second probability estimating table storage device 16, the context comparator 6, the arithmetic calculator 107, the A register 108, the A selector 109, the C register 110, the C selector 111, the input means 112, the controller 113, and the encoding/decoding selector 300, when the encode/decode signal indicates "decode".

As an alternative configuration of the above-mentioned digital signal encoding/decoding device, it is possible to apply a constant voltage, for example, power supply voltage or earth voltage, instead of applying an encode/decode switching signal. In such a case, the digital signal encoding/decoding device operates as a digital signal encoding device, when the encoding kernel portion is always kept active, the decoding kernel portion is always kept inactive, and the signal inputted into the terminal B is always selected by the encoding/decoding selector 300. On the other hand, the digital signal encoding/decoding device operates as a digital signal decoding device, when the decoding kernel portion is always kept inactive, the decoding kernel portion is always kept active, and the signal inputted into the terminal A is always selected by the encoding/decoding selector 300.

The digital signal encoding/decoding device constructed as mentioned provides the same effect obtained in the second and the fourth embodiments, respectively. Moreover, since the encoding device and the decoding device are integrated into one semiconductor integrated circuit device, an encoding/decoding device, an encoding device, and a decoding device are provided by one semiconductor integrated circuit device, instead of manufacturing each device separately.

What is claimed is:

1. A digital information encoding/decoding device comprising:

context generation means for receiving a picture data selected from either an inputted picture data or a decoded picture data, and for extracting a reference pixel from the received picture data according to a template model, and for generating a context for a target encoding pixel if said selected picture data is the inputted picture data, and for generating a context for a target decoding pixel if said selected picture data is the decoded picture data;

context storage means for temporarily storing, in case of encoding, the context for the target encoding pixel from the context generation means, and for temporarily storing, in case of decoding, the context for the target decoding pixel from the context generation means;

context table storage means for storing a plurality of storing data comprising an LSZ data which comprises a prediction symbol and a probability estimating data and the probability estimating data indicates mismatching probability, an NLPS data which serves as a probability estimation index of a renewal data if said prediction symbol corresponding to the probability estimating data does not match with a picture data for the target encoding pixel in case of encoding, and which serves as a probability estimation index of a renewal data if an equation (5) below is not satisfied in case of decoding, an NMPS data which serves as a probability estimation index of a renewal data if said prediction symbol corresponding to the probability estimating data matches with a picture data for the target encoding pixel in case of encoding, and which serves as a probability estimation index of a renewal data if said equation (5) is satisfied in case of decoding, and a SWITCH data which indicates whether or not to invert the prediction symbol corresponding to the probability estimating data, for outputting one storing data out of the stored plurality of storing data according to a context for a pixel to be encoder the target decoding pixel from the context generation means, wherein, in case of encoding, one storing data in a plurality of storing data out of the plurality of storing data is rewritten by an inputted renewal data of a plurality of bits having an inputted prediction symbol and a probability estimating data according to a context for the target encoding pixel which is stored temporarily in the context storage means, and in case of decoding, one storing data in a plurality of storing data out of the plurality of storing data is rewritten by an inputted renewal data of a plurality of bits having an inputted prediction symbol and a probability estimating data according to a context for the target decoding pixel which is stored temporarily in the context storage means;

an encoding arithmetic calculation means for performing an arithmetic processing according to equations (1) and (2) below, and outputting the A data and the C data for the target encoding pixel, if said picture data for the target encoding pixel matches with the prediction symbol in the storing data from the context table storage means, for performing an arithmetic processing according to equations (3) and (4) below, and outputting the A data and the C data for the target encoding pixel, if said picture data for the target encoding pixel does not match with the prediction symbol in the storing data from the context table storage means, for inverting a value of the prediction symbol in the storing data from the context table storage means, if said SWITCH data in the probability estimating data in the storing data from the context table storage means indicates a prediction symbol should be inverted, and also the picture data for the target encoding pixel does not match with the prediction symbol in the storing data from the context table storage means, otherwise, outputting the same value as that of the prediction symbol in the storing data from the context table storage means as a prediction symbol, for outputting the NMPS data in the probability estimating data in the storing data from the context table storage means as a probability estimation index of the renewal data, if said picture data for the target encoding pixel matches with the prediction symbol in the storing data from the context table storage means, for outputting the NLPS data in the probability estimating data in the storing data from the context table storage means as a probability estimation index of the renewal data, if said picture data for the target encoding pixel does not match with the prediction symbol in the storing data from the context table storage means;

a decoding arithmetic calculation means for performing an arithmetic processing according to said equation (5), for performing an arithmetic processing according to equations (6) and (7) below to output the A data and the C data for the target decoding pixel if said equation (5) satisfied, for performing an arithmetic processing according to the following equations (8) and (9) to output the A data and the C data for the target decoding pixel, if said equation (5) is not satisfied, for inverting a value of the prediction symbol in the storing data from the context table storage means, if said SWITCH data in the probability estimating data in the storing data from the context table storage means indicates a prediction symbol should be inverted, and if said equation (5) is not satisfied, otherwise, outputting the same value as that of the prediction symbol in the storing data from the context table storage means as a prediction symbol, for outputting the NMPS data in the probability estimating data in the storing data from the context table storage means as a probability estimation index of the renewal data as a probability estimation index of the renewal data, if said equation (5) is satisfied, for outputting the NLPS data in the probability estimating data in the storing data from the context table storage means as a probability estimation index of the renewal data, if said equation (5) is not satisfied, for outputting a same value as that of the prediction symbol in the storing data from the context table storage means as a decoded picture data for the target decoding pixel, if said equation (5) is satisfied, for inverting the value of the prediction symbol in the storing data from the context table storage means and then outputting as a decoded picture data for the target decoding pixel, if said equation (5) is not satisfied; and a probability estimating table storage means for storing a plurality of probability estimating data comprising the LSZ data, the NLPS data, the NMPS data and the SWITCH data, and outputting, in case of encoding, one probability estimating data out of the plurality of probability estimating data, and a prediction symbol from the encoding arithmetic calculation means, to the context table storage means, as the renewal data, according to a probability estimation index from the encoding arithmetic calculation means, and for outputting, in case of decoding, one probability estimating data out of the plurality of probability estimating data, and a prediction symbol from the decoding arithmetic calculation means, to the context table storage means, as the renewal data, according to a probability estimation index from the decoding arithmetic calculation means; wherein $$A(k)=A(k-1)-LSZ(k) \quad (1)$$

$$C(k)=A(k-1) \quad (2)$$

$$A(k)=LSZ(k) \quad (3)$$

$$C(k)=C(k-1)+\{A(k-1)-LSZ(k)\} \quad (4)$$

$$C(k-1)<A(k-1)-LSZ(k) \quad (5)$$

$$A(k)=A(k-1)-LSZ(k) \quad (6)$$

$$c\ (k)=c\ (k-1) \quad (7)$$

$$A(k)=LSZ(k) \quad (8)$$

$$C(k)=C(k-1)+\{A(k-1)-LSZ(k)\} \quad (9)$$

where $A(k)$ is an A data of the target encoding pixel or a target decoding pixel (a k-th target encoding pixel or a target decoding pixel), $A(k-1)$ is an A data of a target encoding pixel or a target decoding pixel which immediately precedes the target encoding pixel or a target decoding pixel {a(k-1)-th target encoding pixel or a target decoding pixel}, $C(k)$ is a C data of the target encoding pixel or a target decoding pixel (a k-th target encoding pixel or a target decoding pixel), $C(k-1)$ is a C data of a target encoding pixel or a target decoding pixel which immediately precedes the target encoding pixel or a target decoding pixel {a(k-1)-th target encoding pixel or a target decoding pixel}, LSZ(k) is an LSZ data indicating a mismatching probability of a probability estimating data for the target encoding pixel or a target decoding pixel (a k-th target encoding pixel or a target decoding pixel) from the probability estimating table storage means, and k=1, 2, 3, . . . n where n is a positive integer.

2. The digital information encoding/decoding device of claim 1, further comprising:

an encoding A data output means for receiving the A data from the encoding arithmetic calculation means, giving an A data received from the encoding arithmetic calculation means as a target encoding pixel which immediately precedes the target encoding pixel if no renormalization processing for the target encoding pixel is required, and giving the A data received from the encoding arithmetic calculation means which is shifted-up by one bit as a target encoding pixel which immediately precedes the target encoding pixel if one renormalization processing for the target encoding pixel is required;

an encoding C data output means for receiving the C data from the encoding arithmetic calculation means, giving a C data received from the encoding arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required;

a decoding A data output means for receiving the A data from the decoding arithmetic calculation means, giving an A data received from the decoding arithmetic calculation means as a target decoding pixel which immediately precedes the target decoding pixel if no renormalization processing for the target decoding pixel is required, and giving the A data received from the decoding arithmetic calculation means which is shifted-up by one bit as a target decoding pixel which immediately precedes the target decoding pixel if one renormalization processing for the target decoding pixel is required; and a decoding C data output means (110,111) for receiving the C data from the decoding arithmetic calculation means, and also receiving the received encoded data via input means, giving a content latched according to the encoded data and a C data received from the decoding arithmetic calculation means as a target decoding pixel which immediately precedes the target decoding pixel if no renormalization processing for the target decoding pixel is required, and giving the C data received from the decoding arithmetic calculation means and a content latched according to the encoded data which are shifted-up by one bit as a target decoding pixel which immediately precedes the target decoding pixel, if one renormalization processing for the target decoding pixel is required.

3. The digital information encoding/decoding device of claim 2, further comprising:

an encoding A data output means for receiving the A data from the encoding arithmetic calculation means, giving an A data received from the encoding arithmetic calculation means as a target encoding pixel which immediately precedes the target encoding pixel if no renormalization processing for the target encoding pixel is required, and giving the A data received from the encoding arithmetic calculation means which is shifted-up by one bit as a target encoding pixel which immediately precedes the target encoding pixel if one renormalization processing for the target encoding pixel is required; and an encoding C data output means for receiving the C data from the encoding arithmetic calculation means, giving a C data received from the encoding arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required;

a decoding A data output means for receiving the A data from the decoding arithmetic calculation means, giving an A data received from the decoding arithmetic calculation means as a target decoding pixel which immediately precedes the target decoding pixel if no renormalization processing for the target decoding pixel is required, and giving the A data received from the decoding arithmetic calculation means which is shifted-up by one bit as a target decoding pixel which immediately precedes the target decoding pixel if one renormalization processing for the target decoding pixel is required; and a decoding C data output means (110,111) for receiving the C data from the decoding arithmetic calculation means, and also receiving the received encoded data via input means, giving a content latched according to the encoded data and a C data received from the decoding arithmetic calculation means as a target decoding pixel which immediately precedes the target decoding pixel if no renormalization processing for the target decoding pixel is required, and giving the C data received from the decoding arithmetic calculation means and a content latched according to the encoded data which are shifted-up by one bit as a target decoding pixel which immediately precedes the target decoding pixel, if one renormalization processing for the target decoding pixel is required.

4. The digital information encoding/decoding device of claim 1 comprising:

an encoding A register for latching-up the A data from the encoding arithmetic calculation means, for outputting contents of the latched A data as an A data, and for outputting a renormalizing signal for conducting a normalization processing, and a last renormalizing signal which indicates that the normalization will be completed by the last one processing;

an encoding A selector for receiving the A data form the encoding A register and a shift-up selection signal based on the last renormalizing signal, for giving an A data from the encoding A register which is shifted-up by one bit to the encoding arithmetic calculation means as an A data for a pixel which immediately precedes the target encoding pixel if said sift-up selection signal indicates "shift-up", otherwise, for giving an A data from the encoding A register to the encoding arithmetic calculation means as an A data for a pixel which immediately precedes the target encoding pixel, without shifting-up;

an encoding C register for outputting a C data from the encoding arithmetic calculation means is latched, and contents of the latched C data is outputted as a C data;

an encoding C selector for receiving the C data from the encoding C register and the shift-up selection signal, for giving a C data from the encoding C register which is shifted-up by one bit to the encoding arithmetic calculation means as an A data for a pixel which immediately precedes the target encoding pixel if said sift-up selection signal indicates "shift-up", otherwise, for giving a C data from the encoding C register to the encoding arithmetic calculation means as a C data for a pixel which immediately precedes the target encoding pixel, without shifting-up;

a decoding A register for latching-up the A data from the decoding arithmetic calculation means, for outputting contents of the latched A data as an A data, and for outputting a renormalizing signal for conducting a normalization processing, and a last renormalizing signal which indicates that the normalization will be completed by the last one processing;

a decoding A selector for receiving the A data form the decoding A register and a shift-up selection signal based on the last renormalizing signal, for giving an A data from the decoding A register which is shifted-up by one bit to the decoding arithmetic calculation means as an A data for a pixel which immediately precedes the target encoding pixel if said sift-up selection signal indicates "shift-up", otherwise, for giving an A data from the decoding A register to the decoding arithmetic calculation means as an A data for a pixel which immediately precedes the target encoding pixel, without shifting-up;

a decoding C register for receiving a C data from the decoding arithmetic calculation means, and an encoded data via an input means, and outputting contents latched therein as a C data according to the C data and the encoded data received therein; and an encoding A selector for receiving the C data form the decoding C register and a shift-up selection signal, for giving a C data from the decoding C register which is shifted-up by one bit to the decoding arithmetic calculation means as a C data for a pixel which immediately precedes the target decoding pixel if said sift-up selection signal indicates "shift-up", otherwise, for giving a C data from the decoding C register to the decoding arithmetic calculation means as a C data for a pixel which immediately precedes the target decoding pixel, without shifting-up.

5. A digital information encoding device comprising:

context generation means for extracting a reference pixel from an inputted picture data according to a template model, and for generating a context for a target encoding pixel;

context table storage means for storing a plurality of bits having a prediction symbol and a probability estimating data, for outputting one storing data out of the plurality of storing data according to a context for the received target encoding pixel from the context generating means, wherein the storing data based on the context for the target encoding pixel are rewritten by an inputted renewal data of a plurality of bits having a prediction symbol and a probability estimating data, when a renormalizing processing is required for the target encoding pixel;

arithmetic calculation means for receiving a picture data for the target encoding pixel, a storing data which is outputted from the context table storage means, an A data indicating the size of the current interval for a pixel which immediately precedes the target encoding pixel, and a C data indicating the trailing bits of the code stream for a pixel which immediately precedes the target encoding pixel, and conducting a predetermined arithmetic processing, for outputting an A data indicating the size of the current interval for the target encoding pixel and a C data indicating the trailing bits of the code stream for the target encoding pixel, and for outputting an index data including a prediction symbol and a probability estimation index indicating a status number to the context table storage means; and probability estimating table storage means (5) for storing a plurality of probability estimating data of a plurality of bits which serves as a probability estimating data in the renewal data, for outputting one probability estimating data out of the plurality of probability estimating data according to a probability estimation index in an index data from the arithmetic calculation means, and a prediction symbol in the index data from the arithmetic calculation means, to the context table storage means, as a renewal data.

6. The digital information encoding device of claim 5, further comprising:

an A register for latching the A data from the arithmetic calculation means, outputting contents of the latched A data as an A data, and outputting a renormalizing signal for conducting a normalization processing and a last renormalizing signal which indicates that the normalization will be completed by the last one processing;

an A selector for receiving the A data form the A register and a shift-up selection signal based on the last renormalizing signal, and for outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

a C register for latching a C data from the arithmetic calculation means and outputting the latched contents as a C data; and a C register for receiving the C data from the C register and the shift-up selection signal, and for outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

7. The digital information encoding device of claim 5, further comprising:

an A data output means for receiving the A data from the arithmetic calculation means, giving an A data received from the arithmetic calculation means as a target encoding pixel which immediately precedes the target encoding pixel if no renormalization processing for the target encoding pixel is required, and giving the A data received from the arithmetic calculation means which is shifted-up by one bit as a target encoding pixel which immediately precedes the target encoding pixel if one renormalization processing for the target encoding pixel is required; and a C data output means for receiving the C data from the arithmetic calculation means, giving a C data received from the arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required.

8. A digital information encoding device comprising:

context generation means for extracting a reference pixel from an inputted picture data according to a template model, and for generating a context for a target encoding pixel;

context storage means for temporarily storing the context for the target encoding pixel which is received from the context generation means;

context table storage means for storing a plurality of storing data comprising a prediction symbol and a probability estimating data wherein the probability estimating data comprises an LSZ data indicating a mismatching probability, an NLPS data which serves as a probability estimation index of a renewal data if the prediction symbol corresponding to the probability estimating data does not match with a picture data for the target encoding pixel, an NMPS data which serves as a probability estimation index of a renewal data if the prediction symbol corresponding to the probability estimating data matches with a picture data for the target encoding pixel, and a SWITCH data which indicates whether or not to invert the prediction symbol corresponding to the probability estimating data, for outputting one storing data out of the plurality of storing data according to a context for a target encoding pixel, wherein one storing data in a plurality of storing data according to a context for the target encoding pixel which is stored temporarily in the context storage means is rewritten by an inputted renewal data of a plurality of bits having a prediction symbol and a probability estimating data;

arithmetic calculation means for performing arithmetic processing according to equations (1) and (2) below, and outputting the A data and the C data for the target encoding pixel, if the picture data for the target encoding pixel matches with the prediction symbol in the storing data from the context table storage means, for performing arithmetic processing according to the equations (3) and (4) below and outputting the A data and the C data for the target encoding pixel, if said picture data for the target encoding pixel does not match with the prediction symbol in the storing data from the context table storage means, for inverting a value of the prediction symbol in the storing data from the context table storage means, if said SWITCH data in the probability estimating data in the storing data from the context table storage means indicates a prediction symbol should be inverted, and also the picture data for the target encoding pixel does not match with the prediction symbol in the storing data from the context table storage means, otherwise, outputting the same values as that of the prediction symbol in the storing data from the context table storage means as a prediction symbol, for outputting said NMPS data in the probability estimating data in the storing data from the context table storage means as a probability estimation index of the renewal data, if said picture data for the target encoding pixel matches with the prediction symbol in the storing data from the context table storage means, and for outputting said NLPS data in the probability estimating data in the storing data from the context table storage means as a probability estimation index of the renewal data, if said picture data for the target encoding pixel does not match with the prediction symbol in the storing data from the context table storage means; and a probability estimating table storage means (5) for storing a plurality of probability estimating data comprising the LSZ data, the NLPS data, the NMPS data and the SWITCH data, and for outputting one probability estimating data out of the plurality of probability estimating data according to a probability estimation index from the arithmetic calculation means, to the context table storage means with a prediction symbol from the arithmetic calculation means, as the renewal data; wherein $$A(k)=A(k-1)-LSZ(k) \quad (1)$$

$$C(k)=C(k-1)\text{tm} \quad (2)$$

$$A(k)=LSZ(k) \quad (3)$$

$$C(k)=C(k-1)+\{A(k-1)-LSZ(k)\} \quad (4)$$

where A(k) is an A data of the target encoding pixel (a k-th target encoding pixel), A(k−1) is an A data of a target encoding pixel which immediately precedes the target encoding pixel {a(k−1)-th target encoding pixel}, C(k) is a C data of the target encoding pixel (a k-th target encoding pixel), C(k−1) is a C data of a target encoding pixel which immediately precedes the target encoding pixel {a(k−1)-th target encoding pixel}, LSZ(k) is an LSZ data indicating a mismatching probability of a probability estimating data for the target encoding pixel (a k-th target encoding pixel) from the probability estimating table storage means, and k=1, 2, 3, . . . n where n is a positive integer.

9. The digital information encoding device of claim 8, further comprising:

an A register for latching the A data from the arithmetic calculation means, outputting contents of the latched A data as an A data, and outputting a renormalizing signal for conducting a normalization processing and a last renormalizing signal which indicates that the normalization will be completed by the last one processing;

an A selector for receiving the A data form the A register and a shift-up selection signal based on the last renormalizing signal, and outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

a C register for latching a C data from the arithmetic calculation means and outputting the latched contents as a C data; and a C register for receiving the C data from the C register and the shift-up selection signal, and outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

10. The digital information encoding device of claim 8, further comprising:

an A data output means for receiving the A data from the arithmetic calculation means, giving an A data received from the arithmetic calculation means as a target encoding pixel which immediately precedes the target encoding pixel if no renormalization processing for the target encoding pixel is required, and giving the A data received from the arithmetic calculation means which is shifted-up by one bit as a target encoding pixel which immediately precedes the target encoding pixel if one renormalization processing for the target encoding pixel is required; and a C data output means for receiving the C data from the arithmetic calculation means, giving a C data received from the arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required.

11. A digital information encoding device comprising:

context generation means for extracting a reference pixel from an inputted picture data according to a template model, and for generating a context for a target encoding pixel;

context storage means for temporarily storing the context for the target encoding pixel which is received from the context generation means;

context table storage means for storing a plurality of storing data having a prediction/index symbol and an LSZ data which indicates a mismatching probability which constitutes a first portion of a probability estimating data, and outputting one storing data out of the plurality of storing data according to a context for the received pixels to be encoded from the context generating means, wherein one storing data in a plurality of storing data according to a context for the target encoding pixel which is stored temporarily in the context storage means is rewritten by the prediction/index data and the LSZ data which constitutes a first portion of a probability estimating data;

a first probability estimating table storage means for storing a plurality of second portions other than the LSZ data in a probability estimating data, namely, an NLPS data which serves as a probability estimation index of a renewal data if said prediction symbol in a prediction/index data for the target encoding pixel from the context table storage means does not match with a picture data for the target encoding pixel, an NMPS data which serves as a probability estimation index of a renewal data if said prediction symbol in a prediction/ index data for the target encoding pixel from the context table storage means matches with a picture data for the target encoding pixel, and a SWITCH data which indicates whether or not to invert a prediction symbol in a prediction/index data stored in the context table storage means, for outputting a second portion in one of the plurality of probability estimating data according to a probability estimation index of a prediction/index data in a storing data from the context table storage means;

arithmetic calculation means for performing arithmetic processing according to equations (1) and (2) below, and outputting the A data and the C data for the target encoding pixel, if said picture data for the target encoding pixel matches with the prediction symbol in the prediction/index data in a storing data from the context table storage means, for performing arithmetic processing according to the equations (3) and (4) below and outputting the A data and the C data for the target encoding pixel, if said picture data for the target encoding pixel does not match with the prediction symbol in the prediction/ index data in the storing data from the context table storage means, for inverting a value of said prediction symbol in the storing data from the context table storage means, if said SWITCH data in the second portion of the probability estimating data from the first probability estimating table storage means indicates a prediction symbol should be inverted and also the picture data for the target encoding pixel does not match with the prediction symbol in the prediction/index data in the storing data from the context table storage means, otherwise, outputting a same value as that of the prediction symbol in the prediction/index data in storing data from the context table storage means is outputted as a prediction symbol in the prediction/index data in the renewal data, for outputting said NMPS data in the probability estimating data from the first probability estimating table storage means as a probability estimation index of the renewal data, if said picture data for the target encoding pixel matches with the prediction symbol in the prediction/index data in storing data from the context table storage means, for outputting said NLPS data in the probability estimating data from the first probability estimating table storage means as a probability estimation index of the renewal data, if said picture data for the target encoding pixel does not match with the prediction symbol in the prediction/index data in the storing data from the context table storage means; and second probability estimating table storage means for storing a plurality of first portions in probability estimating data comprising the LSZ data, and outputting a first portion in one of the plurality of probability estimating data according to a probability estimation index from the arithmetic calculation means, to the context table storage means as a first portion of a probability estimating data in the renewal data; wherein $$A(k)=A(k-1)-LSZ(k) \quad (1)$$

$$C(k)=C(k-1) \quad (2)$$

$$A(k)=LSZ(k) \quad (3)$$

$$C(k)=C(k-1)+\{A(k-1)-LSZ(k)\} \quad (4)$$

where $A(k)$ is an A data of the target encoding pixel (a k-th target encoding pixel), $A(k-1)$ is an A data of a target encoding pixel which immediately precedes the target encoding pixel {a(k-1)-th target encoding pixel}, $C(k)$ is a C data of the target encoding pixel (a k-th target encoding pixel), $C(k-1)$ is a C data of a target encoding pixel which immediately precedes the target encoding pixel {a(k-1)-th target encoding pixel}, $LSZ(k)$ is an LSZ data indicating a mismatching probability of a probability estimating data for the target encoding pixel (a k-th target encoding pixel) from the probability estimating table storage means, and k=1, 2, 3, . . . n where n is a positive integer.

12. The digital information encoding device of claim 11, further comprising:

an A register for latching the A data from the arithmetic calculation means, outputting contents of the latched A data as an A data, and outputting a renormalizing signal for conducting a normalization processing and a last renormalizing signal which indicates that the normalization will be completed by the last one processing;

an A selector for receiving the A data form the A register and a shift-up selection signal based on the last renormalizing signal, and outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

a C register for latching a C data from the arithmetic calculation means and outputting the latched contents as a C data; and a C register for receiving the C data from the C register and the shift-up selection signal, and outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

13. The digital information encoding device of claim 11, further comprising:

an A data output means for receiving the A data from the arithmetic calculation means, giving an A data received from the arithmetic calculation means as a target encoding pixel which immediately precedes the target encoding pixel if no renormalization processing for the target encoding pixel is required, and giving the A data received from the arithmetic calculation means which is shifted-up by one bit as a target encoding pixel which immediately precedes the target encoding pixel if one renormalization processing for the target encoding pixel is required; and a C data output means for receiving the C data from the arithmetic calculation means, giving a C data received from the arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required.

14. A digital information decoding device comprising:

context generation means for receiving a decoded picture data, and for extracting a reference pixel from the received picture data according to a template model to generate a context for a target decoding pixel;

context table storage means for storing a plurality of storing data of a plurality of bits having a prediction symbol and a probability estimating data, and outputting one storing data out of the plurality of storing data according to a context for the received target decoding pixel from the context generating means, wherein the storing data based on the context for the target decoding pixel are rewritten by an inputted renewal data of a plurality of bits having a prediction symbol and a probability estimating data, when a renormalizing processing is required for the target decoding pixel;

arithmetic calculation means for receiving a storing data from the context table storage means, an A data indicating the size of the current interval for a pixel which immediately precedes the target decoding pixel, and a C data indicating the trailing bits of the code stream for a pixel which immediately precedes the target decoding pixel, and conducting a predetermined arithmetic processing, for outputting an A data indicating the size of the current interval for the target decoding pixel and a C data indicating the trailing bits of the code stream for the target decoding pixel, and outputting an index data including a prediction symbol and a probability estimation index indicating a status number to the context table storage means, and also outputting a decoded picture data for the target decoding pixel; and probability estimating table storage means for storing a plurality of probability estimating data of a plurality of bits which serves as a probability estimating data in the renewal data, and outputting one probability estimating data out of the plurality of probability estimating data according to a probability estimation index in an index data from the arithmetic calculation means, and a prediction symbol in the index data from the arithmetic calculation means, to the context table storage means, as a renewal data.

15. The digital information decoding device of claim 14, further comprising:

A register for latching the A data from the arithmetic calculation means, outputting contents of the latched A data as an A data, and outputting a renormalizing signal for conducting a normalization processing and a last renormalizing signal which indicates that the normalization will be completed by the last one processing;

A selector for receiving the A data form the A register and a shift-up selection signal based on the last renormalizing signal, and outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

C register for latching a C data from the arithmetic calculation means and outputting the latched contents as a C data; and C selector (111) for receiving the C data from the C register and the shift-up selection signal, and outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

16. The digital information decoding device of claim 14, further comprising:

an A data output means for receiving the A data from the arithmetic calculation means, giving an A data received from the arithmetic calculation means as a target decoding pixel which immediately precedes the target decoding pixel if no renormalization processing for the target decoding pixel is required, and giving the A data received from the arithmetic calculation means which is shifted-up by one bit as a target decoding pixel which immediately precedes the target decoding pixel if one renormalization processing for the target decoding pixel is required; and a C data output means (110,111) for receiving the C data from the arithmetic calculation means, and also receiving the received encoded data via input means, giving a content latched according to the encoded data and a C data received from the arithmetic calculation means as a target decoding pixel which immediately precedes the target decoding pixel if no renormalization processing for the target decoding pixel is required, and giving the C data received from the arithmetic calculation means and a content latched according to the encoded data which are shifted-up by one bit as a target decoding pixel which immediately precedes the target decoding pixel, if one renormalization processing for the target decoding pixel is required.

17. A digital information decoding device comprising:

context generation means for receiving a decoded picture data, extracting a reference pixel from the received picture data according to a template model to generate a context for a target decoding pixel;

context storage means for temporarily storing the context for the target decoding pixel which is received from the context generation means;

context table storage means for storing a plurality of storing data comprising a prediction symbol and a probability estimating data, wherein the probability estimating data comprises an LSZ data indicating mismatching probability, an NLPS data which serves as a probability estimation index of a renewal data if equation (5) below is not satisfied, an NMPS data which serves as a probability estimation index of a renewal data if said equation (5) is satisfied, and a SWITCH data which indicates whether or not to invert the prediction symbol corresponding to the probability estimation data, for outputting one storing data out of the plurality of storing data according to a context for a target decoding pixel from the context generation means, wherein one storing data in a plurality of storing data according to a context for the target decoding pixel which is stored temporarily in the context storage means is rewritten by an inputted renewal data of a plurality of bits having a prediction symbol and probability estimating data;

arithmetic calculation means for performing an arithmetic processing according to said equation (5), for performing arithmetic processing according to equations (6) and (7) below to output the A data and the C data for the target decoding pixel if said equation (5) is satisfied, for performing arithmetic processing according to equations (8) and (9) below to output the A data and the C data for the target decoding pixel if said equation (5) is not satisfied, for inverting a value of said prediction symbol in the storing data from the context table storage means, if said SWITCH data in the probability estimating data in the storing data from the context table storage means indicates a prediction symbol should be inverted, and also if said equation (5) is not satisfied, otherwise, outputting the same value as that of the prediction symbol in the storing data from the context table storage means as a prediction symbol, for outputting the NMPS data in the probability estimating data in the storing data from the context table storage means as a probability estimation index of the renewal data, if said equation (5) is satisfied, for outputting the NLPS data in the probability estimating data in the storing data from the context table storage means as a probability estimation index of the renewal data, if said equation (5) is not satisfied, for outputting a same value as that of the prediction symbol in the storing data from the context table storage means as a decoded picture data for the target decoding pixel, if said equation (5) is satisfied, for inverting the value of the prediction symbol in the storing data from the context table storage means and then outputting as a decoded picture data for the target decoding pixel, if said equation (5) is not satisfied; and a probability estimating table storage means for storing a plurality of probability estimating data comprising the LSZ data, the NLPS data, the NMPS data and the SWITCH data, and outputting one probability estimating data according to a probability estimation index from the arithmetic calculation means to the context table storage means with a prediction symbol from the arithmetic calculation means, as the renewal data; wherein $$C(k-1) < A(k-1) - LSZ(k) \quad (5)$$

$$A(k) = A(k-1) - LSZ(k) \quad (6)$$

$$C(k) = C(k-1) \quad (7)$$

$$A(k) = LSZ(k) \quad (8)$$

$$C(k) = C(k-1) + \{A(k-1) - LSZ(k)\} \quad (9)$$

where A(k) is an A data of the target decoding pixel (a k-th target decoding pixel), A(k−1) is an A data of a target decoding pixel which immediately precedes the target decoding pixel {a(k−1)-th target decoding pixel}, C(k) is a C data of the target decoding pixel (a k-th target decoding pixel), C(k−1) is a C data of a target decoding pixel which immediately precedes the target decoding pixel {a(k−1)-th target decoding pixel}, LSZ(k) is an LSZ data indicating a mismatching probability of a probability estimating data for the target decoding pixel (a k-th target decoding pixel) from the probability estimating table storage means, and k=1, 2, 3, ... n where n is a positive integer.

18. The digital information decoding device of claim 17, further comprising:

an A register for latching the A data from the arithmetic calculation means, outputting contents of the latched A data as an A data, and outputting a renormalizing signal for conducting a normalization processing and a last renormalizing signal which indicates that the normalization will be completed by the last one processing;

an A selector for receiving the A data form the A register and a shift-up selection signal based on the last renormalizing signal, and outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

a C register for latching a C data from the arithmetic calculation means and outputting the latched contents as a C data; and a C selector (111) for receiving the C data from the C register and the shift-up selection signal, and outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

19. The digital information decoding device of claim 17, further comprising:

an A data output means for receiving the A data from the arithmetic calculation means, giving an A data received from the arithmetic calculation means as a target encoding pixel which immediately precedes the target encoding pixel if no renormalization processing for the target encoding pixel is required, and giving the A data received from the arithmetic calculation means which is shifted-up by one bit as a target encoding pixel which immediately precedes the target encoding pixel if one renormalization processing for the target encoding pixel is required; and a C data output means (110,111) for receiving the C data from the arithmetic calculation means, and also receiving the received encoded data via input means, giving a content latched according to the encoded data and a C data received from the arithmetic calculation means as a target decoding pixel which immediately precedes the target decoding pixel if no renormalization processing for the target decoding pixel is required, and giving the C data received from the arithmetic calculation means and a content latched according to the encoded data which are shifted-up by one bit as a target decoding pixel which immediately precedes the target decoding pixel, if one renormalization processing for the target decoding pixel is required.

20. A digital information decoding device comprising:

context generation means for receiving a decoded picture data, extracting a reference pixel from the received picture data according to a template model to generate a context for a target decoding pixel;

context storage means for temporarily storing the context for the target decoding pixel which is received from the context generation means;

context table storage means (114) for storing a plurality of storing data comprising an LSZ data which indicates a mismatching probability which constitutes a first portion of a prediction/index data and a probability estimating data, and outputting one storing data out of the plurality of storing data according to a context for the received target decoding pixel from the context generation means, wherein one storing data in a plurality of storing data according to a context for the target decoding pixel which is stored temporarily in the context storage means is rewritten by an inputted renewal data comprising a prediction/index data and an LSZ data which constitutes the first portion of that of a probability estimating data;

first probability estimating table storage means (115) for storing a plurality of second portions data in a probability estimating data other than the LSZ, namely, an NLPS data which serves as a probability estimation index of a renewal data if an equation (5) below is not satisfied, an NMPS data which serves as a probability estimation index of a renewal data if said equation (5) is satisfied, and a SWITCH data which indicates whether or not to invert a prediction symbol in a prediction/index data stored in the context table storage means, and for outputting a second portion in one of the plurality of probability estimating data according to a probability estimation index of a prediction/index data in a storing data from the context table storage means;

an arithmetic calculation means for performing arithmetic processing according to said equation (5), for performing an arithmetic processing according to equations (6) and (7) below to output the A data and the C data for the target decoding pixel if said equation (5) is satisfied, for inverting an arithmetic processing according to equations (8) and (9) below to output the A data and the C data for the target decoding pixel, if said equation (5) is not satisfied, for inverting a value of the prediction symbol of the prediction/index data in the storing data from the context table storage means, if said SWITCH data in the second portion of the probability estimating data from the first probability estimating table storage means indicates a prediction symbol should be inverted, and if said equation (5) is not satisfied, otherwise, outputting the same value as that of the prediction symbol in the prediction/index data in the storing data from the context table storage means as a prediction symbol in the prediction/index data in the renewal data, for outputting the NMPS data in the probability estimating data from the first probability estimating table storage means as a probability estimation index of the renewal data, if said equation (5) is not satisfied, and outputting the NLPS data in the probability estimating data from the first probability estimating table storage means as a probability estimation index of the renewal data, for outputting the same value as that of the prediction symbol in the prediction/index data in storing data from the context table storage means as a decoded picture data for the target decoding pixel, if said equation (5) is satisfied, for inverting the value of the prediction symbol in the prediction/index data in the storing data from the context table storage means and then outputting as a decoded picture data for the target decoding pixel, if said equation is not satisfied; and a second probability estimating table storage means (116) for storing a plurality of first portions in probability estimating data, and outputting a first portion in one of the plurality of probability estimating data according to a probability estimation index from the arithmetic calculation means, to the context table storage means as a first portion of a probability estimating data in the renewal data; wherein $$C(k-1) < A(k-1) - LSZ(k) \quad (5)$$

$$A(k) = A(k-1) - LSZ(k) \quad (6)$$

$$C(k) = C(k-1) \quad (7)$$

$$A(k) = LSZ(k) \quad (8)$$

$$C(k) = C(k-1) + \{A(k-1) - LSZ(k)\} \quad (9)$$

where A(k) is an A data of the target decoding pixel (a k-th target decoding pixel), A(k-1) is an A data of a target decoding pixel which immediately precedes the target decoding pixel {a(k-1)-th target decoding pixel}, C(k) is a C data of the target decoding pixel (a k-th target decoding pixel), C(k-1) is a C data of a target decoding pixel which immediately precedes the target decoding pixel {a(k-1)-th target decoding pixel}, LSZ(k) is an LSZ data indicating a mismatching probability of a probability estimating data for the target decoding pixel (a k-th target decoding pixel) from the probability estimating table storage means, and k=1, 2, 3, . . . n where n is a positive integer.

21. The digital information decoding device of claim 20, further comprising:

an A register for latching the A data from the arithmetic calculation means, outputting contents of the latched A data as an A data, and outputting a renormalizing signal for conducting a normalization processing and a last renormalizing signal which indicates that the normalization will be completed by the last one processing;

an A selector for receiving the A data form the A register and a shift-up selection signal based on the last renormalizing signal, and outputting the A data from the A register which is shifted-up by one bit if said selection signal indicates "shift-up", or otherwise, outputting the A data from the A register without shifting-up, to the arithmetic calculation means, as an A data for a pixel which immediately precedes the target encoding pixel;

a C register for latching a C data from the arithmetic calculation means and outputting the latched contents as a C data; and a C selector (111) for receiving the C data from the C register and the shift-up selection signal, and outputting the C data from the C register which is shifted-up by one bit if said selection signal indicates "shift-up", or otherwise, outputting the C data from the C register without shifting-up, to the arithmetic calculation means, as a C data for a pixel which immediately precedes the target encoding pixel.

22. The digital information decoding device of claim 20, further comprising:

an A data output means for receiving the A data from the arithmetic calculation means, giving an A data received from the arithmetic calculation means as a target encoding pixel which immediately precedes the target encoding pixel if no renormalization processing for the target encoding pixel is required, and giving the A data received from the arithmetic calculation means which is shifted-up by one bit as a target encoding pixel which immediately precedes the target encoding pixel if one renormalization processing for the target encoding pixel is required; and a C data output means (110,111) for receiving the C data from the arithmetic calculation means, and also receiving the received encoded data via input means, giving a content latched according to the encoded data and a C data received from the arithmetic calculation means as a target decoding pixel which immediately precedes the target decoding pixel if no renormalization processing for the target decoding pixel is required, and giving the C data received from the arithmetic calculation means and a content latched according to the encoded data which are shifted-up by one bit as a target decoding pixel which immediately precedes the target decoding pixel, if one renormalization processing for the target decoding pixel is required.

23. A digital information encoding/decoding device comprising:

context generation means for receiving a picture data selected from either an inputted picture data or a decoded picture data, and for extracting a reference pixel from the received picture data according to a template model, and for generating a context for a target encoding pixel if said selected picture data is the inputted picture data, and for generating a context for a target decoding pixel if said selected picture data is the decoded picture data;

context table storage means for storing a plurality of storing data of a plurality of bits having a prediction symbol and a probability estimating data, wherein, in case of encoding, one storing data out of the plurality of storing data is outputted according to a context for the received target encoding pixel from the context generating means, and the storing data based on the context for the target encoding pixel is rewritten by an inputted renewal data of a plurality of bits having a prediction symbol and a probability estimating data, when a renormalizing processing is required for the target encoding pixel, and in case of decoding, one storing data out of the plurality of storing data is outputted according to a context for the received target decoding pixel, and the storing data based on the context for the target decoding pixel is rewritten by an inputted renewal data of a plurality of bits having a prediction symbol and a probability estimating data, when a renormalizing processing is required for the target decoding pixel;

encoding arithmetic calculation means for receiving, in case of encoding, a picture data for the target encoding pixel, a storing data outputted from the context table storage means, an A data indicating the size of the current interval for a pixel which immediately precedes the target encoding pixel, and a C data indicating the trailing bits of the code stream for a pixel which immediately precedes the target encoding pixel, for conducting a predetermined arithmetic processing, and outputting an A data indicating the size of the current interval for the target encoding pixel and a C data indicating the trailing bits of the code stream for the target encoding pixel, and also outputting an index data including the prediction symbol and the probability estimation index which indicates a status number;

decoding arithmetic calculation means for receiving, in case of decoding, a storing data outputted from the context table storage means, an A data indicating the size of the current interval for a pixel which immediately precedes the target decoding pixel, and a C data indicating the trailing bits of the code stream for a pixel which immediately precedes the target decoding pixel, for conducting a predetermined arithmetic processing, and outputting an A data indicating the size of the current interval for flag target decoding pixel and a C data indicating the trailing bits of the code stream for the target decoding pixel, and for outputting an index data including the prediction symbol and the probability estimation index which indicates a status number, and also for outputting a decoded picture data for the target decoding pixel; and probability estimating table storage means for storing a plurality of probability estimating data of a plurality of bits which serves as a probability estimating data in the renewal data, for outputting, in case of encoding, one probability estimating data out of the plurality of probability estimating data, and a prediction symbol in the index data from the encoding arithmetic calculation means, to the context table storage means, as the renewal data and, according to a probability estimation index in an index data from the encoding arithmetic calculation means, and for outputting, in case of decoding, one probability estimating data out of the plurality of probability estimating data and a prediction symbol in the index data from the decoding arithmetic calculation means, to the context table storage means, as the renewal data, according to a probability estimation index in an index data from the decoding arithmetic calculation means.

24. The digital information encoding/decoding device of claim 23 comprising:

an encoding A register for latching-up the A data from the encoding arithmetic calculation means, for outputting contents of the latched A data as an A data, and for outputting a renormalizing signal for conducting a normalization processing, and a last renormalizing signal which indicates that the normalization will be completed by the last one processing;

an encoding A selector for receiving the A data form the encoding A register and a shift-up selection signal based on the last renormalizing signal, for giving an A data from the encoding A register which is shifted-up by one bit to the encoding arithmetic calculation means as an A data for a pixel which immediately precedes the target encoding pixel if said sift-up selection signal indicates "shift-up", otherwise, for giving an A data from the encoding A register to the encoding arithmetic calculation means as an A data for a pixel which immediately precedes the target encoding pixel, without shifting-up;

an encoding C register for outputting a C data from the encoding arithmetic calculation means is latched, and contents of the latched C data is outputted as a C data;

an encoding C selector for receiving the C data from the encoding C register and the shift-up selection signal, for giving a C data from the encoding C register which is shifted-up by one bit to the encoding arithmetic calculation means as an A data for a pixel which immediately precedes the target encoding pixel if said sift-up selection signal indicates "shift-up", otherwise, for giving a C data from the encoding C register to the encoding arithmetic calculation means as a C data for a pixel which immediately precedes the target encoding pixel, without shifting-up;

a decoding A register for latching-up the A data from the decoding arithmetic calculation means, for outputting contents of the latched A data as an A data, and for outputting a renormalizing signal for conducting a normalization processing, and a last renormalizing signal which indicates that the normalization will be completed by the last one processing;

a decoding A selector for receiving the A data form the decoding A register and a shift-up selection signal based on the last renormalizing signal, for giving an A data from the decoding A register which is shifted-up by one bit to the decoding arithmetic calculation means as an A data for a pixel which immediately precedes the target encoding pixel if said sift-up selection signal indicates "shift-up", otherwise, for giving an A data from the decoding A register to the decoding arithmetic calculation means as an A data for a pixel which immediately precedes the target encoding pixel, without shifting-up;

a decoding C register for receiving a C data from the decoding arithmetic calculation means, and an encoded data via an input means, and outputting contents latched therein as a C data according to the C data and the encoded data received therein; and a decoding A selector for receiving the C data form the decoding C register and a shift-up selection signal, for giving a C data from the decoding C register which is shifted-up by one bit to the decoding arithmetic calculation means as a C data for a pixel which immediately precedes the target decoding pixel if said shift-up selection signal indicates "shift-up", otherwise, for giving a C data from the decoding C register to the decoding arithmetic calculation means as a C data for a pixel which immediately precedes the target decoding pixel, without shifting-up.

25. The digital information encoding/decoding device of claim 22, further comprising:

an encoding A data output means for receiving the A data from the encoding arithmetic calculation means, giving an A data received from the encoding arithmetic calculation means as a target encoding pixel which immediately precedes the target encoding pixel if no renormalization processing for the target encoding pixel is required, and giving the A data received from the encoding arithmetic calculation means which is shifted-up by one bit as a target encoding pixel which immediately precedes the target encoding pixel if one renormalization processing for the target encoding pixel is required; and an encoding C data output means for receiving the C data from the encoding arithmetic calculation means, giving a C data received from the encoding arithmetic calculation means as a target encoding pixel which immediately precedes the target encoding pixel if no renormalization processing for the target encoding pixel is required, and giving the C data received from the arithmetic calculation means which is shifted-up by one bit as a target encoding pixel which immediately precedes the target encoding pixel, and outputting them as encoded data, if one renormalization processing for the target encoding pixel is required;

a decoding A data output means for receiving the A data from the decoding arithmetic calculation means, giving an A data received from the decoding arithmetic calculation means as a target decoding pixel which immediately precedes the target decoding pixel if no renormalization processing for the target decoding pixel is required, and giving the A data received from the decoding arithmetic calculation means which is shifted-up by one bit as a target decoding pixel which immediately precedes the target decoding pixel if one renormalization processing for the target decoding pixel is required; and a decoding C data output means (110,111) for receiving the C data from the decoding arithmetic calculation means, and also receiving the received encoded data via input means, giving a content latched according to the encoded data and a C data received from the decoding arithmetic calculation means as a target decoding pixel which immediately precedes the target decoding pixel if no renormalization processing for the target decoding pixel is required, and giving the C data received from the decoding arithmetic calculation means and a content latched according to the encoded data which are shifted-up by one bit as a target decoding pixel which immediately precedes the target decoding pixel, if one renormalization processing for the target decoding pixel is required.

26. A digital information encoding/decoding device comprising:

context generation means for receiving a picture data selected from either an inputted picture data or a decoded picture data, and for extracting a reference pixel from the received picture data according to a template model, and for generating a context for a target encoding pixel if said selected picture data is the inputted picture data, and for generating a context for a target decoding pixel if said selected picture data is the decoded picture data;

context storage means for temporarily storing, in case of encoding, the context for the target encoding pixel from the context generation means, and for temporarily storing, in case of decoding, the context for the target decoding pixel from the context generation means;

context table storage means for storing a plurality of storing data having an LSZ data which constitutes a first portion of a prediction/index data and a probability estimating data and indicates a mismatching probability, and receiving a context from the context generation means, for outputting, in case of encoding, one storing data out of the plurality of storing data according to a context for the received target encoding pixel from the context generation means, wherein, one storing data in a plurality of storing data stored is rewritten by an inputted renewal data comprising an LSZ data which constitutes the first portion of a prediction/index data and the probability estimating data according to a context for the target encoding pixel which is stored temporarily in the context storage means, and for outputting, in case of decoding, one storing data out of the plurality of storing data according to a context for the received target decoding pixel from the context generating means, wherein one storing data in a plurality of storing data according to a context for the target decoding pixel which is stored temporarily in the context storage means is rewritten by an inputted renewal data comprising an LSZ data which constitutes the first portion of a prediction/index data and the probability estimating data;

first probability estimating table storage means for storing a plurality of second portions other than the LSZ data in a probability estimating data, namely, an NLPS data which serves as a probability estimation index of a renewal data if said prediction symbol in a prediction/index data for the target encoding pixel from the context table storage means does not match with a picture data for the target encoding pixel in case of encoding, and which serves as a probability estimation index of a renewal data if the equation (5) below is not satisfied in case of decoding, an NMPS data which serves as a probability estimation index of a renewal data if said prediction symbol in a prediction/index data for the target encoding pixel from the context table storage means matches with a picture data for the target encoding pixel in case of encoding, and which serves as a probability estimation index of a renewal data if said equation (5) is satisfied in case of decoding, and a SWITCH data which indicates whether or not to invert a prediction symbol in a prediction/index data stored in the context table storage means, for outputting a second portion in one of the plurality of probability estimating data according to a probability estimation index of a prediction/index data in a storing data from the context table storage means;

an encoding arithmetic calculation means, in case of encoding, for performing an arithmetic processing according to equations (1) and (2) below, and outputting the A data and the C data for the target encoding pixel, if said picture data for the target encoding pixel matches with the prediction symbol in the prediction/index data in the storing data from the context table storage means, for performing an arithmetic processing according to equations (3) and (4) below, and outputting the A data and the C data for the target encoding pixel, if said picture data for the target encoding pixel does not match with the prediction symbol in the prediction/index data in the storing data from the context table storage means, for inverting a value of the prediction symbol in the storing data from the context table storage means, if said SWITCH data in the second portion of the probability estimating data in the storing data from the first probability estimating table storage means indicates a prediction symbol should be inverted and also the picture data for the target encoding pixel does not match with the prediction symbol in the prediction/ index data in storing data from the context table storage means is outputted as a prediction symbol in the prediction/index data in the renewal data, for outputting the NMPS data in the probability estimating data from the first probability estimating table storage means as a probability estimation index of the renewal data, if said picture data for the target encoding pixel matches with the prediction symbol in the prediction/index data in the storing data from the context table storage means, for outputting the NLPS data in the probability estimating data from the first probability estimating table storage means as a probability estimation index of the renewal data, if said picture data for the target encoding pixel does not match with the prediction symbol in the prediction/index data in the storing data from the context table storage means;

decoding arithmetic calculation means, in case of decoding, for performing an arithmetic processing according to said equation (5), for performing an arithmetic processing according to equations (6) and (7) below to output the A data and the C data for the target decoding pixel if said equation (5) is satisfied, for inverting an arithmetic processing according to equations (8) and (9) below to output the A data and the C data for the target decoding pixel, if said equation (5) is not satisfied, for inverting a value of the prediction symbol of the prediction/index data in the storing data from the context table storage means, if said SWITCH data in the second portion of the probability estimating data from the first probability estimating table storage means indicates a prediction symbol should be inverted, and also the equation (5) is not satisfied, otherwise, outputting the same value as that of the prediction symbol in the prediction/index data in the storing data from the context table storage means as a prediction symbol in the prediction/index data in the renewal data, for outputting the NMPS data in the probability estimating data from the first probability estimating table storage means as a probability estimation index of the renewal data, and if said equation (5) is not satisfied, and outputting the NLPS data in the probability estimating data from the first probability estimating table storage means as a probability estimation index of the renewal data, for outputting the same value as that of the prediction symbol in the prediction/index data in storing data from the context table storage means as a decoded picture data for the target decoding pixel, if said equation (5) is satisfied, for inverting the value of the prediction symbol in the prediction/index data in the storing data from the context table storage means and then outputting as a decoded picture data for the target decoding pixel, if said equation (5) is not satisfied; and second probability estimating table storage means for storing a plurality of first portions in probability estimating data having LSZ data, and outputting, in case of decoding, a first portion in one of the plurality of probability estimating data to the context table storage means as a first portion of a probability estimating data in the renewal data according to a probability estimation index from the encoding arithmetic calculation means, and for outputting, in case of decoding, a first portion in one of the plurality of probability estimating data to the context table storage means as a first portion of a probability estimating data in the renewal data according to a probability estimation index from the decoding arithmetic calculation means; wherein $$A(k)=A(k-1)-LSZ(k) \tag{1}$$

$$C(k)=C(k-1) \tag{2}$$

$$A(k)=LSZ(k) \tag{3}$$

$$C(k)=C(k-1)+\{A(k-1)-LSZ(k)\} \tag{4}$$

$$C(k-1)<A(k-1)-LSZ(k) \tag{5}$$

$$A(k)=A(k-1)-LSZ(k) \tag{6}$$

$$C(k)=C(k-1) \tag{7}$$

$$A(k)=LSZ(k) \tag{8}$$

$$C(k)=C(k-1)+\{A(k-1)-LSZ(k)\} \tag{9}$$

where, $A(k)$ is an A data of the target encoding pixel or a target decoding pixel (a k-th target encoding pixel or a target decoding pixel), $A(k-1)$ is an A data of a target encoding pixel or a target decoding pixel which immediately precedes the target encoding pixel or a target decoding pixel {a(k-1)-th target encoding pixel or a target decoding pixel}, $C(k)$ is a C data of the target encoding pixel or a target decoding pixel (a k-th target encoding pixel or a target decoding pixel), $C(k-1)$ is a C data of a target encoding pixel or a target decoding pixel which immediately precedes the target encoding pixel or a target decoding pixel {a(k-1)-th target encoding pixel or a target decoding pixel}, $LSZ(k)$ is an LSZ data indicating a mismatching probability of a probability estimating data for the target encoding pixel or a target decoding pixel (a k-th target encoding pixel or a target decoding pixel) from the probability estimating table storage means, and k=1, 2, 3, . . . n where n is a positive integer.

27. The digital information encoding/decoding device of claim 26 comprising:

an encoding A register for latching-up the A data from the encoding arithmetic calculation means, and outputting contents of the latched A data as an A data, and outputting a renormalizing signal for conducting a normalization processing, and a last renormalizing signal which indicates that the normalization will be completed by the last one processing;

an encoding A selector for receiving the A data form the encoding A register and a shift-up selection signal based on the last renormalizing signal, for giving an A data from the encoding A register which is shifted-up by one bit to the encoding arithmetic calculation means as an A data for a pixel which immediately precedes the target encoding pixel if said sift-up selection signal indicates "shift-up", otherwise, for giving an A data from the encoding A register to the encoding arithmetic calculation means as an A data for a pixel which immediately precedes the target encoding pixel, without shifting-up;

an encoding C register for outputting a C data from the encoding arithmetic calculation means is latched, and contents of the latched C data is outputted as a C data;

an encoding C selector for receiving the C data from the encoding C register and the shift-up selection signal, for giving a C data from the encoding C register which is shifted-up by one bit to the encoding arithmetic calculation means as an A data for a pixel which immediately precedes the target encoding pixel if said sift-up selection signal indicates "shift-up", otherwise, for giving a C data from the encoding C register to the encoding arithmetic calculation means as a C data for a pixel which immediately precedes the target encoding pixel, without shifting-up;

a decoding A register for latching-up the A data from the decoding arithmetic calculation means, and outputting contents of the latched A data as an A data, and outputting a renormalizing signal for conducting a normalization processing, and a last renormalizing signal which indicates that the normalization will be completed by the last one processing;

a decoding A selector for receiving the A data form the decoding A register and a shift-up selection signal based on the last renormalizing signal, for giving an A data from the decoding A register which is shifted-up by one bit to the decoding arithmetic calculation means as an A data for a pixel which immediately precedes the target encoding pixel if said sift-up selection signal indicates "shift-up", otherwise, for giving an A data from the decoding A register to the decoding arithmetic calculation means as an A data for a pixel which immediately precedes the target encoding pixel, without shifting-up;

a decoding C register for receiving a C data from the decoding arithmetic calculation means, and an encoded data via an input means, and outputting contents latched therein as a C data according to the C data and the encoded data received therein; and an encoding A selector for receiving the C data form the decoding C register and a shift-up selection signal, for giving a C data from the decoding C register which is shifted-up by one bit to the decoding arithmetic calculation means as a C data for a pixel which immediately precedes the target decoding pixel if said sift-up selection signal indicates "shift-up", otherwise, for giving a C data from the decoding C register to the decoding arithmetic calculation means as a C data for a pixel which immediately precedes the target decoding pixel, without shifting-up.

28. A digital information encoding device comprising:

context generation means for extracting a reference pixel from an inputted picture data according to a template model and for generating a context for a target encoding pixel;

context storage means for temporarily storing the context for the target encoding pixel which is received from the context generation means;

context table storage means comprising a read address input node for receiving the context from the context generation means, a read/write context table storage portion for storing a plurality of bits having a prediction symbol and a probability estimating data, a data output node for outputting the storing data stored in the context table storage portion at an address based on the context received on the read address input node, a write address input node for receiving the context temporarily stored in the context storage means, and a data input node for receiving a renewal data of a plurality of bits having a prediction symbol and a probability estimating data which are stored in the context table storage portion at an address based on the context received on the write address input node;

arithmetic calculation means for receiving a picture data for the target encoding pixel, a storing data from the context table storage means, an A data indicating the size of the current interval for a pixel which immediately precedes the target encoding pixel, and a C data indicating the trailing bits of the code stream for a pixel which immediately precedes the target encoding pixel, and conducting a predetermined arithmetic processing, for outputting an A data indicating the size of the current interval for the target encoding pixel and a C data indicating the trailing bits of the code stream for the target encoding pixel, and an index data including a prediction symbol and a probability estimation index; and probability estimating table storage means (5) for storing a plurality of probability estimating data of a plurality of bits which serves as a probability estimating data in the renewal data, for outputting one probability estimating data out of the plurality of probability estimating data according to a probability estimation index in an index data from the arithmetic calculation means, and a prediction symbol in the index data from the arithmetic calculation means, to the context table storage means, as a renewal data.

29. A digital information decoding device comprising:

context generation means for extracting a reference pixel from an inputted picture data according to a template model to generate a context for a target encoding pixel;

context storage means for temporarily storing the context for the target encoding pixel which is received from the context generation means;

context table storage means comprising a read address input node for receiving the context from the context generation means, a read/write context table storage portion for storing a plurality of storing data of a plurality of bits having a prediction symbol and a probability estimating data, a data output node for outputting the storing data stored in the context table storage portion at an address based on the context received on the read address input node, a write address input node for receiving the context temporarily stored in the context storage means, and a data input node for receiving a renewal data of a plurality of bits having a prediction symbol and a probability estimating data which stored in the context table storage portion at an address based on the context received on the write address input node;

arithmetic calculation means for receiving a storing data from the context table storage means, an A data indicating the size of the current interval for a pixel which immediately precedes the target decoding pixel, and a C data indicating the trailing bits of the code stream for a pixel which immediately precedes the target decoding pixel, and conducting a predetermined arithmetic processing, and for outputting an A data indicating the size of the current interval for the target decoding pixel and a C data indicating the trailing bits of the code stream for the target decoding pixel, and outputting an index data including a prediction symbol and a probability estimation index, and a decoded picture data for the target decoding pixel; and probability estimating table storage means for storing a plurality of probability estimating data of a plurality of bits which serves as a probability estimating data in the renewal data, and outputting one probability estimating data out of the plurality of probability estimating data according to a probability estimation index in an index data from the arithmetic calculation means, and a prediction symbol in the index data from the arithmetic calculation means, to the context table storage means, as the renewal data.

30. A digital information encoding/decoding device comprising:

context generation means for receiving a picture data selected from either an inputted picture data or a decoded picture data, for extracting a reference pixel from the received picture data according to a template model, for generating a context for a target encoding pixel if said selected picture data is the inputted picture data, and for generating a context for a target decoding pixel if said selected picture data is the decoded picture data;

context storage means for temporarily storing the context for the target encoding pixel or the context for the target decoding pixel from the context generation means;

context table storage means comprising a read address input node for receiving the context from the context generation means, a read/write context table storage portion for storing a plurality of storing data of a plurality of bits having a prediction symbol and a probability estimating data, a data output node which outputs the storing data stored in the context table storage portion at an address based on the context received on the read address input node, a write address input node for receiving the context temporarily stored in the context storage means, and a data input node which receives a renewal data of a plurality of bits having a prediction symbol and a probability estimating data, which is written in the context table storage portion at an address based on the context received on the write address input node;

encoding arithmetic calculation means for receiving a picture data for the target encoding pixel, a storing data from the context table storage means, an A data indicating the size of the current interval for a pixel which immediately precedes the target encoding pixel, and a C data indicating the trailing bits of the code stream for a pixel which immediately precedes the target encoding pixel, for conducting a predetermined arithmetic processing, and outputting an A data indicating the size of the current interval for the target encoding pixel and a C data indicating the trailing bits of the code stream for the target encoding pixel, and outputting a renewal data including the prediction symbol and the probability estimation index;

decoding arithmetic calculation means for receiving a storing data from the context table storage means, an A data indicating the size of the current interval for a pixel which immediately precedes the target decoding pixel, and a C data indicating the trailing bits of the code stream for a pixel which immediately precedes the target decoding pixel, and conducting a predetermined arithmetic processing, and outputting an A data indicating the size of the current interval for the target decoding pixel and a C data indicating the trailing bits of the code stream for the target decoding pixel, and for outputting a renewal data including the prediction symbol and the probability estimation index, and also for outputting a decoded picture data for the target decoding pixel; and probability estimating table storage means for storing a plurality of probability estimating data of a plurality of bits which serves as a probability estimating data in the renewal data, and outputting one probability estimating data out of the plurality of probability estimating data according to a probability estimation index in an index data from one of the arithmetic calculation means selected from the encoding arithmetic calculation means or the decoding arithmetic calculation means, and a prediction symbol in the index data from one of the arithmetic calculation means selected from the encoding arithmetic calculation means or the decoding arithmetic calculation means, to the context table storage means, as the renewal data.

31. A digital information encoding method comprising:

generating, during one clock of a system clock signal when encoding processing for a target encoding pixel requires one renormalization, a context for the target encoding pixel, reading out a storing data comprising a prediction symbol and a probability estimating data which are based on the generated context, obtaining an A data indicating a width A of an effective area for the target encoding pixel and a C data indicating the trailing bits of the code stream for the target encoding pixel, according to a picture data for the target encoding pixel, the read-out storing data, an A data indicating a width A of an effective area for a pixel which immediately precedes the target encoding pixel and a C data indicating the trailing bits of the code stream for a pixel which immediately precedes the target encoding pixel, and also obtaining a renewal data of a plurality of bits having a prediction symbol and a probability estimation index; and rewriting, during a subsequent one clock of a system clock signal, a storing data based on the context for the target encoding pixel by the renewal data, generating a context for a subsequent target encoding pixel of the target encoding pixel, reading out a storing data based on the generated context, and obtaining an A data indicating a width A of an effective area for a subsequent target encoding pixel of the target encoding pixel and a C data indicating the trailing bits of the code stream for a subsequent pixel to be encoded of the target encoding pixel, according to a picture data for a subsequent target encoding pixel of the target encoding pixel, the read-out storing data, an A data indicating a width A of an effective area for a subsequent target encoding pixel of the target encoding pixel and a C data indicating the trailing bits of the code stream for a subsequent target encoding pixel of the target encoding pixel.

32. A digital information encoding method comprising:

during one clock of a system clock signal when encoding processing for a target encoding pixel requires one renormalization, generating a context for the target encoding pixel;

reading out a storing data comprising a prediction symbol and a probability estimating data which further comprises an LSZ data indicating mismatching probability, and NLPS data which serves as a probability estimation index of a renewal data if said prediction symbol corresponding to the probability estimating data does not match with a picture data for the target encoding pixel, and NMPS data which serves as a probability estimation index of a renewal data if said prediction symbol corresponding to the probability estimating data matches with a picture data for the target encoding pixel, and a SWITCH data which indicates whether or not to invert the prediction symbol corresponding to the probability estimating data according to a context which is generated in the context generating step;

obtaining an A data and a C data for the target encoding pixel according to the equations (1) and (2) below if said picture data for the target encoding pixel matches with the prediction symbol in the storing data from the context table storage means, obtaining an A data and a C data for the target encoding pixel according to the equations (3) and (4) below if said picture data for the target encoding pixel does not match with the prediction symbol in the storing data from the context table storage means, inverting a value of the prediction symbol in the storing data from the context table storage means if said SWITCH data in the probability estimating data in the storing data from the context table storage means indicates a prediction symbol should be inverted and the picture data for the target encoding pixel does not match with the prediction symbol in the storing data from the context table storage means, or otherwise, obtaining a same value as that of the prediction symbol in the storing data from the context table storage means as a prediction symbol for a renewal data, obtaining the NMPS data in the probability estimating data in the storing data from the context table storage means as a probability estimation index of the renewal data if said picture data for the target encoding pixel matches with the prediction symbol in the storing data from the context table storage means, and obtaining the NLPS data in the probability estimating data in the storing data from the context table storage means is outputted as a probability estimation index of the renewal data if said picture data for the target encoding pixel does not match with the prediction symbol in the storing data from the context table storage means;

reading out a probability estimating data comprising the LSZ data, the NLPS data, the NMPS data and the SWITCH data according to the obtained probability estimating index for a renewal data according to the read-out probability estimating data and the prediction symbol for a renewal data which is obtained in the above-mentioned step; and, during a subsequent one clock of a system clock signal, rewriting a storing data based on the context for the target encoding pixel by the renewal data obtained by the above-mentioned step;

generating a context for a subsequent target encoding pixel of the target encoding pixel;

reading out a storing data based on the generated context; obtaining an A data and a C data for a subsequent target encoding pixel of the target encoding pixel according to said equations (1) and (2) if said picture data for a subsequent target encoding pixel of the target encoding pixel matches with the prediction symbol in the storing data which is read out in the above-mentioned step, and obtaining an A data and a C data for a subsequent target encoding pixel of the target encoding pixel according to said equations (3) and (4) if said picture data for a subsequent target encoding pixel of the target encoding pixel does not match with the prediction symbol in the storing data which is read out in the above-mentioned step; wherein $$A(k)=A(k-1)-LSZ(k) \quad (1)$$

$$C(k)=C(k-1) \quad (2)$$

$$A(k)=LSZ(k) \quad (3)$$

$$C(k)=C(k-1)+\{A(k-1)-LSZ(k)\} \quad (4)$$

where, A(k−1) is an A data of the target encoding pixel (a k-th target encoding pixel), A(k−1) is an A data of a target encoding pixel which immediately precedes the target encoding pixel {a(k−1)-th target encoding pixel}, C(k) is a C data of the target encoding pixel (a k-th target encoding pixel), C(k−1) is a C data of a target encoding pixel which immediately precedes the target encoding pixel {a(k−1)-th target encoding pixel}, LSZ(k) is an LSZ data indicating a mismatching probability of a probability estimating data for the target encoding pixel (a k-th target encoding pixel) from the probability estimating table storage means, and k=1, 2, 3, . . . n where n is a positive integer.

33. A digital information encoding method comprising:

during one clock of a system clock signal when encoding processing for a target encoding pixel requires one renormalization, generating a context for the target encoding pixel;

reading out a storing data comprising an LSZ data which indicates a mismatching probability which constitutes a first portion of a prediction/index data and also a first portion of a probability estimating data, based on the generated context in the above-mentioned step;

reading out a second portion of a probability estimating data comprising an NLPS data which serves as a probability estimation index of a renewal data if said prediction symbol in a prediction/index data in storing data for the target encoding pixel which is read in the above-mention step does not match with a picture data for the target encoding pixel, an NMPS data which serves as a probability estimation index of a renewal data if said prediction symbol in a prediction/index data in storing data for the target encoding pixel which is read out in the above-mention step matches with a picture data for the target encoding pixel, and a SWITCH data which indicates whether or not to invert a prediction symbol in a prediction/index data stored in the context table storage means, according to a probability estimation index of a prediction/index data in the storing data which is read out in the above-mentioned step;

obtaining an A data and a C data for the target encoding pixel according to the equations (1) and (2) below if said picture data for the target encoding pixel matches with the prediction symbol in the read-out storing data, obtaining an A data and a C data for the target encoding pixel according to the equations (3) and (4) below if said picture data for the target encoding pixel does not match with the prediction symbol in the read-out storing data, inverting a value of the prediction symbol in the read-out storing data is inverted if said read-out SWITCH data in the second portion of the probability estimating data indicates a prediction symbol should be inverted and the picture data for the target encoding pixel does not match with the prediction symbol in the read-out storing data, or otherwise, obtaining a same value as that of the prediction symbol in the read-out storing data as a prediction symbol in the renewal data, obtaining the NMPS data in the second portion of the read-out probability estimating data as a probability estimation index of the renewal data if said picture data for the target encoding pixel matches with the prediction symbol in the read-out storing data, and obtaining the NLPS data in the second portion of the read-out probability estimating data as a probability estimation index of the renewal data if said picture data for the target encoding pixel does not match with the prediction symbol in the read-out storing data;

reading out the first portion of the probability estimating data comprising the LSZ data, based on a probability estimation index for the obtained renewal data, and obtaining a renewal data according to the first portion of the read-out probability estimating data and a prediction symbol of the renewal data which is obtained in the above-mentioned step; and, during a subsequent one clock of a system clock signal, rewriting a storing data based on the context for the target encoding pixel by the renewal data obtained by the above-mentioned step;

generating a context for a subsequent target encoding pixel of the target encoding pixel;

reading out a storing data comprising a first portion of a prediction/index data and also a first portion of a probability estimating data based on the generated context; and obtaining an A data and a C data for a subsequent target encoding pixel of the target encoding pixel according to said equations (1) and (2) if said picture data for a subsequent target encoding pixel of the target encoding pixel matches with the prediction symbol in the storing data which is read out in the above-mentioned step, obtaining an A data and a C data for a subsequent target encoding pixel of the target encoding pixel according to said equations (3) and (4) if said picture data for a subsequent target encoding pixel of the target encoding pixel does not match with the prediction symbol in the storing data which is read out in the above-mentioned step; wherein $$A(k)=A(k-1)-LSZ(k) \quad (1)$$

$$C(k)=A(k-1) \quad (2)$$

$$A(k)=LSZ(k) \quad (3)$$

$$C(k)=C(k-1)+\{A(k-1)-LSZ(k)\} \quad (4)$$

where, $A(k)$ is an A data of the target encoding pixel (a k-th target encoding pixel), $A(k-1)$ is an A data of a target encoding pixel which immediately precedes the target encoding pixel {a(k-1)-th target encoding pixel}, $C(k)$ is a C data of the target encoding pixel (a k-th target encoding pixel), $C(k-1)$ is a C data of a target encoding pixel which immediately precedes the target encoding pixel {a(k-1)-th target encoding pixel}, $LSZ(k)$ is an LSZ data indicating a mismatching probability of a probability estimating data for the target encoding pixel (a k-th target encoding pixel) from the probability estimating table storage means, and $k=1, 2, 3, \ldots n$ where n is a positive integer.

34. A digital information decoding method comprising during one clock of a system clock signal when decoding processing for a target decoding pixel requires one renormalization, generating a context for the target decoding pixel;

reading out a storing data comprising a prediction symbol and a probability estimating data which are based on the generated context;

obtaining an A data indicating the size of the current interval for a target decoding pixel, and a C data indicating the trailing bits of the code stream for a target decoding pixel, according to the read-out storing data, an A data indicating the size of the current interval for a target decoding pixel which immediately precedes the target decoding pixel, and a C data indicating the trailing bits of the code stream for a target decoding pixel which immediately precedes the target decoding pixel, and further obtaining a renewal data of a plurality of bits having a prediction symbol and a probability estimating data, and also obtaining a decoded picture data for the target decoding pixel; and, during subsequent one clock of a system clock signal, rewriting a storing data based on the context for the target decoding pixel by the renewal data;

generating a context for a subsequent target decoding pixel of the target decoding pixel;

reading out a storing data based on the generated context;

reading out a probability estimating data based on a probability estimation index of the read-out prediction/index data;

obtaining an A data indicating a width A of an effective area for a subsequent target decoding pixel of the target decoding pixel and a C data indicating the trailing bits of the code stream for a subsequent target decoding pixel of the target decoding pixel, according to the read-out storing data, an A data indicating a width A of an effective area for a subsequent target decoding pixel of the target decoding pixel and a C data indicating the trailing bits of the code stream for a subsequent target decoding pixel of the target decoding pixel.

35. A digital information decoding method comprising:

during one clock of a system clock signal when decoding processing for a target decoding pixel requires one renormalization, generating a context for the target decoding pixel;

reading out a storing data comprising a prediction symbol and a probability estimating data, wherein the probability estimating data comprises an LSZ data indicating mismatching probability, an NLPS data which serves as a probability estimation index of a renewal data if the equation (5) below is not satisfied, an NMPS data which serves as a probability estimation index of a renewal data if said equation (5) is satisfied, and a SWITCH data which indicates whether or not to invert the prediction symbol corresponding to the probability estimating data;

obtaining the A data and a C data for the target decoding pixel according to the equations (6) and (7) below if said equation (5) is satisfied, obtaining the A data and the C data for the target decoding pixel according to the equations (8) and (9) below if said equation (5) is not satisfied, inverting a value of the prediction symbol in the read-out storing data if said SWITCH data in the probability estimating data in the read-out storing data indicates a prediction symbol should be inverted and said equation (5) is not satisfied, or otherwise, obtaining a same value as that of the prediction symbol in the read-out storing data as a prediction symbol of a renewal data, obtaining the NMPS data in the probability estimating data in the read-out storing data as a probability estimation index of the renewal data if said equation (5) is satisfied, obtaining the NLPS data in the probability estimating data in the read-out storing data as a probability estimation index of the renewal data if said equation (5) is not satisfied, obtaining a same value as that of the prediction symbol in the read-out storing data as a decoded picture data for the target decoding pixel if said equation (5) is satisfied, and inverting the value of the prediction symbol in the storing data for obtaining it as a decoded picture data for the target decoding pixel if said equation (5) is not satisfied;

reading out a probability estimating data comprising the LSZ data, the NLPS data, the NMPS data, and the SWITCH data, based on a probability estimating index for the renewal data which is obtained in the above-mentioned step for obtaining a renewal data according to the read-out probability estimating data and a prediction symbol of the renewal data which is obtained in the above-mentioned step; and, during a subsequent one clock of a system clock signal, rewriting a storing data based on the context for the target decoding pixel by the renewal data;

generating a context for a subsequent target decoding pixel of the target decoding pixel; and obtaining an A data and a C data for a subsequent target decoding pixel of the target decoding pixel according to the following equations (6) and (7) if said equation (5) is satisfied, obtaining an A data and a C data for a subsequent target decoding pixel of the target decoding pixel according to the following equations (8) and (9) if said equation (5) is not satisfied; wherein $$C(k-1) < A(k-1) - LSZ(k) \quad (5)$$

$$A(k) = A(k-1) - LSZ(k) \quad (6)$$

$$C(k) = C(k-1) \quad (7)$$

$$A(k) = LSZ(k) \quad (8)$$

$$C(k) = C(k-1) + \{A(k-1) - LSZ(k)\} \quad (9)$$

where A(k) is an A data of the target decoding pixel (a k-th target decoding pixel), A(k-1) is an A data of a target decoding pixel which immediately precedes the target decoding pixel {a(k-1)-th target decoding pixel}, C(k) is a C data of the target decoding pixel (a k-th target decoding pixel), C(k-1) is a C data of a target decoding pixel which immediately precedes the target decoding pixel {a(k-1)-th target decoding pixel}, LSZ(k) is an LSZ data indicating a mismatching probability of a probability estimating data for the target decoding pixel (a k-th target decoding pixel) from the probability estimating table storage means, and k=1, 2, 3, . . . n where n is a positive integer.

36. A digital information decoding method comprising:

during one clock of a system clock signal when decoding processing for a target decoding pixel requires one renormalization, generating a context for the target decoding pixel;

reading out a storing data comprising an LSZ data which constitutes a first portion of a prediction/index data and which indicates a mismatching probability and also a first portion of a probability estimating data, based on the generated context in the above-mentioned step;

reading out a second portion of a probability estimating data comprising an NLPS data which serves as a probability estimation index of a renewal data if the equation (5) below is not satisfied, an NMPS data which serves as a probability estimation index of a renewal data if said equation (5) is satisfied, and a SWITCH data which indicates whether or not to invert a prediction symbol in a prediction/index data stored in the context table storage means, according to a probability estimation index of a prediction/index data in the storing data which is read out in the above-mentioned step;

obtaining the A data and a C data for the target decoding pixel according to the equations (6) and (7) below if said equation (5) is satisfied, obtaining the A data and the C data for the target decoding pixel according to the equations (8) and (9) below if said equation (5) is not satisfied, inverting a value of the prediction symbol in the read-out storing data if said SWITCH data in the probability estimating data in the read-out storing data indicates a prediction symbol should be inverted and if said equation (5) is not satisfied, or otherwise, obtaining a same value as that of the prediction symbol in the read-out storing data as a prediction symbol of a renewal data, obtaining the NMPS data in the second portion of the probability estimating data in the read-out storing data as a probability estimation index of the renewal data if said equation (5) is satisfied, obtaining the NLPS data in the second portion of the probability estimating data in the read-out storing data as a probability estimation index of the renewal data if said equation (5) is not satisfied, obtaining a same value as that of the prediction symbol in the read-out storing data as a decoded picture data for the target decoding pixel if said equation (5) is satisfied, and inverting the value of the prediction symbol in the storing data for obtaining it as a decoded picture data for the target decoding pixel if said equation (5) is not satisfied;

reading out the first portion of the probability estimating data comprising the LSZ data, based on a probability estimating index for the renewal data which is obtained in the above-mentioned step for obtaining a renewal data according to the first portion of the read-out probability estimating data and a prediction symbol of the renewal data which is obtained in the above-mentioned step; and, during a subsequent one clock of a system clock signal, rewriting a storing data based on the context for the target decoding pixel by the renewal data;

generating a context for a subsequent target decoding pixel of the target decoding pixel;

reading out a storing data based on the context generated in the above-mentioned step;

reading out the second portion of a probability estimating data comprising the LSZ data, the NLPS data, the NMPS data, and the SWITCH data, based on a probability estimation index of a prediction/index data in the storing data which is read in the above-mentioned step; and obtaining an A data and a C data for a subsequent target decoding pixel of the target decoding pixel according to the following equations (6) and (7) if said equation (5) is satisfied, obtaining an A data and a C data for a subsequent target decoding pixel of the target decoding pixel according to the following equations (8) and (9) if said equation (5) is not satisfied; wherein $$C(k-1) < A(k-1) - LSZ(k) \quad (5)$$

$$A(k) = A(k-1) - LSZ(k) \quad (6)$$

$$C(k) = C(k-1) \quad (7)$$

$$A(k) = LSZ(k) \quad (8)$$

$$C(k) = C(k-1) + \{A(k-1) - LSZ(k)\} \quad (9)$$

where, $A(k)$ is an A data of the target decoding pixel (a k-th target decoding pixel), $A(k-1)$ is an A data of a target decoding pixel which immediately precedes the target decoding pixel {a(k−1)-th target decoding pixel}, $C(k)$ is a C data of the target decoding pixel (a k-th target decoding pixel), $C(k-1)$ is a C data of a target decoding pixel which immediately precedes the target decoding pixel {a(k−1)-th target decoding pixel}, $LSZ(k)$ is an LSZ data indicating a mismatching probability of a probability estimating data for the target decoding pixel (a k-th target decoding pixel) from the probability estimating table storage means, and k=1, 2, 3, . . . n where n is a positive integer.

* * * * *